of Patent: May 6, 1986

United States Patent [19]
Saitoh et al.

[11] Patent Number: 4,587,190
[45] Date of Patent: May 6, 1986

[54] PHOTOCONDUCTIVE MEMBER COMPRISING AMORPHOUS SILICON-GERMANIUM AND NITROGEN

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 646,301

[22] Filed: Aug. 31, 1984

[30] Foreign Application Priority Data

| Sep. 5, 1983 | [JP] | Japan | 58-162724 |
| Sep. 6, 1983 | [JP] | Japan | 58-163432 |
| Sep. 12, 1983 | [JP] | Japan | 58-167745 |
| Sep. 12, 1983 | [JP] | Japan | 58-167749 |
| Oct. 14, 1983 | [JP] | Japan | 58-191984 |
| Oct. 14, 1983 | [JP] | Japan | 58-191988 |

[51] Int. Cl.$^4$ .................... G03G 5/02; G03G 5/08
[52] U.S. Cl. ............................ 430/85; 430/84; 430/95

[58] Field of Search ............... 430/57, 84, 85, 86, 430/95

[56] References Cited

U.S. PATENT DOCUMENTS 4,460,670  7/1984  Ogawa et al. .
4,490,450 12/1984  Shimizu et al. ............... 430/84
4,490,453 12/1984  Shirai et al. .
4,495,262  1/1985  Matsuzaki et al. ............ 430/84

Primary Examiner—John L. Goodrow
Attorney, Agent, or Firm—Fitzpatrick, Cella, Harper & Scinto

[57] ABSTRACT

A photoconductive member comprises a substrate and a light receiving layer having photoconductivity which comprises an amorphous material containing silicon atoms and germanium atoms, the germanium atoms being distributed non-uniformly in the layer thickness direction in the light receiving layer and nitrogen atoms being contained in the light receiving layer.

50 Claims, 57 Drawing Figures

PHOTOCONDUCTIVE MEMBER COMPRISING AMORPHOUS SILICON-GERMANIUM AND NITROGEN

BACKGROUND OF THE INVENTION

1. Field of the Invention

The present invention relates to photoconductive members sensitive to electromagnetic waves including infrared rays, visible rays, ultraviolet rays, X-rays, γ-rays, etc.

2. Description of the Prior Art

Photoconductive materials constituting photoconductive layers in solid-state image pickup devices and in image-forming devices, e.g. electrophotographic image forming members and original-reading devices, are required to have characteristics such as high sensitivity, high S/N ratio [photocurrent (Ip)/dark current (Id)], absorption spectral properties fitting the spectrum of the electromagnetic waves to be used for irradiation, quick light responsiveness, desired dark resistivity, and harmlessness to human body during service, and further in solid-state pickup devices, easiness of afterimage treatment. Particularly the harmlessness to human body during service is important to the photoconductive materials to be incorporated into electrophotographic appliances for office purposes.

A photoconductive material recently noticed on the basis of the above points is amorphous silicon (hereinafter designated as a-Si), which is described, for example, in German Pat. Offen. Nos. 2,746,967 and 2,855,718 as an electrophotographic image forming member and in German Pat. Offen No. 2,933,411 about application thereof to photoelectric reading devices.

However, prior art photoconductive members having a photoconductive layer formed of a-Si still need overall improvement in characteristics including electrical, optical, and photoconductive properties such as dark resistivity, photosensitivity, and photo-responsiveness, environment resistances such as humidity resistance, and long-term stability of performance characteristics.

For instance, under the prior art a-Si type of photoconductive member is used for electrophotographic image forming members, attempts to enhance the photosensity and dark resistance at the same time often bring about undesirable effects such that; residual potential is observed frequently during service; fatigue accumulates in repeated continuous operations for long hours and thereby leads to the appearance of a so-call ghost phenomenon that is the occurrence of a residual image; and the responsiveness gradually deteriorates in high-speed repeated operations.

In addition, a-Si has relatively low absorption coefficient for light waves longer than shortside visible light waves. Accordingly, the prior art photoconductive layer made of a-Si is ineffective in utilizing either the energy of a semiconductor layer which is in practical use today or the longer-wave energy of a halogen lamp or fluorescent lamp, when these light sources are used for the irradiation of the photoconductive layer. This is one of the still remaining problems to be solved.

Meanwhile, when a large portion of illuminating light arrives at the substrate (support) of a photoconductive member without being absorbed by the photoconductive layer, light interference due to multiple reflection will occur in the photoconductive layer if the substrate has a high reflectance for the light incident thereupon through the photoconductive layer. This interference is a cause of the "unfocused image".

As the irradiation spot is made smaller for the purpose of improving the resolution, the above effect becomes greater, and particularly when a semiconductor laser is employed as light source, this effect is a serious problem.

Moreover, when the photoconductive layer is made of a-Si, hydrogen atoms or halogen atoms such as fluorine or chlorine atoms are incorporated thereinto for the purpose of improving electrical and photoconductive properties thereof and boron atoms, phosphorous atoms, or some other atoms are also incorporated for the purpose of controlling the type of the electric conduction, where a problem arises occasionally in the electrical or photoconductive properties of the resulting layer depending upon the manner of the incorporation. For instance, the problem is that photocarriers produced in the resulting photoconductive layer by light irradiation are insufficient in lifetime or that the injection of charge from the substrate side in the dark area is not sufficiently impeded.

Furthermore, in the formation of the photoconductive layer thicker than ten and several mμ, a phenomenon such as the rising or peeling of the layer from the substrate or cracking in the layer is liable to develop with the time of leaving the product in the air after withdrawal thereof from the vapor deposition chamber used for the layer formation. This phenomenon is remarkable in particular when the substrate is of a drum type which is commonly used in the field of electrophotography. Thus the photoconductive layer involves the problem of long-term stability.

Accordingly, it is necessary to improve characteristics of a-Si itself and, on the other hand, to solve all the problems stated above in the design of the photoconductive member.

SUMMARY OF THE INVENTION

The present invention has been accomplished to remove the above-mentioned drawbacks after comprehensive studies on the applicability of a-Si to a photoconductive member for image forming members, solid state image pick-up devices, and reading devices for electrophotography. The present invention is based on the remarkably superior characteristics, as an electroconductive member in every respect especially for electrophotography and superiority in absorption spectroscopic characteristics in long wavelength region, of photoconductive member comprising a photoconductive light receiving layer which is designed and prepared from an amorphous material constituted of a maxtirx of silicon atoms and germanium atoms and containing at least one kind of atoms of hydrogen atoms and halogen atoms, so-called hydrogenated amorphous silicon-germanium, halogenated amorphous silicon germanium, or halogen-containing hydrogenated amorphous silicon germanium (these are hereafter generally referred to as "a-SiGe(H,X)").

The primary object of the invention is to provide a photoconductive member of environment-proof type which has electrical, optical, and photoconductive properties always stable, scarcely affected by the environmental service conditions, superior photosensitivity on longer wavelength side, and high resistance to light-caused fatigue, does not degrade during repeated operations, and shows no or little residual potential.

Another object of the invention is to provide a photoconductive member which has high sensitivity to all visible rays and specially to rays from semiconductor lasers, and exhibits quick photo-response.

Another object of the invention is to provide a photoconductive member which has high quality of lamination, being compact and stable in structure, all the layers of the member being combined together with strong adhesion.

Another object of the invention is to provide a photoconductive member which has such good electrophotographic characteristics, exhibiting sufficient charge-retaining characteristics after charging and almost no appreciable deterioration of these characteristics even in a high humidity atmosphere, as to be used very effectively for usual electrophotography.

Another object of the invention is to provide a photoconductive member for electrophotography which permits forming readily high quality images of high density which reproduces halftone clearly and gives high resolution.

Another object of the invention is to provide a photoconductive member which has high photosensitivity, high S/N ratio, and good electrical contact between the substrate and the photoconductive layer.

According to the invention, there is provided a photoconductive member comprising a substrate and a light receiving layer having photoconductivity which comprises an amorphous material containing silicon atoms and germanium atoms, the distribution of germanium atoms in the light receiving layer being non-uniformly distributed in the layer thickness direction, and nitrogen atoms being contained in the light receiving layer.

According to the invention, there is also provided a photoconductive member comprising a substrate and a photoconductive light receiving layer supported thereby, the light receiving layer being composed of an amorphous material containing silicon atoms and germanium atoms, the light receiving layer containing a substance controlling electro-conductive properties and nitrogen atoms, and the distribution of germanium atoms in the light receiving layer being nonuniform in the direction perpendicular to the layer surface.

According to the invention, there is also provided a photoconductive member comprising a substrate and a light receiving layer constituted of a first layer which comprises an amorphous material containing silicon atoms and germanium atoms and has photoconductivity and a second layer which comprises an amorphous material containing silicon atoms and carbon atoms, the first layer containing a substance controlling electroconductive properties and nitrogen atoms, and the distribution of germanium atoms in the first layer being nonuniform in the direction perpendicular to the layer surface.

According to the invention, there is also provided a photoconductive member comprising a substrate and a light receiving layer constituted of a first layer which is composed of an amorphous material containing silicon atoms and germanium atoms and exhibits photoconductivity and a second layer which is composed of an amorphous material containing silicon atoms and carbon atoms, the distribution of germanium atoms in the first layer being nonuniform in the direction perpendicular to the layer surface, and the first layer containing nitrogen atoms.

According to the invention, there is also provided a photoconductive member comprising a substrate and a light receiving layer constituted of a first layer which is composed of an amorphous material containing silicon atoms and germanium atoms and exhibits photoconductivity and a second layer which is composed of an amorphous material containing silicon atoms and oxygen atoms, the distribution of germanium atoms in the first layer being nonuniform in the direction perpendicular to the layer surface, and the first layer containing nitrogen atoms.

According to the invention, there is also provided a photoconductive member comprising a suitable substrate and a light receiving layer constituted of a first layer which is composed of an amorphous material containing silicon atoms and germanium atoms and exhibits photoconductivity and a second layer which is composed of an amorphous material containing silicon atoms and oxygen atoms, the first layer containing a substance controlling electroconductive properties and nitrogen atom, and the distribution of germanium atoms in the first layer being nonuniform in the direction perpendicular to the layer surface The photoconductive member of the invention having such a layer structure as stated above can solve all the above various problems and exhibits excellent electrical, optical, and photoconductive properties and very high resistance to high voltage and to environmental service conditions.

In particular when this photoconductive member is applied to an electrophotographic image forming member, no remaining-potential effect on image formation is observed, the member has stable electrical properties, high photosensitivity with a high S/N ratio, superior resistance to light-caused fatigue, and good characteristics in repeated operations, and thus high quality images with high density, clear halftone, and high resolution can be obtained steadily in repeated operations.

The photoconductive member of the invention, the light receiving layer of which is sturdy and tough itself and adheres firmly to the substrate, can be used repeatedly and continuously for long hours at a high speed.

Moreover, the photoconductive member of the invention has high sensitivity to all visible rays, specially to rays from semiconductor lasers, and makes quick photo-response.

DETAILED DESCRIPTION OF EMBODIMENTS OF THE INVENTION

Figure 1:
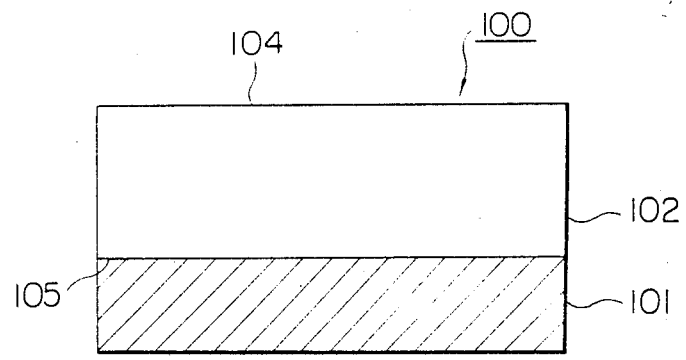
FIGS. 1 and 2 are schematic views for illustrating the layer structure of photoconductive members of the invention.

Referring now to the Drawings, the photoconductive layer of the invention is described in detail.

FIG. 1 is a schematic view for illustrating the layer structure of a photoconductive member according to the first embodiment of the invention.

In FIG. 1, a photoconductive member 100 consists of a suitable substrate 101 and a photoconductive, light receiving layer 102 which is laid on the substrate and comprises a-SiGe(H,X) and nitrogen atoms.

The distribution of Ge atoms in the light receiving layer 102 varies continuously in the thickness direction (direction perpendicular to the layer surface) in such a manner that Ge atoms are much distributed in quantity to the side of the substrate side 105 of the layer. It is desirable that the distribution of Ge atoms in the light receiving layer be nonuniform as stated above in the thickness direction and be uniform in the direction parallel to the layer surface.

Figure 2:
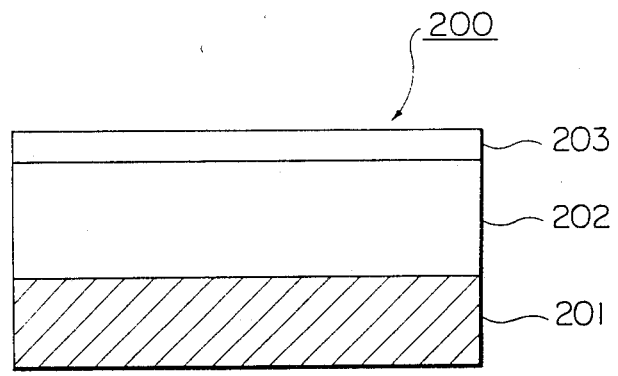

FIG. 2 is a schematic view for illustrating the layer structure of a photoconductive member according to the second embodiment of the invention.

In FIG. 2, a photoconductive member 200 consists of a substrate 201 and a light receiving layer which is laid thereupon and consists of a first layer (I) 202 and a second layer (II) 203. The first layer (I) 202 is composed of a-SiGe(H,X), contains nitrogen atoms, and has photoconductivity. The second layer (II) 203 has a free surface. The distribution of Ge atoms in the first layer (I) 202 varies continuously in the thickness direction in such a manner that Ge atoms decrease in quantity with the distance from the substrate side of the first layer. The second layer (II) 203 is composed of an amorphous material containing Si atoms as a matrix and carbon atoms and/or oxygen atoms, and desirably contains hydrogen atoms and/or halogen atoms.

The distribution of Ge atoms in the first layer (I) is desired to be nonuniform as stated above in the thickness direction and be uniform within a plane parallel to the surface of the substrate. FIGS. 3–11 show typical examples of the distribution of Ge atoms in the thickness direction in the light receiving layer or the first layer of the photoconductive member of the invention. In these drawings, the point on the obscissa indicates the distribution concentration of Ge atoms, the point on the ordinate indicates the distance from the interface between the substrate and the light receiving layer or the first layer having photoconductivity, $t_B$ denotes the position of this interface, and $t_T$ denotes the position of the surface opposite to $t_B$, of the light receiving layer or the first layer. The light receiving layer containing Ge atoms, or the first layer is formed from $t_B$ side to $t_T$ side.

Figure 3:
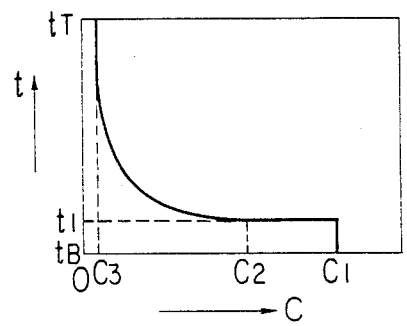
FIGS. 3–11 are illustrations of the distribution of germanium atoms in the light receiving layer or in the first layer thereof.

FIG. 3 shows a first typical example of the distribution of Ge atoms in the light receiving layer or the first layer in the thickness direction. In this case, the distribution concentration C of Ge atoms is kept at a constant value $C_1$ between the position $t_B$ and the position $t_1$ of the plane (the plane being at a distance of $t_1$ from interface position $t_B$), drops there to $C_2$, and then continuously decreases with distance to reach $C_3$ at the position $t_T$.

Figure 4:
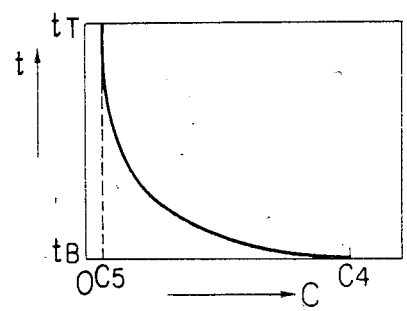

In the case of FIG. 4, C decrease continuously from $C_4$ to $C_5$ with deistance over the entire region between the position $t_B$ and the position $t_T$.

Figure 5:
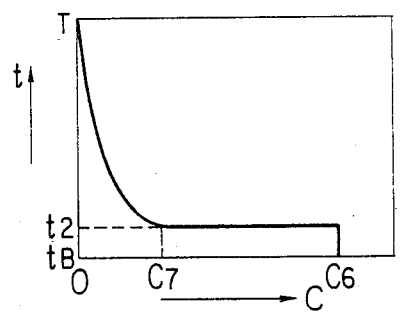

In the case of FIG. 5, C is at a constant value of $C_6$ between the position $t_B$ and the position $t_2$, then continuously decreases with the distance to reach a substantial zero (this is a concentration below the minimum detectable value) at the position $t_T$.

Figure 6:
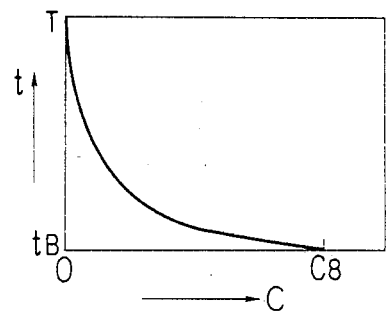

In the case of FIG. 6, C decreases continuously from $C_8$ to a substantial zero with distance over the entire region between the position $t_B$ and the position $t_T$.

Figure 7:
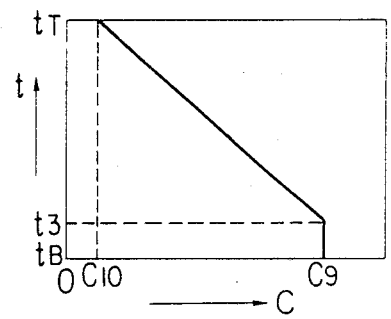

In the case of FIG. 7, C is at a constant value of $C_9$ between the position $t_B$ and the position $t_3$, and decreases linearly with distance to reach $C_{10}$ at the position $t_T$.

Figure 8:
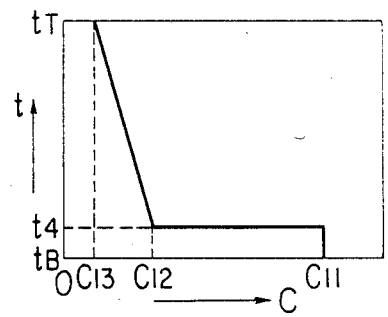

In the case of FIG. 8, C is at a constant value of $C_{11}$ between the position $t_B$ and the position $t_4$, drops there to $C_{12}$, then decreases linearly with distance to reach $C_{13}$ at the position $t_T$.

Figure 9:
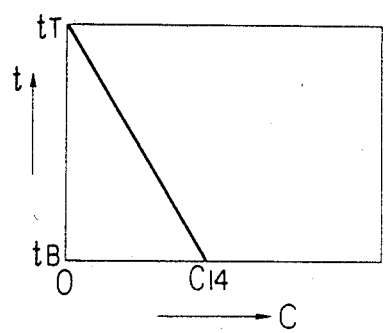

In the case of FIG. 9, C decreases linearly from $C_{14}$ to a substantial zero over the region between the position $t_B$ and the position $t_T$.

Figure 10:
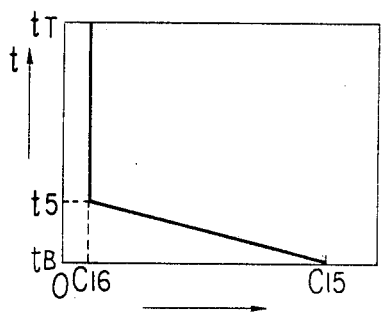

In the case of FIG. 10, C decreases linearly from $C_{15}$ to $C_{16}$ in the region between the position $t_B$ and the position $t_5$, and then is kept at a constant value of $C_{16}$ between the position $t_5$ and the position $t_T$.

Figure 11:
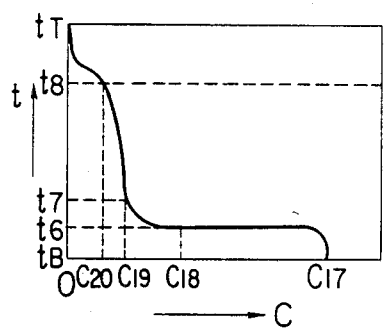

In the case of FIG. 11, C decreases slowly at first from $C_{17}$, the value at the position $t_B$, drops rapidly to $C_{18}$ at the position $t_6$, then decreases rapidly to reach $C_{19}$ at the position $t_7$, further decreases very slowly to reach $C_{20}$ at the position $t_8$, and decreases to reach a substantial zero at the position $t_T$ as shown by the curve in FIG. 11.

As illustrated above typically referring to FIGS. 3–11, the distribution concentration of Ge atoms in the light receiving layer or the first layer, in the invention, is made higher on the side facing the substrate, and considerably lower on the position $t_T$ of the interface side.

The light receiving layer or the first layer of the photoconductive member according to the invention is desired to have a localized region (A) that contains Ge atoms in a relatively high concentration, in the side facing the subtrate as stated above. The localized region (A) in the invention is desirably located within a distance of 5μ from the position of the interface $t_B$. The region (A) may be all or a part of the layer region $(L_T)$ ranging from the interface position $t_B$ to the plane 5μ distant therefrom. The choice of whether all or a part of the laminar region $(L_T)$ is occupied by the localized region (A) depends upon characteristics required for the light receiving layer or the first layer to be formed.

It is desirable to form the localized region (A) so that the maximum concentration $C_{max}$, in the thickness direction, of Ge atoms distributed in the region (A) will be at least 1000 atomic ppm, more preferably 5000 atomic ppm, and most preferably $1 \times 10^4$ atomic ppm, based on the Si atoms contained. In the invention, the light receiving layer or the first layer is desirably formed so that the above maximum concentration $C_{max}$ may be positioned within the above defined laminar region $(L_T)$ which is not more than 5μ thick measured from $t_B$.

The content of Ge atoms in the light receiving layer or the first layer is suitably chosen so as to achieve the object of the invention effectively. In general, the content thereof is $1-9.5 \times 10^5$ atomic ppm, more suitably $100-8 \times 10^5$ atomic ppm, and most preferably $500-7 \times 10^5$ atomic ppm, based on the combined content of Si atoms and Ge atoms.

In the light receiving layer or the first layer of the photosensitive member according to the invention, Ge atoms are distributed continuously over the entire region of the layer and the distribution concentration C of Ge atoms is decreased from the substrate side to the free surface of the layer. The Ge atom distribution curve can be suitably designed as required, whereby the light receiving layer or the first layer can be formed to have required characteristics.

For instance, high sensitivity to a wide range of light waves from relatively short to long waves, including visible rays, can be given to the light receiving layer or the first layer by enhancing the distribution concentration C of Ge atoms in the substrate side and minimizing it in the free surface side.

As will be stated later, it is also possible, by enhancing the concentration C of Ge atoms extremely at and near the substrate side of the light receiving layer or the first layer, that the longer-wavelength light from a semiconductor laser which can absorbed not completely in the light-incident side region of the layer can be absorbed almost completely in the substrate side region, thereby preventing effectively the interference which may be caused by the reflection from the substrate side interface.

In the photoconductive member of the invention, nitrogen atoms are incorporated into the light receiving layer or the first layer for the purpose of enhancing the photosensitivity, dark resistance, and the adhesion between the substrate and the above layer. Nitrogen atoms may be distributed either uniformly in the entire region of the layer or nonuniformly to be concentrated in a part of the layer. The distribution concentration C(N) of nitrogen atoms in the layer may be either uniform in the thickness direction or nonuniform similarly to the distribution state of Ge atoms, as illustrated in FIGS. 3-11, in the thickness direction. That is, the distribution state of nitrogen atoms nonuniform in the thickness direction is similar to that of Ge atoms illustrated in FIGS. 3-11.

In the invention, the nitrogen-atom-containing laminar region (N) is formed to occupy the entire region of the light receiving layer or the first layer when the main purpose of the nitrogen incorporation is the enhancement of photosensitivity and dark resistance, and the laminar region (N) is formed to occupy the substrate side interface and the neiborhood thereof when the main purpose is the improvement of the adhesion between the substrate and either the light receiving layer or the first layer.

In the former case, the content of nitrogen atoms in the laminar region (N) is desired to be relatively low for the purpose of attaining high photosensitivity. In the latter case, that content is desired to be relatively high for the purpose of ensuring the improvement of the adhesion.

For achieving both of the above purposes at the same time, nitrogen atoms are distributed either so as to be relatively concentrated in the substrate side of the light receiving layer or the first layer and relatively diluted in the free surface side of the layer or so as not to be intentionally contained in the free surface side of the layer.

The content of nitrogen atoms in the laminar region (N) formed in the light receiving layer or the first layer is suitably chosen by considering the organic relations between various characteristics such as those required for the laminar region (N) itself and those of the contact interface between the substrate and the laminar region (N) when it is formed to contact the substrate directly.

When some other laminar region is formed in contact directly the nitrogen-containing laminar region (N), the content of nitrogen atoms therein is suitably chosen by considering also the relations to characteristics of the other laminar region and to characteristics of the contact interface between the two laminar region.

In brief, the content of nitrogen atoms in the laminar region (N) is suitably chosen according to characteristics required for the photoconductive member. The content is generally 0.001-50 atomic %, more suitably 0.002-40 atomic %, and most suitably 0.003-30 atomic %.

When the laminar region (N) occupies all or large part of the light receiving layer or first layer, the above upper limit of nitrogen content is desired to be lowered sufficiently. That is, when the thickness $T_o$ of the laminar region (N) is at least 2/5 of the thickness (T) of the light receiving layer or the first layer, the upper limit of nitrogen content in the laminar region (N) is desired to be 30 atomic %, more suitably 20 atomic %, and most suitably 10 atomic %.

Preferably a localized region (B) containing nitrogen atoms in relatively high concentration is formed as a laminar region (N) in the substrate side of the light receiving layer or the first layer, whereby the adhesion between the substrate and said layer can be more improved.

Illustrating by using notations shown in FIGS. 3-11, the localized region (B) is desirably formed within the limit of $5\mu$ from the interface $t_B$. The localized region (B) may be all or a part of the laminar region ($L_T$) ranging from the interface position $t_B$ to the plane $5\mu$ distant therefrom. The choice of whether all or a part of the laminar region ($L_T$) is occupied by the localized region (B) depends upon characteristics required for the light receiving layer or the first layer to be formed.

The localized area (B) may preferably be formed in the layer in such a manner that the nitrogen is destributed in the thickness direction having a maximum value of nitrogen atom concentration of preferably not less than 500 atomic ppm, more preferably not less than 800 ppm, and most preferably not less than 1000 ppm.

Thus it is desirable to form the laminar region (N) containing nitrogen atoms so as to place the maximum concentration $C_{max}$ of nitrogen atoms within the limit of $5\mu$ from the interface position $t_B$.

In the invention, suitable examples of the halogen atoms to be incorporated into the light receiving layer or the first layer are fluorine, chlorine, bromine, and iodine atoms, among which fluorine and chlorine atoms are particularly suited.

In the invention, the light receiving layer or the first layer composed of a-SiGe(H,X) is formed according to a vacuum deposition method, for example, glow discharge method, sputtering method, or ion plating method, which utilizes an electric discharge phonomenon. For instance, the formation of the layer according to the glow discharge method can be accomplished by; introducing an Si-atom-supplying gas and a Ge-atom-supplying gas as essential raw materials and, if necessary, a hydrogen-atom-supplying gas and/or a halogen(X)-atom-supplying gas into a deposition chamber that can be evacuated, to an intended gaseous state; and generating a glow discharge in the deposition chamber to deposit a-SiGe(H,X) on the prescribed substrate placed in advance on a prescribed position, while controlling the deposition of Ge atoms so as to give an intended Ge distribution curve.

The formation of the layer according to the sputtering method can be accomplished by; setting a target made of Si, or a target made of Si together with a target made of Ge, or alternatively a target made of Si-Ge mixture in a deposition chamber for sputtering use; introducing a Ge-supplying gas diluted if necessary with an inert gas such as He or Ar, and if necessary a hydrogen-supplying gas and/or a halogen(X)-supplying gas into the deposition chamber to form an intended plasmic atmosphere; and sputtering the target while controlling the flow of the Ge-supplying gas so as to give an intended Ge distribution curve.

The formation of the layer according to the ion plating method can be accomplished in the same manner as in the case of the sputtering method except that a polycrystalline or single-crystalline Si and a polycrystalline or single-crystalline Ge are placed as vapor sources in vapor-deposition purpose boats, respectively and the vapor sources are heated and evaporated by resistance heating or the electron beam method (EB method) to pass the resulting vapor through an intended plasmic atmosphere.

Suitable materials for the Si-supplying gas used in the invention are hydrogenated silicons (silanes) gaseous or gasifiable, for example, $SiH_4$, $Si_2H_6$, $Si_3H_8$, and $Si_4H_{10}$. In particular, $SiH_4$ and $Si_2H_6$ are preferred in that these are easy to handle for the layer formation and exhibit high efficiency for Si supply.

Suitable materials for the Ge-supplying gas hydrogenated germaniums gaseous or gasifiable, for example, $GeH_4$, $Ge_2H_6$, $Ge_3H_8$, $G_4H_{10}$, $Ge_5H_{12}$, $Ge_6H_{14}$, $Ge_7H_{16}$, $Ge_8H_{18}$, and $Ge_9H_{20}$. In particular, $GeH_4$, $Ge_2H_6$, and $Ge_3H_8$ are preferred in that these are easy to handle for the layer formation and exhibit high efficiency for Ge supply.

Suitable materials for the halogen-supplying gas used in the invention include various halogen compounds gaseous or gasifiable, for example, halogen gases, halogenated compounds, interhalogen compounds, and halogen-substitution derivatives of silanes.

Other suitable examples of the halogen-supplying gas are gaseous or gasifiable silanes having silicon atom and halogen atom constituents.

Individual examples suitable for use as the halogen-supplying material are halogen gases of fluorine, chlorine, bromine, and iodine and inter-halogen compounds, such as BrF, ClF, $ClF_5$, $BrF_5$, $BrF_3$, $IF_3$, $IF_7$, ICl, and IBr.

Suitable examples of the halogen-atom-containing silicon compound, i.e. the halogen-substitution derivative of silane, are $SiF_4$, $Si_2F_6$, $SiCl_4$, and $SiBr_4$.

When such a halogen-containing silicon compound is used for the production of the photoconductive member characteristic of the invention by glow discharge, the light receiving layer or first layer composed of a-SiGe containing halogen atoms can be formed on an intended substrate without using any silane gas as an Si-supplying material along with a Ge-supplying material.

The basic way to form the halogen-containing light receiving layer or first layer on an intended substrate according to the glow discharge method comprises introducing, for example, silicon halide as an Si-supplying gas, hydrogenated germanium as a Ge-supplying gas, and a dilution gas such as Ar, $H_2$, or He, into a deposition chamber in predetermined proportions and at predetermined flow rates and generating a glow discharge to form a plasmic atmosphere of these gases. In this case, hydrogen gas or a hydrogen-atom-containing silicon compound gas can be added in a suitable proportion to the above gas mixture for the purpose of controlling more easily the content of hydrogen atoms introduced in the light receiving layer or first layer.

For each gas playing a role, may be used single gas or plural gases in predetermined mixing proportions.

According to either of the sputtering method and the ion plating method, the introduction of halogen atoms into the layer to be formed can be accomplished by introducing the above cited halogen compound or halogen-atom-containing silicon compound in gaseous form together with other necessary feed gases into a deposition chamber and forming a plasmic atmosphere of these gases.

The introduction of hydrogen atoms into the layer can be accomplished by introducing a hydrogen-atom-introducing gas, for example, $H_2$, the above cited silanes and/or the above cited hydrogenated germanium into a deposition chamber suitable for sputtering, and forming a plasmic atmosphere of these gases.

While the above cited halogen compounds or halogen-containing silicon compounds can be effectively used, in the invention, as halogen-atom-introducing feed gas, the following gaseous or gasifiable compounds can also exemplified as effective starting materials for the light receiving layer or first layer. That is; halogenated compounds containing at least one hydrogen atom as a constituent including; hydrogen halides such as HF, HCl, HBr, and HI; halogen-substitution derivatives of silanes such as $SiH_2F_2$, $SiH_2I_2$, $SiH_2Cl_2$, $SiHCl_3$, $SiH_2Br_2$, and $SiHBr_3$; and hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, and $GeH_3I$; and germanium halides such as $GeF_4$, $GeCl_4$, $GeBr_4$, $GeI_4$, $GeF_2$, $GeCl_2$, $GeBr_2$, and $GeI_2$.

Of the above compounds, the halogenated compounds containing at least one hydrogen atom can be used as favorable halogen-introducing feed materials in the invention, since these halogenated compounds permit the introduction of hydrogen atoms, which are effective for controlling electrical or photoelectric properties of the light receiving layer or first layer, together with halogen atoms into the layer.

The introduction of hydrogen atoms as a constituent into the light receiving layer or first layer can also be performed without using the above compound by introducing; a silane such as $SiH_4$, $Si_2H_6$, $Si_3H_8$, or $Si_4H_{10}$; germanium, a germanium compound, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, or $Ge_9H_{20}$, for supplying Ge; and silicon or a silicon compound, for supplying Si; into a deposition chamber, and generating therein an electric discharge.

In an preferred emboidment of the invention, the content of hydrogen atoms (H), the content of halogen atoms(X), or the combined content of hydrogen atoms with halogen atoms (H+X), in the light receiving layer or first layer of the photoconductive member is desirably 0.01–40 atomic %, preferably 0.05–30 atomic %, and particularly preferably 0.1–25 atomic %.

The control of the content of hydrogen atoms and/or halogen atoms in the light receiving layer or first layer can be accomplished by controlling, for instance; the substrate temperature, the flow of the starting material introduced into the deposition chamber for incorporating hydrogen atoms and/or halogen atoms into the layer, and the electric discharge power.

The thickness of the light receiving layer or first layer in the photoconductive member of the invention is suitably decided so that photocarriers produced in the layer will be transported effectively. The thickness is desirably 1–100$\mu$, preferably 1–80$\mu$, and particulary preferably 2–50$\mu$.

In the invention, the formation of the laminar region (N), containing nitrogen atoms, in the light receiving layer or first layer can be accomplished by feeding a nitrogen-atom-introducing starting material jointly with the above stated other starting material while controlling the flows of these materials.

When the glow discharge method is used for the formation of the laminar region (N), a nitrogen-atom-introducing starting material is added to the material properly selected from the above cited starting materials suitable for the formation of the light receiving layer or first layer. For this nitrogen-atom-introducing starting material, there can be used a variety of gaseous or gasifiable compounds containing at least one nitrogen atom as a constituent.

For the formation of the light receiving layer or first layer provided with a laminar region (N), it is possible, for instance, to use a starting gas containing silicon (Si) as a constituent atom, a starting gas containing nitrogen (N) as a constituent atom, and if necessary, a starting gas containing hydrogen (H) and/or halogen (X) as a constitutent atom, in intended mixing proportions or to use a starting gas containing silicon (Si) as a constituent atom and a starting gas containing nitrogen (N), and hydrogen (H) as constituent atoms, also in intended mixing proportions. Alternatively, it is possible to use a mixture of a starting gas containing silicon (Si) and hydrogen (H) as constitutent atoms with a start gas containing nitrogen (N) as a constituent atom.

Effective starting materials for use as the nitrogen-atom-introducing feed gas include, for example, gaseous nitrogen ($N_2$) and gaseous or gasifiable nitrides or azides such as ammonia ($NH_3$), hydrazine ($N_2H.NH_2$), hydrogen azide ($HN_3$), and ammonium azide ($NH_4N_3$). Besides these compounds, nitrogen halides such as nitrogen trifluoride ($F_3N$) and dinitrogen tetrafluoride ($F_4N_2$) can be exemplified as starting materials which can introduce halogen atoms (X) in addition to nitrogen atoms (N).

In the invention, oxygen atoms in addition to nitrogen atoms can be incorporated into the laminar region (N) for the purpose of further enhancement of the effect which can be obtained with nitrogen atoms. Suitable compounds as the starting material for introducing oxygen atoms into the laminar region (N) include, for example, oxygen ($O_2$), ozone ($O_3$), nitrogen monoxide (NO), nitrogen dioxide ($NO_2$), nitrogen suboxide ($N_2O$), dinitrogen trioxide ($N_2O_3$), dinitrogen tetraoxide ($N_2O_4$), dinitrogen pentoxide ($N_2O_5$), nitrogen trioxide ($NO_3$), and lower siloxanes containing silicon, oxygen, and hydrogen as constituent atoms, such as disiloxane ($H_3SiOSiH_3$) and trisiloxane ($H_3Si.O.SiH_2.O.SiH_3$).

The formation of the laminar region (N) containing nitrogen atoms, according to the sputtering method, can be accomplished by using a wafer of single crystalline or polycrystalline silicon, a wafer of $Si_3N_4$, or a wafer of $Si$-$Si_3N_4$ mixture and sputtering the target material in a suitable gas selected from various gaseous materials.

When an Si wafer, for example, is used as target, the laminar region (N) can be formed by introducing a starting gas suitable for introducing nitrogen atoms and, if necessary, hydrogen atoms and/or halogen atoms, diluted with an inert gas as required, into a suitable deposition chamber, and sputtering the Si wafer in a plasmic atmosphere of these gases.

Alternatively, the formation of the laminar region (N) is accomplished by using Si and $Si_3N_4$ separately as targets or using one target of $Si$-$Si_3N_4$ mixture and performing the sputtering in an atmosphere of diluent gas suitable for sputtering or of gas which contains at least hydrogen (H) or/and halogen (X) as constituent atoms. In this case, the nitrogen-atom-introducing starting gases cited above as suitable in the case of glow discharge can also be used effectively.

When the light receiving layer or first layer having a nitrogen-atom-containing laminar region (N) is formed in the invention, the intended depth profile of nitrogen atom concentration in the laminar region (N) can be obtained, in the case of glow discharge, by introducing a nitrogen-atom-introducing starting gas while varying the flow rate of the gas according to the intended nitrogen atom distribution curve.

The regulation of the gas flow rate can be accomplished, for instance, by varying gradually the opening of a given needle valve, fitted in the gas flow line, in some way commonly used, e.g. manual operation or driving with an external motor. The flow rate is varied not always linearly. It can be regulated according to a previously designed curve by means of, e.g. a microcomputer. Thus, the intended depth profile of nitrogen atom concentration can be obtained.

In the case of sputtering the first way of attaining the intended depth profile is to introduce a nitrogen-atom-introducing starting gas into a deposition chamber, similarly to the case of glow discharge, while varying the gas flow rate according to the intended nitrogen atom distribution curve. The second way is to use a target suitable for sputtering, for example, a target of $Si$-$Si_3N_4$ mixture in which the mixing ratio of $Si/Si_3N_4$ has been varied previously in the depth direction according to the intended nitrogen atom distribution curve.

In the photoconductive member of the invention, conduction characteristics of the light receiving layer or first layer can be controlled as desired by incorporating thereinto a substance which dominates semiconduction characteristics.

Such substances are "impurities", so-called in the field of semiconductors, which include, in the invention, p-type impurities that gives a p-type of semiconductive nature to the a-SiGe (H,X) composing the light receiving layer or first layer and n-type impurities that gives an n-type of semiconductive nature.

Suitable p-type impurities for use in the invention include elements of group III of the periodic table, e.g. B, Al, Ga, In, and Tl, among which B and Ga are particularly suited.

Suitable n-type impurities for use in the invention include elements of group V of the periodic table, e.g. P, As, Sb, and Bi, among which P and As are particularly suited.

In the invention, the content of the impurity (C) controlling semiconduction characteristics in the light receiving layer is suitably chosen by considering organic relations thereof to various characteristics such as those required for the layer and those of the contact surface between the layer and the substrate.

When the impurity (C) controlling semiconduction characteristics is localized in an intended laminar region, particularly in the substrate side interfacial region (E), of the light receiving layer or first layer, the content of the impurity is suitably chosen by considering also the relation to characteristics of the other laminar region formed to be in direct contact with the intended laminar region and the relation to characteristics of this contact interface.

The content of the impurity (C) in the light receiving layer or first layer is generally $0.01$–$5 \times 10^4$ atomic ppm, more suitably $0.5$–$1 \times 10^4$ atomic ppm, and most suitably $5 \times 10^3$ atomic ppm.

When the intended content of the impurity (C) in the light receiving layer is at least 30 atomic ppm, particularly 50 atomic ppm, and more particularly 100 atomic ppm, it is desirable to localize the impurity (C), especially in the substrate side interfacial region (E) of the layer.

By concentrating the impurity (C) at least the above values in said interfacial region (E), it becomes possible to impede effectively, when the impurity (C) is of p-type, the injection of electrons from the substrate into the light receiving layer or first layer where the free surface of the layer is positively charged, and when the impurity (C) is of n-type, the injection of holes from the substrate into the light receiving layer where the free surface of the layer is negatively charged.

When an impurity (C), p-type or n-type, is thus incorporated in the substrate side interfacial region (E) of the light receiving layer or first layer, the other layer region (Z) excluding said interfacial region (E) is allowed to contain either another impurity (C) of the reverse polarity type or an impurity (C) of the same polarity type in a far less amount than in the interfacial region (E).

In such cases, the content of the impurity (C) in the layer region (Z) is suitably chosen depending upon the polarity and content of the impurity contained in the interfacial region (E), and is generally 0.001–1000 atomic ppm, more suitably 0.05–500 atomic ppm, and most suitably 0.1–200 atomic ppm.

When impurities of the same type are incorporated in the interfacial region (E) and the layer region (Z) respectively, the content in the layer region (Z) is desired to be 30 atomic ppm or less. Another mode of distributing impurities (C) is that a layer region containing an impurity and another layer region containing an impurity of the reverse polarity type are arranged in the light receiving layer or first layer so as to contact each other directly, thereby forming a so-called depletion layer on the contact interface. For instance, a layer region containing the above cited p-type of impurity and a layer region containing the above cited n-type of impurity are laid to contact each other directly in the light receiving layer or first layer, thereby forming a depletion layer on the contact interface.

The introduction of an impurity, e.g. an element of group III or V as a constituent in the light receiving layer or first layer can be accomplished by feeding a starting gas suitable for introducing such an element, together with other starting gas for forming the light receiving layer or first layer, into a deposition chamber. The starting material used for introducing an element of group III is desired to be gaseous at ordinary temperature and pressure or readily gasifiable under the conditions of forming said layer.

Examples of the material used for introducing an element of group III are boron hydrides (boranes) such as $B_2H_6$, $B_4H_{10}$, $B_5H_9$, $B_5H_{11}$, $B_6H_{10}$, $B_6H_{12}$, and $B_6H_{14}$ and boron halides such as $BF_3$, $BCl_3$, and $BBr_3$, for introducing boron, and $AlCl_3$, $GaCl_3$, $Ga(CH_3)_3$, $InCl_3$, and $TlCl_3$, for introducing other elements of group III.

Examples of the material used for introducing an element of group V are hydrogen phosphides such as $PH_3$ and $P_2H_4$ and phosphorous halides such as $PH_4I$, $PF_3$, $PF_5$, $PCl_3$, $PCl_5$, $PBr_3$, $PBr_5$, and $PI_3$, for introducing phosphorous, and $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$, for introducing other elements of group V.

In the photoconductive member of the invention, when the light receiving layer on the substrate has a laminate structure consisting of a first layer which, as described already, is composed of a-SiGe (H,X), contains nitrogen atoms, and has photoconductivity and a second layer, this second layer has a free surface and is provided to achieve the objects of the invention chiefly with respect to humidity resistance, continuous repeated operation characteristics, voltage resistance, resistance to environmental service conditions, and durability. The second layer constituted of an amorphous material which contains silicon atoms as matrix and at least either of carbon atoms and oxygen atoms.

A preferred embodiment of the second layer consists of an amorphous material which contains silicon atoms (Si), carbon atoms (C), and if necessary, hydrogen atoms (H) and/or halogen atoms (X) (hereinafter this amorphous material is designated as "a-$(Si_xC_{l-x})_y(H,X)_{l-y}$", wherein ($0<x$, $y<1$).

The second layer, when constituted of a-$(Si_xC_{l-x})_y(H,X)_{l-y}$, can be formed according to the glow discharge method, sputtering method, ion implantation method, ion plating method, electron beam method, etc. In practice, one of these methods is suitably chosen depending upon such factors as production conditions, investment on equipment, production scale, and characteristics required for the photoconductive member produced. In general, the glow discharge method and the sputtering method are favorably applied since these are advantageous in that operation conditions for producing the photoconductive member having required characteristics are relatively easy to control and carbon atoms and halogen atoms, together with silicon atoms, can be easily introduced into the second layer to be formed.

The second layer may also be formed by combined application of glow discharge and sputtering methods in the same deposition chambers.

The formation of the second layer according to the glow discharge method can be accomplished by feeding a gaseous material suitable for forming a-$(Si_x Cl_{-x})_y(H,X)_{l-y}$ mixed, if necessary, with a diluent gas in a predetermined mixing ratio into a vacuum deposition chamber in which a substrate overlaid with a first layer, and generating a glow discharge in the chamber to form a plasmic atmosphere of fed gas, thereby depositing a-$(Si_xC_{l-x})_y(H,X)_{l-y}$ on the first layer.

In the invention, most of the gaseous or gasifiable compounds having at least one of silicon (Si), carbon (C), hydrogen (H), and halogen (X) as a constituent atom can be used as a feed gas for the formation of a-$(Si_xC_{l-x})_y(H,X)_{l-y}$.

When a gas having Si as a constituent atom is employed as a raw material, the following mixture of gases can be used each in intended mixing proportions as the feed: a mixture of a gas having Si as a constituent atom, a gas having C as a constituent atom, and if necessary, a gas having H as a constituent atom or/and a gas having X as a constituent atom; a mixture of a gas having Si as a constituent atom with a gas having C and H as constituent atoms or/and a gas having X as a constituent atom; and a mixture of a gas having Si as a constituent atom and either a gas having Si, C, and H as constituent atoms or a gas having Si, C, and X as constituent atoms.

Besides the above, the following mixtures can also be used as the feed material: a mixture of a gas having Si and H as constituent atoms and a gas having C as a constituent atom; and a mixture of a gas having Si and X as constituent atoms and a gas having C as a constituent atom.

Suitable halogens (X) for a constituent of the second layer are F, Cl, Br, and I; in particular F and Cl are preferable.

As the effective raw materials for formation of the second layer, there are mentioned substance which are gaseous at a normal temperature and pressure or are easily gasifiable, and which include silicon hydrides such as silanes, hydrocarbons, which are constituted of C and H, such as $C_1$–$C_4$ saturated hydrocarbons, $C_2$–$C_4$ ethylenic hydrocarbons, and $C_1$–$C_3$ acetylenic hydrocarbons; halogens; hydrogen halides, interhalogen compounds, silicon halides, and halogen-substituted silicon hydrides.

Specific examples thereof are given as follows: silanes e.g. $SiH_4$, $Si_2H_6$, $Si_3H_8$, and $Si_4H_{10}$; saturated hydrocarbons, e.g. methane, ethane, propane, n-butane, and pentane; ethylenic hydrocarbons, e.g. ethylene, propylene, butene-1, butene-2, isobutylene, and pentene; acetylenic hydrocarbons, e.g. acetylene, methylacetylene, and butyne; halogens, e.g. fluorine, chlorine, bromine, and iodine; hydrogen halides, e.g. HF, HI, HCl, and HBr; interhalogen compounds, e.g. BrF, ClF, $ClF_3$, $ClF_5$, $BrF_5$, $BrF_3$, $IF_7$, $IF_5$, ICl, and IBr; silicon halides, e.g. $SiF_4$, $Si_2F_6$, $SiCl_4$, $SiCl_3Br$, $SiCl_2Br_2$, $SiClBr_3$, $SiCl_3I$, and $SiBr_4$; halogen-substituted silicon hydrides, e.g. $SiH_2F_2$, $SiH_2Cl_2$, $SiHCl_3$, $SiH_3Cl$, $SiH_3Br$, $SiH_2Br_2$, and $SiHBr_3$.

Besides these, the following compounds can also be used effectively: halogen-substituted paraffin hydrocarbons, e.g. $CF_4$, $CCl_4$, $CBr_4$, $CHF_3$, $CH_2F_2$, $CH_3F$, $CH_3Cl$, $CH_3Br$, $CH_3I$, and $C_2H_5Cl$; sulfur fluorides, e.g. $SF_4$ and $SF_6$; silicon alkyls, e.g.: $Si(CH_3)_4$ and $Si(C_2H_5)_4$; halogen-containing silicon alkyls, e.g. $SiCl(CH_3)_3$, $SiCl_2(CH_3)_2$, and $SiCl_3CH_3$.

These raw materials, when used, are suitably chosen so that silicon atoms, carbon atoms, halogen atoms, and if necessary, hydrogen atoms in desired proportions may be contained in the second layer to be formed.

For instance, the second layer composed of a-$(Si_xC_{l-x})_y(Cl+H)_{l-y}$ can be formed by introducing $Si(CH_3)_4$, with which the incorporation of Si, C, and H can be accomplished with ease and the layer of desired characteristics can be formed, ane one of $SiHCl_3$, $SiH_2Cl_2$, $SiCl_4$, and $SiCl_4$ as a halogen source, in gaseous state at a prescribed mixing ratio into a deposition chamber for the formation of the second layer and generating a glow discharge in the chamber.

The formation of the second layer according to the sputtering method can be accomplished by employing a single crystalline or polycrystalline Si wafer, a C wafer, or a wafer of Si-C mixture as target and sputtering the targer in a suitable atmosphere, if necessary, of gases containing halogen or/and hydrogen as constituted atoms.

For instance, when an Si wafer is used a target, a gaseous raw material for introducing C and at least one of H and X, mixed if necessary with a diluent gas, is introduced in a sputtering purpose deposition chamber and a plasma of these gases is formed to sputter the Si wafer.

Alternatively, the second layer formation is accomplished by using an Si target and a C target at the same time or one target of Si-C mixture and sputtering the target in an atmosphere, if necessary, of gases containing H or/and X as constitient atoms. Gaseous raw materials for introducing C, H, and X shown above referring to the glow discharge method can also be used effectively in this case.

Suitable diluent gases for use in the formation of the second layer according to the glow discharge method or sputtering methods are rare gases, e.g. He, Ne, and Ar.

The second layer is formed with care so as to have necessary characteristics as intended. That is, the material constituted of Si, C, and if necessary, H or/and X can take any form ranging from crystalline to amorphous and exhibit any electrical property of conductor, semiconductor, and insulator depending upon operation conditions of the formation thereof. Accordingly, the operational conditions are strictly chosen so that a-$(Si_xC_{l-x})_y(H,X)_{l-y}$ having desired characteristics fitted to objects thereof will be obtained. For instance, when the second layer is formed aiming mainly at improvement of the dielectric strength, the a-$(Si_xC_{l-x})_y(H,X)_{l-y}$ is prepared in amorphous form so as to exhibit eminent electric insulation properties in service environments.

When the second layer is formed aiming mainly at improvements of characteristics for continuous repeated operations and of resistance to service environments, the above requirement on electric insulation properties is loosened in some degree and a-$(Si_xC_{l-x})_y(H,X)_{l-y}$ is prepared in amorphous form so as to have a some degree of sensitivity to the irradiating light.

The substrate temperature during the formation of the second layer consisting of a-$(Si_xC_{l-x})_y(H,X)_{l-y}$ on the first layer is an important factor affecting the structure and properties of the resulting layer. Accordingly, it is desired that the substrate temperature be exactly controlled so that an a-$(Si_xX_{l-x})_y(H,X)_{l-y}$ having intended characteristics may be formed as desired.

The formation of the second layer is performed after proper selection of the optimum range of substrate temperature as well as the method of forming the second layer for achieving intended objects effectively. In general, the temperature range is 20°–400° C., more suitably 50°–350° C., and most suitably 100°–350° C. For the formation of the second layer, the glow discharge method and the sputtering method are advantageous in that the fine control of the layer composition and the control of the layer thickness are relatively easy as compared with other methods, while the electric discharge power, similarly to the substrate temperature, is an important factor affecting characteristics of the resulting a-$(Si_xC_{l-x})_yX_{l-y}$.

The electric discharge power is desirably 1.0–300W, preferably 2.0–250W, and particularly preferably 5.0–200W, for performing effective, good productivity formation of a-$(Si_xC_{l-x})_yX_{l-y}$ which has such characteristics as to achieve objects of the invention.

Gas pressure in the deposition chamber is desirably 0.01–1 Torr, preferably 0.1–0.5 Torr.

While the above ranges of substrate temperature and of electric discharge power are desirable, the optimum ranges of these factors affecting the layer formation are decided not independently of each other but dependently upon organic correlation therebetween so as to result in the second layer having a constitution of a-$(Si_xCl_{l-x})_y(H,X)_{l-y}$ and desired characteristics.

The content of carbon atoms in the second layer, similarly to the above noted conditions of the second layer formation, is an important factor to give the second layer desired characteristics for achieving objects of the invention. This carbon atom content is suitably chosen according to the nature and characteristics of the amorphous material composing the second layer.

That is, the amorphous materials represented by the general formula a-$(Si_xC_{l-x})_y(H,X)_{l-y}$ are roughly classified into amorphous materials constituted of silicon and carbon atoms (hereinafter these materials are represented by "a-$Si_aC_{l-a}$", wherein $0<a<1$), those constituted of silicon, carbon, and hydrogen atoms (hereinafter these materials represented by "a-$(Si_bC_{l-b})_cH_{l-c}$", wherein $0<b$, $c<1$), and those constituted of silicon carbon, and halogen atoms, and if necessary, further hydrogen atoms (hereinafter, these materials are represented by "a-$(Si_dC_{l-d})_e(H,X)_{l-e}$", wherein $0<d$, $e<1$).

The second layer, when consisting of a-$Si_a C_{l-a}$, contains carbon atoms in a concentration of desirably $1\times10^{-3}$–90 atomic %, preferably 1–80 atomic %, and particularly preferably 10–75 atomic %. Expressing this in terms of a of "a-$Si_aC_{l-a}$", a is desirably 0.1–0.99999, preferably 0.2–0.99, and particularly preferably 0.25–0.9.

The second layer, when consisting of a-$(Si_bC_{l-b})_cH_{l-c}$, contains carbon atoms in a concentration of desirably $1\times10^3$–90 atomic %, preferably 1–90 atomic %, and particularly preferably 10–80 atomic %. In this case, the content of hydrogen atoms is desirably 1–40 atomic %, preferably 2–35 atomic %, and particularly preferably 5–30 atomic %. When the hydrogen content is in the above range, the resulting photoconductive member is sufficiently good in quality practical use. Expressing the content in terms of b and c of a-$(Si_bC_{l-b})_cH_{l-c}$, b is desirably 0.1–0.99999, preferably 0.1–0.99, and particularly preferably 0.15–0.9 and c is desirably 0.6–0.99, preferably 0.65–0.98, and particularly preferably 0.7–0.95.

The second layer, when consisting of a-$(Si_d C_{l-d})_e(H,X)_{1-e}$, contains carbon atoms in a concentration of desirably $1\times10^{-3}$–90 atomic %, preferably 1–90 atomic %, and particularly preferably 10–80 atomic %. In this case, the content of halogen atoms is desirably 1–20 atomic %, preferably 1–18 atomic %, and particularly preferably 2–15 atomic %. When the halogen content is in the above range, the resulting photoconductive member is sufficiently good in quality for practical use. The content of hydrogen atoms incorporated if necessary, is desirably up to 19 atomic %, preferably up to 13 atomic %. Expressing the content in terms of d and e of a-$(Si_dC_{l-d})_e(H,X)_{l-e}$, d is desirably 0.1–0.99999, preferably 0.1–0.99, and particularly preferably 0.15–0.9, and e is desirably 0.8–0.99, preferably 0.82–0.99, and particularly preferably 0.85–0.98.

The thickness range of the second layer is also an important factor to effective achievement of objects of the invention. That is, the thickness is suitably chosen so that objects of the invention will be achieved effectively. When choosing the thickness, it is necessary to take into account the content of carbon atoms in the second layer, the relation to the thickness of the first layer, and also the organic relations with the characteristics required for the laminar regions. In addition, it is desirable to consider the economy including productivity and mass-productivity.

In general, the thickness of the second layer is desirably 0.003–30μ, preferably 0.004–20μ, and particularly preferably 0.005–10μ.

Another preferred embodiment of the second layer comprises an amorphous material containing silicon atoms (Si), oxygen atoms (O), and if necessary, hydrogen atoms (H) or/and halogen atoms (X) (hereinafter this amorphous material is represented by the formula a-$(Si_xO_{l-x})_y(H,X)_{l-y}$, wherein $0<x$, $y<1$). The second layer of this type can be formed according to glow discharge method, sputtering method, ion implantation method, ion plating method, electron beam method, etc. In practice, one of these methods is suitably chosen depending upon such factors as production conditions, investment on equipment, production scale, characteristics required for the photoconductive member to be produced, and so forth. In general, the glow discharge method and the sputtering method are favored in that operational conditions for producing the photoconductive member having required characteristics are relatively easy to control and oxygen and halogen atoms, together with silicon atoms, can be easily introduced into the second layer to be formed.

The second layer may also be formed by combined application of glow discharge and sputtering methods in the same deposition chamber.

The formation of the second layer according to the glow discharge method can be accomplished by feeding a gaseous material suitable for forming a-$(Si_xO_{l-x})_y(H,X)_{l-y}$ mixed, if necessary, with a deluent gas in a predetermined mixing ratio in a vacuum deposition chamber in which a substrate overlaid with a first layer, and generating a glow discharge in the chamber to form a plasmic atmosphere of fed gas, thereby depositing a-$(Si_xO_{l-x})_y(H,X)_{y-l}$ on the first layer.

In the invention, most of the compounds gaseous or gasifiable having at least one of silicon (Si), oxygen (O), hydrogen (H), and halogen (X) as a constituent atom can be used as a starting gas for the formation of a-$(Si_x-O_{l-x})_y(H,X)_{l-y}$.

When a gas having Si as a constituent atom is employed as a raw material, the following mixtures of gases can be used each in intended mixing proportions as the feed for the formation of the second layer: a mixture of a gas having Si as a constituent atom, a gas having O as a constituent atom, and if necessary, a gas having H as a constituent atom or/and a gas having X as a constituent atom; a mixture of a gas having Si as a constituent atom with a gas having O and H as constituent atoms or/and a gas having O and X as constitutent atoms; and a mixture of a gas having Si as a constituent atom and either a gas having Si, O, and H as constituent atoms or a gas having Si, O, and X as constituent atoms.

Besides the above, the following mixtures can also be used as the feed material: a mixture of a gas having Si and H as constituent atoms and a gas having O as a constituent atom; and a mixture of a gas having Si and X as constituent atoms and a gas having O as a constituent atom.

Suitable halogens (X) for a constituent of the second layer are F, Cl, Br, and I; in particular F and Cl are favorable.

The formation of the second layer according to the sputtering methods is carried out, for instance, as follows:

A gas for oxygen atoms (O) introduction and if necessary, a gas for hydrogen atom (H) introduction or/and a gas for halogen atom (X) introduction, diluted with an inert gas such as Ar or He, are fed into a vacuum deposition chamber, wherein a target made of Si is sputtered.

Alternatively, oxygen atoms (O) can be introduced into the second layer by sputtering a target made of $SiO_2$, two targets made of Si and $SiO_2$, respectively, or a target made of Si-$SiO_2$ mixture. In this case, the content of oxygen atoms (O) introduced into the second layer can be controlled with ease as desired by using an oxygen-introducing feed gas at the same time and regulating the flow of the gas or by adjusting the oxygen content in the oxygen-introducing target in the preparation thereof. These two methods can be combined.

Effective raw materials for Si introduction include, for example, gaseous or gasifiable silanes such as $SiH_4$, $Si_2H_6$, $Si_3H_8$, and $Si_4H_{10}$, among which $SiH_4$ and $Si_2H_6$ are particularly preferred in the ease of handling for layer formation and the high efficiency of Si introduction. When these materials are used, H together with Si can be introduced in the formed second layer by proper selection of layer forming conditions.

Effective raw materials for Si introduction include, besides the above cited silanes, halogen-substituted silane derivatives, such as silicon halides, including $SiF_4$, $Si_2F_6$, $SiCl_4$, and $SiBr_4$.

Other examples of the effective raw materials for Si introduction into the second layer are halogenated compounds, gaseous or gasifiable, which have hydrogen as a constituent atom, such as halogen-substituted silanes, e.g. $SiH_2F_2$, $SiH_2I_2$, $SiH_2Cl_2$, $SiHCl_3$, $SiH_2Br$, and $SiHBr_3$.

When these halogen(X)-containing silicon compounds are used, X together with Si can be introduced to the formed second layer by proper selection of layer forming conditions.

The hydrogen-containing silicon halides (halogen-substituted silanes), among the above cited raw materials, are used as favourable materials for halogen (X) introduction since these compounds introduce hydrogen atoms (H), which are very effective in controlling electric or photoelectric properties of the second layer, along with halogen atoms (X) into the layer during formation thereof.

Effective halogen(X)-introducing raw materials used for the second layer formation include, for example, besides the above compounds; halogens such as $F_2$, $Cl_2$, $Br_2$, and $I_2$; interhalogen compounds such as $BrF$, $ClF$, $ClF_3$, $BrF_5$, $BrF_3$, $IF_3$, $IF_7$, $ICl$, and $IBr$; and hydrogen halides such as $HF$, $HCl$, $HBr$, and $HI$.

Effective oxygen(O)-introducing raw materials used for the second layer formation include; compounds constituted of oxygen atoms (O) or oxygen (O) and nitrogen (N) atoms, e.g. oxygen ($O_2$), ozone ($O_3$), nitrogen monoxide (NO), nitrogen dioxide ($NO_2$), nitrogen suboxide ($N_2O$), dinitrogen trioxide ($N_2O_3$), dinitrogen tetraxide ($N_2O_4$), dinitrogen pentoxide ($N_2O_5$), and nitrogen trioxide; and lower siloxanes, which are constituted of silicon (Si), oxygen (O), and hydrogen (H) atoms, e.g. disiloxane ($H_3Si.O.SiCH_3$) and trisiloxiane ($H_3Si.O.SiH_2O.SiCH_3$).

Suitable diluent gases for use in the formation of the second layer according to the glow discharge method or sputtering method are rare gases, e.g. He, Ne, and Ar.

The second layer is formed with care so as to have necessary characteristics as intended. That is, the second layer material constituted of Si, O, and if necessary, H or/and X takes any form ranging from crystalline to amorphous and shows any electrical property of conductor, semiconductor or insulator, and photoconductive or non-photoconductive property depending upon operational conditions of the formation thereof. Accordingly, the operational conditions are strictly chosen so that a-$(Si_xO_{1-x})_y(H,X)_{1-y}$ having desired characteristics fitted to objects thereof will be obtained. For instance, when the second layer is formed aiming mainly at improvement of the dielectric strength, the a-$(Si_xO_{1-x})_y(H,X)_{1-y}$ is prepared in amorphous form so as to exhibit eminent electric insulation properties in service environments.

When the second layer is formed aiming at improvements of characteristics for continuous repeated operations and of resistance to service environments, the above requirement on electric insulation properties is somewhat loosed and a-$(Si_xO_{1-x})_y(H,X)_{1-y}$ is prepared in amorphous form so as to have a some degree of sensitivity to the irradiating light.

The substrate temperature during the formation of the second layer consisting of a-$(Si_xO_{1-x})_y(H,X)_{1-y}$ on the first layer is an important factor affecting the structure and properties of the resulting layer. Accordingly, it is desired that the substrate temperature be exactly controlled so that an a-$(Si_xO_{1-x})_y(H,X)_{1-y}$ having intended characteristics may be formed as desired.

The formation of the second layer is performed after proper selection of the optimum range of substrate temperature as well as the method of forming the second layer for achieving intended objects effectively. In general, the temperature range is 20°–400° C., more suitably 50°–350° C., and most suitably 100°–350° C. For the formation of the second layer, the glow discharge method and the sputtering method are advantageous in that the fine control of the layer composition and the control of the layer thickness are relatively easy as compared with other methods. The electric discharge power, similarly to the substrate temperature, is an important factor affecting characteristics of the resulting a-$(Si_xO_{1-x})_y(H,X)_{1-y}$.

The electric discharge power is desirably 1.0–300 W, preferably 2.0–250 W, and particularly preferably 5.0–200 W, for performing effective, good productivity formation of a-$(Si_xO_{1-x})_y(H,X)_{1-y}$ which has such characteristics as to achieve objects of the invention.

Gas pressure in the deposition chamber is desirably 0.01–1 Torr, preferably 0.1–0.5 Torr.

While the above reanges of substrate temperature and of electric discharge power are desirable, the optimum ranges of these factors affecting the layer formation are decided not independently of each other but dependently upon organic correlation therebetween so as to result in the second layer constituted of a-$(Si_xO_{1-x})_y(H,X)_{1-y}$ having desired characteristic.

The content of oxygen atoms in the second layer similarly to the above noted conditions of the second layer formation, is an important factor to give the second layer the desired characteristics for achieving objects of the invention. This oxygen atom content is suitably chosen according to the nature and characteristics of the amorphous material composing the second layer.

That is, the amorphous materials represented by the general formula a-$(Si_xO_{1-x})_y(H,X)_{1-y}$ are roughly classified into amorphous materials constituted of silicon and oxygen atoms (hereinafter these materials are represented by "a-$Si_aO_{1-a}$", wherein $0<a<1$), those constituted of silicon, oxygen, and hydrogen atoms (hereinafter those materials represented by "a-$(Si_bC_{1-b})_cH_{1-c}$", wherein $0<b$, $c<1$), and those constituted of silicon, oxygen, and halogen atoms, and if necessary, further hydrogen atoms (hereinafter these materials are represented by "a-$(Si_dO_{1-d})_e(H,X)_{1-e}$, wherein $0<d$, $e<1$).

When the second layer consists of a-$Si_aO_{1-a}$, the oxygen content in this layer is expressed in terms of a of a-$Si_aO_{1-a}$, as follows: a is desirably 0.33–0.99999, preferably 0.5–0.99, and particularly preferably 0.6–0.9.

When the second layer consists of a-$(Si_bO_{1-b})_cH_{1-c}$, the oxygen content in this layer is expressed in terms of b and c of a-$(Si_bO_{1-b})_cH_{1-c}$ as follows: b is desirably 0.33–0.99999, preferably 0.5–0.99, and particularly preferably 0.6–0.9 and c is desirably 0.6–0.99, preferably 0.65–0.98, and particularly preferably 0.7–0.95.

When the second layer consists of a-$(Si_dO_{1-d})_e(H,X)_{1-e}$, the oxygen content in this layer is expressed in terms of d and e of a-$(Si_dO_{1-d})_e(H,X)_{1-e}$ as follows: d is desirably 0.33–0.99999, preferably 0.5–0.99, and particularly preferably 0.6–0.9 and e is desirably 0.8–0.99, preferably 0.82–0.99, and particularly preferably 0.85–0.98.

The thickness range of the second layer is also an important factor to effective achievement of the objects of the invention. That is, this thickness is suitably chosen so that objects of the invention may be achieved effectively. When choosing the thickness, it is necessary to take into account the content of oxygen atoms in the second layer, the relation to the thickness of the first layer, and also the organic relation with characteristics required for the laminar regions. In addition, it is desirable to consider the economy including production efficiency and mass-productivity.

In general, the thickness of the second layer is desirably 0.003–30µ, preferably 0.004–20µ, and particularly preferably 0.005–10µ.

The second layer may also be composed of a mixture of an amorphous material which has silicon atoms as matirx and contains carbon atoms with an amorphous material which has silicon atoms as matrix and contains oxygen atoms.

The substrate used in the invention may be either conductive or nonconductive electrically. Suitable materials for the conductive substrate include metals and alloys, e.g. NiCr, stainless steel, Al, Cr, Au, Nb, Ta, V, Ti, Pt, and Pd. For the nonconductive (insulating) substrate, there are commonly used films or sheets of synthetic resins, e.g. polyester, polyethylene, polycarbonate, cellulose acetate, polypropylene, poly(vinyl chloride), poly(vinylidene chloride), polystyrene, and polyamide; glass and ceramic plates; and paper. Desirably, at least one side of the insulating substrate is treated to give conductivity. Then, the treated surface is overlaid with other functional layers.

For example, when the substrate is made of glass, conductivity is given to one side of the substrate by covering it with a film of NiCr, Al, Cr, Mo, Au, Ir, Nb, Ta, V, Ti, Pt, Pd, $In_2O_3$, $SnO_2$, ITO ($In_2O_3+SnO_2$). When the substrate is a film of synthetic resin, e.g. a polyester film, one side of the substrate is covered with a film of metal such as NiCr, Al, Ag, Pd, Zn, Ni, Au, Cr, Mo, Ir, Nb, Ta, V, Ti, or Pt by vacuum deposition, electron-beam vapor deposition, or sputtering or a foil of the above metal is laminated upon one side of the substrate; thus conductivity is given. The substrate may take any possible form such as cylindrical, belt-like, plate-like, or some other form. The shape of the substrate is suitably chosen; for instance, when the photoconductive 100 or 200 shown in FIGS. 1 or 2 is used as an electrophotographic image forming member, the substrate thereof is desired to be in the form of endless belt or cylinder. The thickness of the substrate is suitably chosen so that an intended photoconductive member may be formed. When flexibility is required for the photoconductive member, the thickness of the substrate may be minimized to the limit over which the substrate can perform its function. However, the thickness, even in such a case, is desirably to be 10µ or more in view of difficulties in the fabrication, handling, and mechanical strength of the substrate.

The process for producing the photoconductive member of the invention is outlined below by way of an example.

Figure 12:
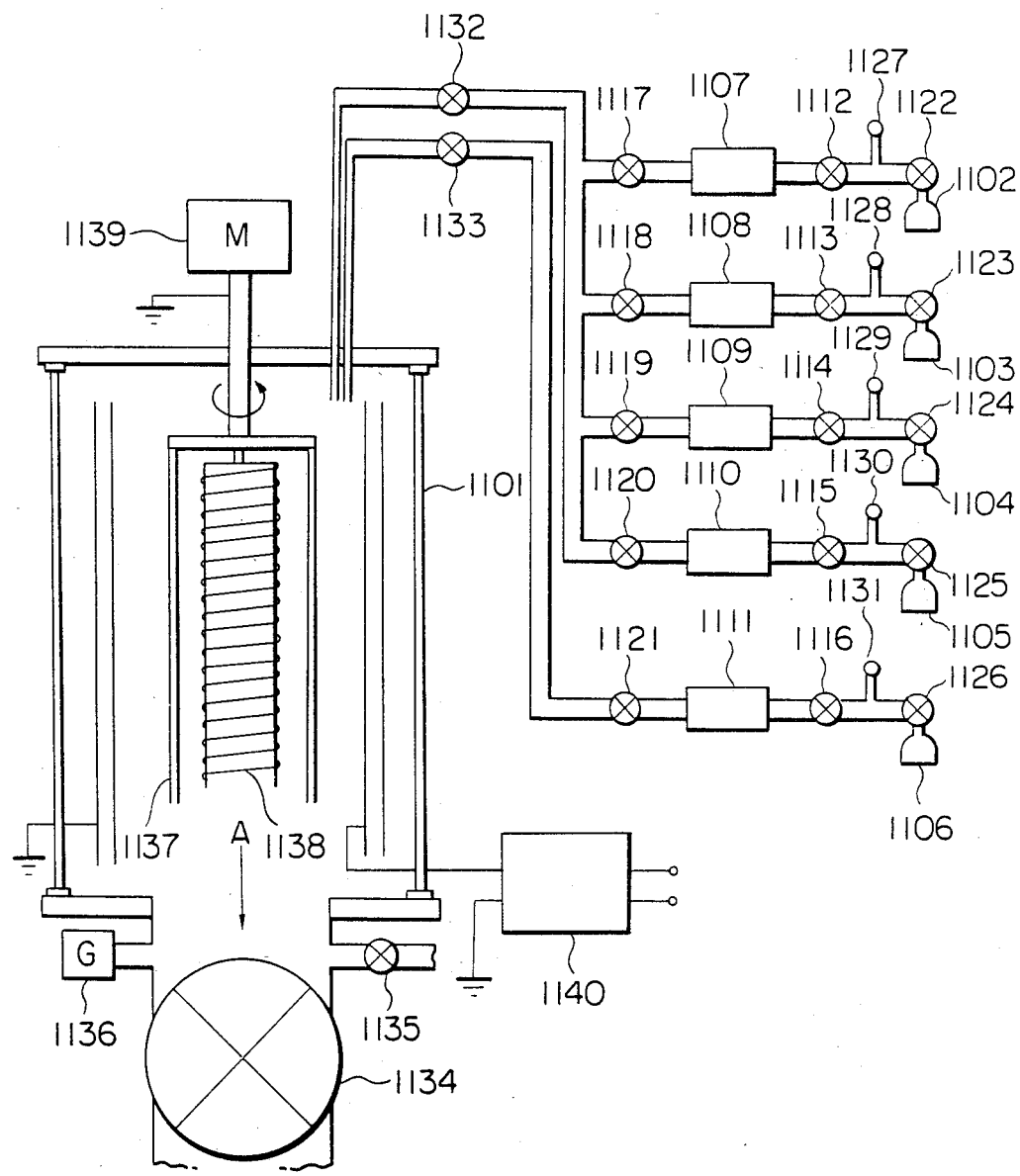
FIG. 12 is a schematic illustration of the device used for preparing photoconductive members in the invention.

FIG. 12 shows an apparatus for the production of the photoconductive member.

Bombs 1102–1106 are filled with gaseous raw materials for the formation of photoconductive members of the invention. For example, the bomb 1102 is filled with He-diluted $SiH_4$ gas (99.999% purity, hereinafter designated as $SiH_4/He$), bomb 1103 with He-diluted $GeH_4$ gas (99.999% purity, hereinafter designated as $GeH_4/He$), bomb 1104 with He-diluted $B_2H_6$ gas (99.99% purity, hereinafter designated as $B_2H_6/He$), bomb 1105 with $NH_3$ gas (99.999% purity), and bomb 1106 with $H_2$ gas (99.999% purity).

For introducing these gas into the reaction chamber 1101; the valves 1122–1126 of the bombs 1102–1106 and the leak valve 1135 are confirmed to be closed; inflow valves 1112–1116, outflow valves 1117–1121, and auxiliary valves 1132 and 1133 are confirmed to be opened; then the main valve 1134 is opened to evacuate the reaction chamber 1101 and all the pipes; and when the vacuum gage 1136 indicates a vacuum of about $5\times10^{-6}$ Torr, the auxiliary vavels 1132 and 1133 and the outflow valves 1117–1121 are closed.

An example of the formation of a light receiving layer on a cylindrical substrate 1137 is given below. The valves 1122–1125 are opened, the pressures at outlet pressure gages are adjusted to 1 $Kg/cm^2$, and the inflow valves 1112–1115 are gradually opened to introduce $SiH_4/He$ gas from the bomb 1102, $GeH_4/He$ gas from the bomb 1103, $B_2H_6/He$ gas from the bomb 1104, and $NH_3$ gas from the bomb 1105 into mass-flow controllers 1107–1110. Then, the outflow valves 1117–1120 and the auxiliary valve 1132 are gradually opened to introduce each gas into the reaction chamber 1101. At this time, the outflow valves 1117–1120 are regulated to adjust proportions of each gas flows to intended valves. While reading the indication of the vacuum gage 1136, the main valve 1134 are regulated to adjust the pressure in the reaction chamber 1101 to the intended value. After confirmation that the substrate is heated by the heater 1138 to a prescribed temperature between about 50° and 400° C., the power source is set to a prescribed power to generate a glow discharge in the reaction chamber 1101 and at the same time the flow of $GeH_4/He$ gas is varied with time according to a predetermined Ge distribution curve by regulating the outflow valve 1118 manually or with an external driving motor, whereby the distribution of Ge atoms in the resulting layer is controlled.

It should be noted that $B_2H_6/He$ gas is used as occasion demands.

Thus, a laminar region (N) or (B,N) composed of a-SiGe(H,X) is formed on the substrate 1137. In the lamilar region, nitrogen atoms (or nitrogen atoms and boron atoms) are contained and Ge atoms are distributed according to the predetermined distribution curve.

Then, an upper laminar region composed of a-SiGe(H,X), wherein none of nitrogen and boron atoms or either one of nitrogen and boron atoms is contained and Ge atoms are distributed according to the prescribed distribution curve, is formed on the laminar region (N) or (B,N) by following the above procedure under the same conditions, except that one or both of the outflow valves 1119 and 1120 are closed completely at the time the thickness of the laminar region (N) or (B,N) reaches the intended value and that conditions of electric discharge are altered as required. Thus, the formation of a light receiving layer is completed.

In the formation of the light receiving layer, the laminar region (B) containing boron atoms and the laminar region (N) containing nitrogen atoms can be controlled each to a desired thickness by stopping the introduction of $B_2H_6$/He gas or $NH_3$ gas at a desired time after the initiation of forming the layer.

The distribution of nitrogen atoms in the laminar region (N) can be controlled as desired by regulating the flow of $NH_3$ gas entering the reaction chamber 1101 according to an intended distribution curve Incorporation of halogen atoms into the light receiving layer can be accomplished by adding, for example, $SiF_4$ to the above gas mixture and a glow discharge is generated.

Incorporation of halogen atoms and of no hydrogen atom into the light receiving layer can be accomplished by using $SiF_4$/He gas and $GeF_4$/He gas in place of the $SiF_4$/He gas and $GeH_4$/He gas.

For the purpose of completing a light receiving layer by utilizing the thus formed layer as a first layer and forming a second layer thereupon, the second layer can be formed by feeding either $siH_4$ gas and $C_2H_4$ gas or $SiH_4$ gas and NO gas, diluted if necessary with a rare gas such as He with the same valve operations as in the formation of the first layer and generating a glow discharge under prescribed conditions. For using these gases, a $C_2H_4$ gas bomb or an NO gas bomb is added or substituted for a bomb not to be used.

For incorporating halogen atoms into the second layer, the second layer is formed similarly by using, for example, $SiF_4$ gas together with $C_2H_4$ gas, $SiF_4$ gas together with NO gas, or $SiH_4$ in addition to these gases.

Needless to say, the outflow valves except those for the gases required to use are all closed during operation.

In order to avoid the remaining of the gases used for the preceding formation of a layer, in the reaction chamber 1101 and in the lines between the outflow valves 1117-1121 and the reaction chamber 1101, the outflow valves 1117-1121 are closed, the auxiliary valves 1132 and 1133 are opened, the main valve 1134 is fully opened, and the reaction chamber 1101 and said spaces of the lines are once evacuated to a high vacuum. This procedure is performed as occasion demands.

The content of carbon or oxygen atoms in the second layer can be controlled as desired by suitable setting the flow ratio of $SiH_4$ gas to $C_2H_4$ gas or of $SiH_4$ gas to NO gas introduced into the reaction chamber 1101 when the layer is formed by glow discharge, or by suitable choosing the area ratio of a silicon target to either a graphite target or an $SiO_2$ target or suitable choosing the mixing ratio of silicon powder to either graphite powder or $SiO_2$ powder at the preparation of these target when the layer is formed by sputtering. The content of halogen atoms in the second layer can be controlled as desired by suitable regulation of the flow of a halogen-introducing feed gas, e.g. $SiF_4$ gas, introduced into the reaction chamber 1101.

It is desirable to rotate the substrate at a constant speed by means of the motor 1139 during layer formation for the purpose of uniforming the layer formation.

The following examples illustrate the invention in more detail.

EXAMPLE 1

Figure 13:
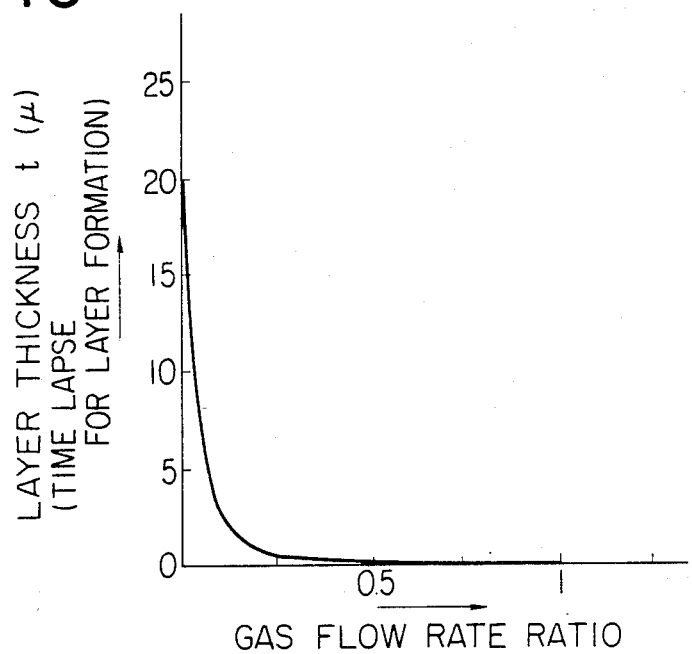
FIGS. 13–57 show the rate of layer formation as a function of gas flow ratio in examples of the invention.

By the preparation device as shown in FIG. 12, layers were formed or an Al cylinder substrate by changing the gas flow rate ratio of $GeH_4$/He gas to $SiH_4$/He gas along with the lapse of time for forming the layer under the condition of Table A-1 following the changing curve of the gas flow rate ratio as shown in FIG. 13, and thereby, an electrophotographic image forming member was produced.

The resulting image forming member was set in an experimental device for charging and exposure, and corona charging was effected at $\ominus 5.0$ kV for 0.3 second, followed immediately by irradiation of a light image from a tungsten lamp source at a dose of 2 lux.sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at $\ominus 5.0$ kV, there was obtained a clear image of high density excellent in resolution with good gradation reproducibility.

EXAMPLE 2

Figure 14:
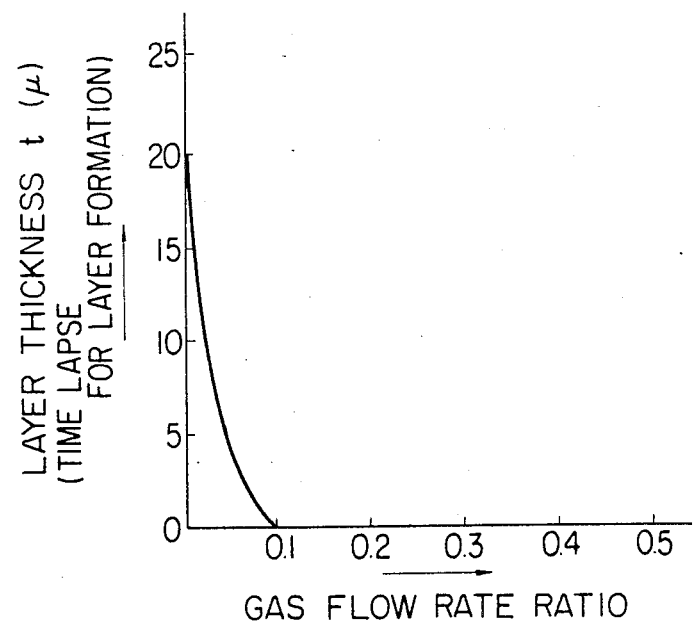

By the preparation device as shown in FIG. 12, layers were formed by changing the gas flow rate ratio of $GeH_4$/He gas to $SiH_4$/He gas along with the lapse of time for forming the layer under the condition of Table A-2 following the changing curve of the gas flow rate ratio as shown in FIG. 14. Other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 3

Figure 15:
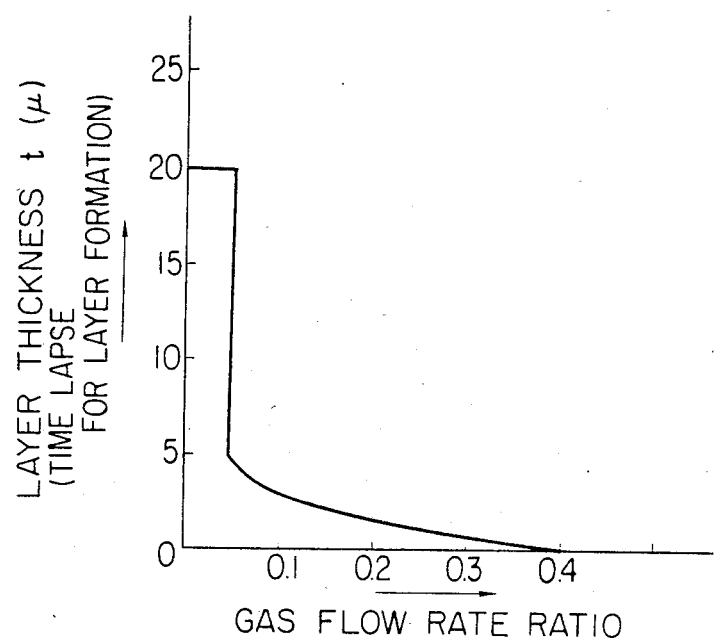

By the preparation device as shown in FIG. 12, layers were formed by changing the gas flow rate ratio of $GeH_4$/He gas to $SiH_4$/He gas along with the lapse of time for forming the layer under the condition of Table A-3 following the changing curve of the gas flow rate ratio as shown in FIG. 15. Other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 4

Figure 16:
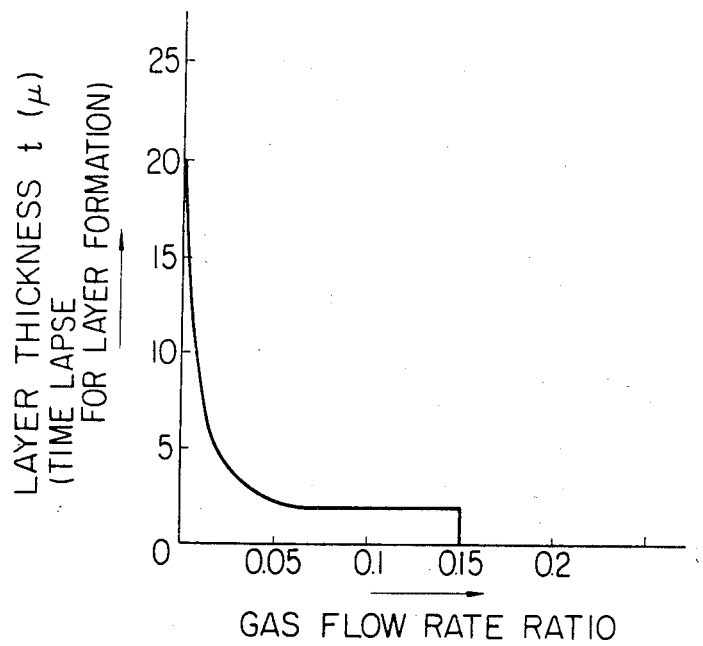

By the preparation device as shown in FIG. 12, layers were formed by changing the gas flow rate ratio of $GeH_4$/He gas to $SiH_4$/He gas along with the lapse of time for forming the layer under the condition of Table A-4 following the changing curve of the gas flow rate ratio as shown in FIG. 16. Other conditions were the same as in Example 1. Thereby, an electrophotographic image forming member was produced.

Using the resulting image forming member, image formation was effected on a transfer paper according to the same procedure and under the same conditions as in

EXAMPLE 5

Figure 17:
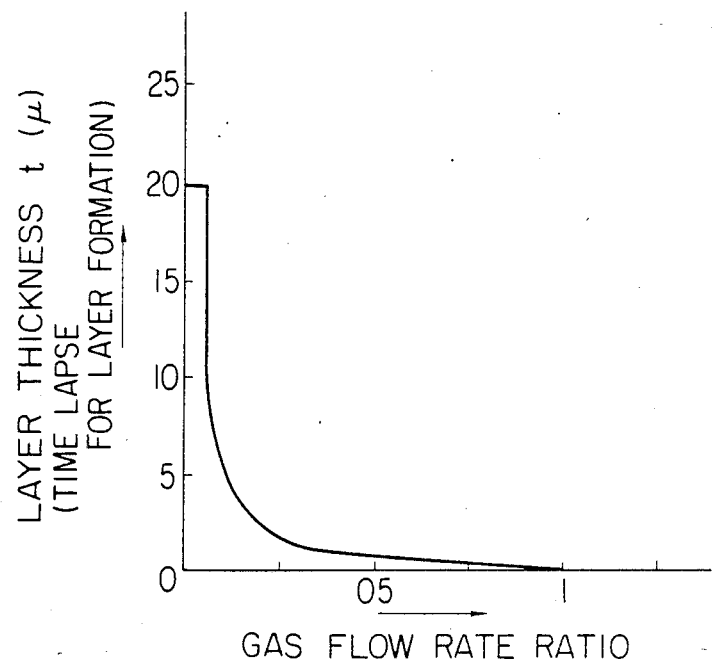

By the preparation device as shown in FIG. 12, layers were formed by changing the gas flow rate ratio of GeH$_4$/He gas to SiH$_4$/He gas along with the lapse of time for forming the layer under the condition of Table A-5 following the changing curve of the gas flow rate ratio as shown in FIG. 17. Other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 6

Figure 18:
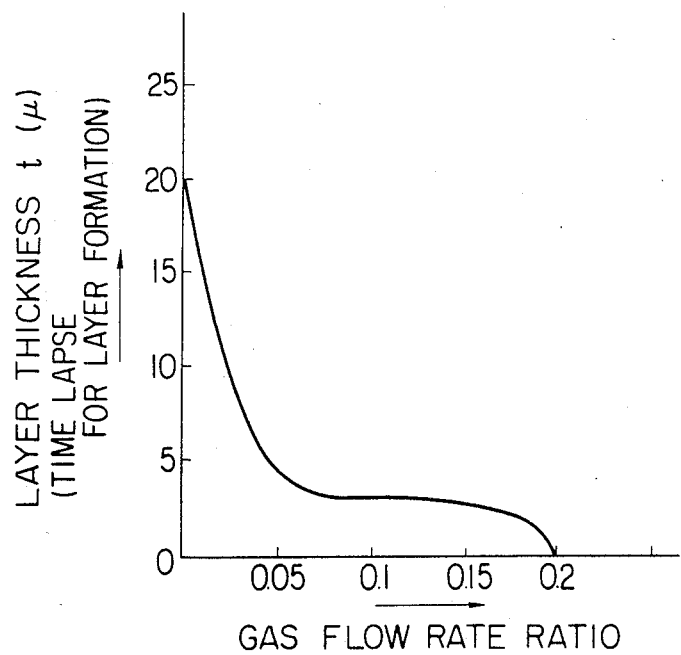

By the preparation device as shown in FIG. 12, layers were formed by changing the gas flow rate ratio of GeH$_4$/He gas to SiH$_4$/He gas along with the lapse of time for forming the layer under the condition of Table A-6 following the changing curve of the gas flow rate ratio as shown in FIG. 18. Other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 7

Figure 19:
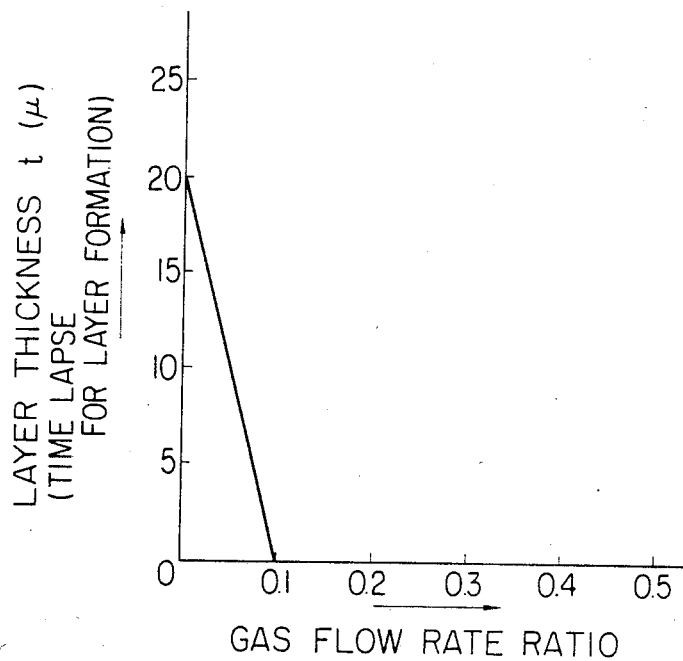

By the preparation device as shown in FIG. 12, layers were formed by changing the gas flow rate ratio of GeH$_4$/He gas to SiH$_4$/He gas along with the lapse of time for forming the layer under the condition of Table A-7 following the changing curve of the gas flow rate ratio as shown in FIG. 19. Other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 8

Layers were formed under the same conditions as Example 1 except that Si$_2$H$_6$/He gas was used in place of SiH$_4$/He gas used in Example 1 and that the operating condition was changed to that as shown in Table A-8. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 9

Layers were formed under the same conditions as Example 1 except that SiF$_4$/He gas was used in place of SiH$_4$/He gas used in Example 1 and that the operating condition was changed to that as shown in Table A-9. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 10

Layers were formed under the same conditions as Example 1 except that (SiH$_4$/He+SiF$_4$/He) gas was used in place of SiH$_4$/He gas used in Example 1 and that the operating condition was changed to that as shown in Table A-10. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 11

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table A-11 following the changing curve of the gas flow rate ratio as shown in FIG. 13, and thereby, an electrophotographic image forming member was produced.

The resulting image forming member was set in an experimental device for charging and exposure, and corona charging was effected at $\ominus 5.0$ kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus 5.0$ kV, there was obtained a clear image of high density excellent in resolution with good gradation reproducibility.

EXAMPLE 12

Figure 20:
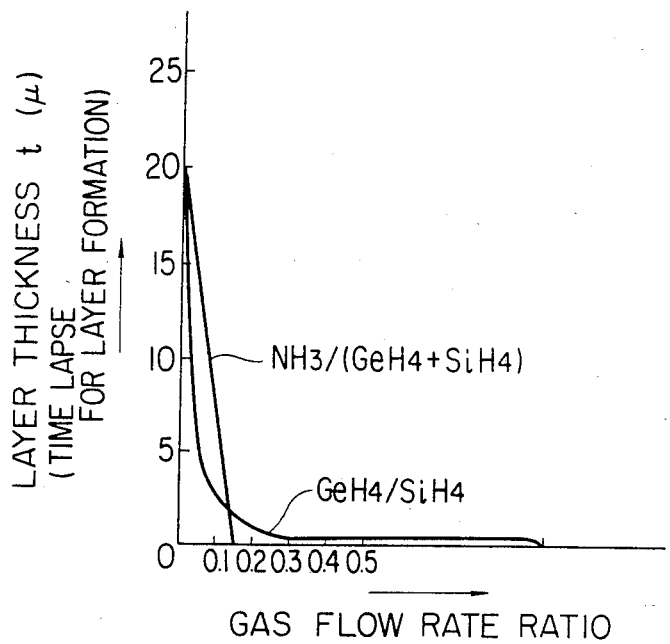

By the preparation device as shown in FIG. 12, layers were formed on an Al cylinder substrate by changing the gas flow rate ratio of GeH$_4$/He gas to SiH$_4$/He gas and that of NH$_3$ gas to SiH$_4$ gas along with the lapse of time for forming the layer under the condition of Table A-12 following the changing curve of the gas flow rate ratio as shown in FIG. 20, and thereby, an electrophotographic image forming member was produced.

The resulting image forming member was set in an experimental device for charging and exposure, and corona charging was effected at $\ominus 5.0$ kV for 0.3 second, followed immediately by irradiation of a light image from a tungsten lamp source at a dose of 2 lux.sec through a transmission type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus 5.0$ kV, there was obtained a clear image of high density excellent in resolution with good gradation reproducibility.

EXAMPLE 13

Each of electrophotographic image forming member was produced under the same conditions as in Example 1 except that, upon formation of a first layer, flow rate ratio of $NH_3$ to $(SiH_4+GeH_4)$ as shown in Table A-13 were used in place of the flow rate ratio in Example 1.

Using the resulting image forming members, image formation was effected on a transfer paper according to the same procedure and under the same conditions as in Example 1, whereby the results as shown in Table A-13 were obtained.

EXAMPLE 14

Each of electrophotographic image forming members was produced under the same conditions as in Example 1 except that the thickness of the first layer was changed as shown in Table A-14.

Using the resulting image forming members, image formation were effected on a transfer paper according to the same procedure and under the same conditions as in Example 1, whereby the results as shown in Table A-14 were obtained.

EXAMPLE 15

Toner images were formed under the same conditions for a toner image formation as in Example 1 except that electrostatic images were formed by using GaAs type semiconductor laser (10 mW) of 810 nm in place of a tungsten lamp used in Examples 1–10. The electrophotographic image forming members produced under the conditions of Examples 1–10 were evaluated as to quality of the transferred toner images. The images were clear images of high quality excellent in resolution with good gradation reproducibility.

The common layer forming conditions in Examples 1–15 of the present invention are as follows.
Substrate temperature:
  Layer containing germanium atom (Ge) . . . about 200° C.
Discharge frequency: 13.56 MHz
  Inner pressure in reaction chamber upon reaction . . . 0.3 Torr

EXAMPLE 16

Figure 21:
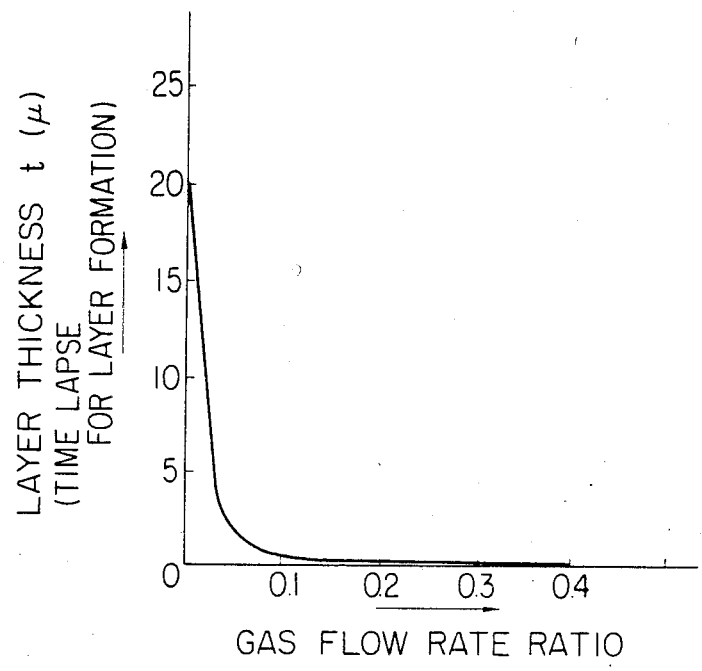

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table B-1 following the changing curve of the gas flow rate ratio as shown in FIG. 21, and thereby, an electrophotographic image forming member was produced.

The resulting image forming member was set in an experimental device for charging and exposure, and corona charging was effected at ⊕5.0 kV for 0.3 second, followed immediately by irradiation of a light image from a tungsten lamp source at a dose of 2 lux.sec through a transmissive type test chart.

Immediately thereafter, by cascading on the image forming member surface with ⊖ charged developer (containing toner and carrier), a good toner image was obtained on the image forming member surface. When the toner image on the image forming member was transferred to a transfer paper by corona charging at ⊕5.0 kV, there was obtained a clear image of high density excellent in resolution with good gradation reproducibility.

EXAMPLE 17

Figure 22:
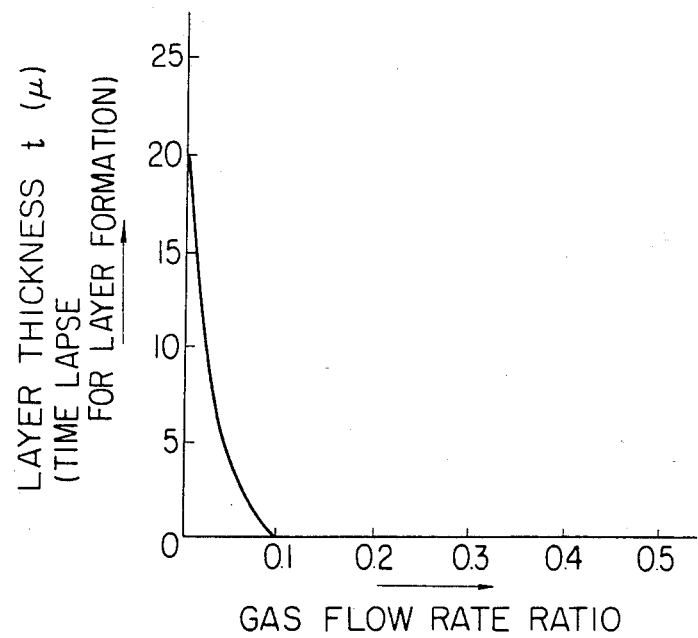

By the preparation device as shown in FIG. 12, layers were formed by changing the gas flow rate ratio of $GeH_4$/He gas to $SiH_4$/He gas along with the lapse of time for forming the layer under the condition of Table B-2 following the changing curve of the gas flow rate ratio as shown in FIG. 22. Other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 18

Figure 23:
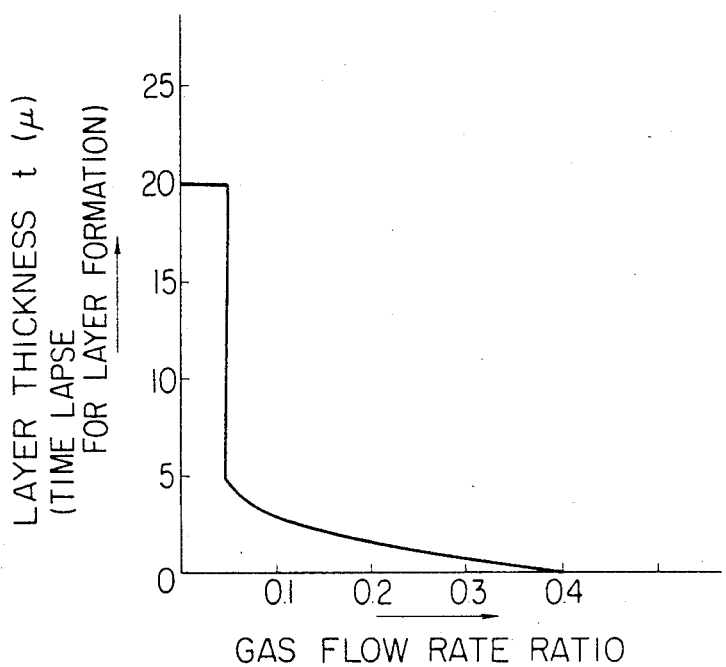

By the preparation device as shown in FIG. 12, layers were formed by changing the gas flow rate ratio of $GeH_4$/He gas to $SiH_4$/He gas along with the lapse of time for forming the layer under the condition of Table B-3 following the changing curve of the gas flow rate ratio as shown in FIG. 23. Other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 19

Figure 24:
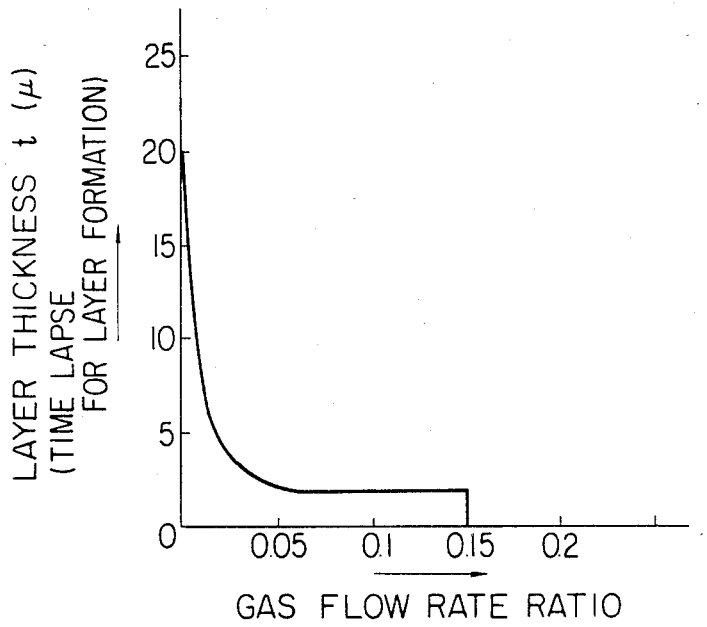

By the preparation device as shown in FIG. 12, layers were formed by changing the gas flow rate ratio of $GeH_4$/He gas to $SiH_4$/He gas along with the lapse of time for forming the layer under the condition of Table B-4 following the changing curve of the gas flow rate ratio as shown in FIG. 24. Other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 20

Figure 25:
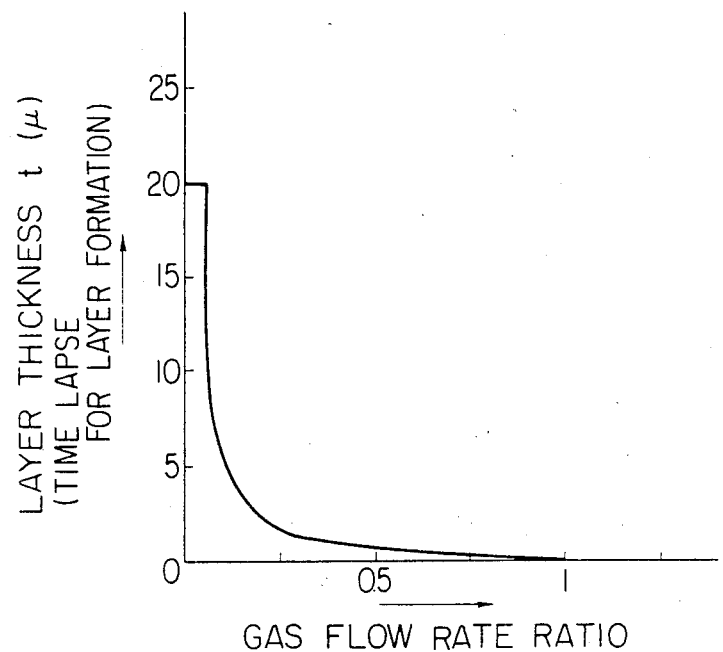

By the preparation device as shown in FIG. 12, layers were formed by changing the gas flow rate ratio of $GeH_4$/He gas to $SiH_4$/He gas along with the lapse of time for forming the layer under the condition of Table B-5 following the changing curve of the gas flow rate ratio as shown in FIG. 25. Other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 21

Figure 26:
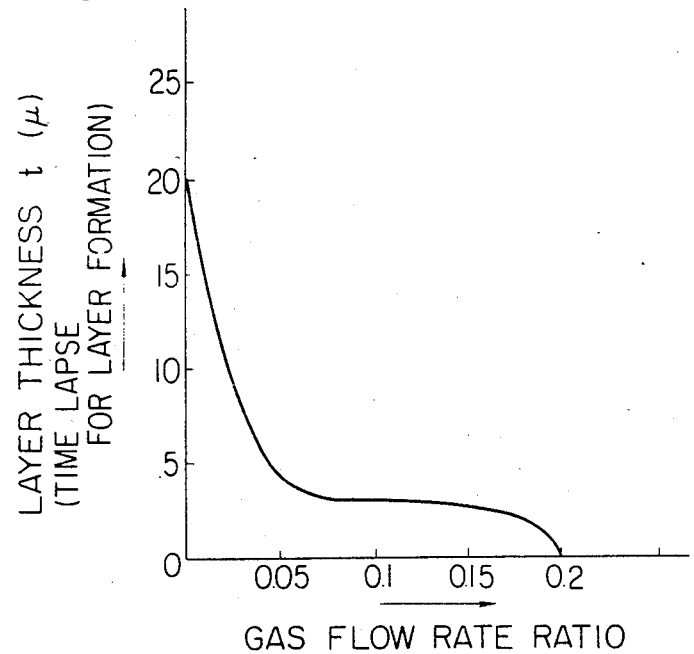

By the preparation device as shown in FIG. 12, layers were formed by changing the gas flow rate ratio of $GeH_4$/He gas to $SiH_4$/He gas along with the lapse of time for forming the layer under the condition of Table B-6 following the changing curve of the gas flow rate ratio as shown in FIG. 26. Other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 22

Figure 27:
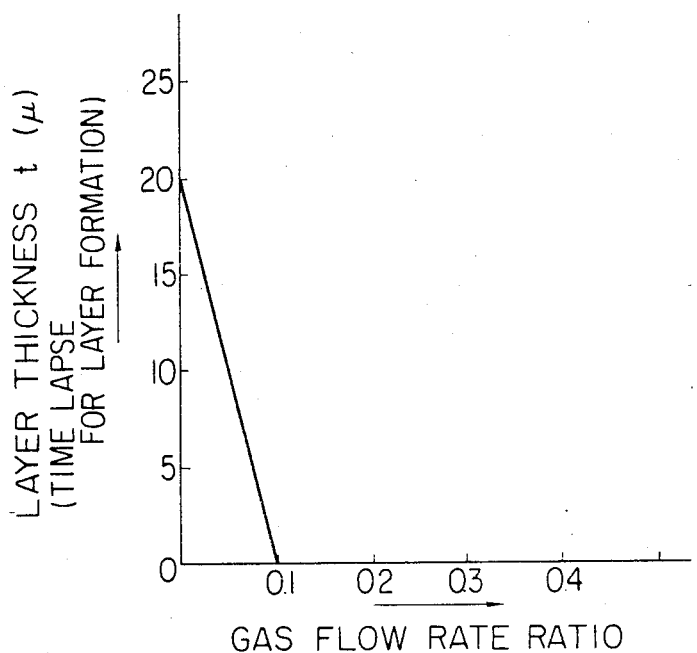

By the preparation device as shown in FIG. 12, layers were formed by changing the gas flow rate ratio of GeH$_4$/He gas to SiH$_4$/He gas along with the lapse of time for forming the layer under the condition of Table B-7 following the changing curve of the gas flow rate ratio as shown in FIG. 27. Other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 23

Layers were formed under the same conditions as Example 16 except that each conditions as shown in Table B-8 - Table B-10 were used in place of the condition of Table 1 used in Example 16. Thereby, electrophotographic image forming member (Sample No. 801–803) were produced.

Using each of the resulting image forming members, image formation was effected on a transfer paper according to the same procedure and under the same conditions as in Example 16, whereby a very clear image quality was obtained.

EXAMPLE 24

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table B-11 following the changing curve of the gas flow rate ratio as shown in FIG. 21, and thereby, an electrophotographic image forming member was produced.

The resulting image forming member was set in an experimental device for charging and exposure, and corona charging was effected at $\ominus$5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$5.0 kV, there was obtained a clear image of high density excellent in resolution with good gradation reproducibility.

EXAMPLE 25

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table B-12 following the changing curve of the gas flow rate ratio as shown in FIG. 21, and thereby, an electrophotographic image forming member was produced.

The resulting image forming member was set in an experimental device for charging and exposure, and corona charging was effected at $\ominus$5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$5.0 kV, there was obtained a clear image of high density excellent in resolution with good gradation reproducibility.

EXAMPLE 26

By the preparation device as shown in FIG. 12, layers were formed by changing the gas flow rate ratio of GeH$_4$/He gas to SiH$_4$/He gas along with the lapse of time for forming the layer under the condition of Table B-13 following the changing curve of the gas flow rate ratio as shown in FIG. 22. Other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 27

By the preparation device as shown in FIG. 12, layers were formed by changing the gas flow rate ratio of GeH$_4$/He gas to SiH$_4$/He gas and that of NH$_3$ gas to SiH$_4$/He gas along with the lapse of time for forming the layer under the condition of Table B-14 following the changing curve of the gas flow rate ratio as shown in FIG. 23. Other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 28

By the preparation device as shown in FIG. 12, layers were formed by changing the gas flow rate ratio of GeH$_4$/He gas to SiH$_4$/He gas and that of NH$_3$ gas to SiH$_4$/He gas along with the lapse of time for forming the layer under the condition of Table B-15 following the changing curve of the gas flow rate ratio as shown in FIG. 24. Other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 29

By the preparation device as shown in FIG. 12, layers were formed by changing the gas flow rate ratio of GeH$_4$/He gas to SiH$_4$/He gas along with the lapse of time for forming the layer under the condition of Table B-16 following the changing curve of the gas flow rate ratio as shown in FIG. 25. Other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 30

By the preparation device as shown in FIG. 12, layers were formed by changing the gas flow rare ratio of GeH$_4$/He gas to SiH$_4$/He gas along with the lapse of time for forming the layer under the condition of Table B-17 following the changing curve of the gas flow rate ratio as shown in FIG. 26. Other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 31

By the preparation device as shown in FIG. 12, layers were formed by changing the gas flow rate ratio of GeH$_4$/He gas to SiH$_4$/He gas along with the lapse of time for forming the layer under the condition of Table B-18 following the changing curve of the gas flow rate ratio as shown in FIG. 27. Other conditions were the same as in Example 25. Thereby, an electrophotographic image forming member was produced.

Using the resulting image forming member, image formation was effected on a transfer paper according to the same procedure and under the same conditions as in Example 25, whereby a very clear image quality was obtained.

EXAMPLE 32

Layers were formed under the same conditions as Example 25 except that each conditions as shown in Table B-19 - Table B-21 were used in place of the condition of Table B-12 used in Example 25. Thereby, an electrophotographic image forming member (Sample Nos. 1901–1903) were produced.

Using each of the resulting image forming members, image formation was effected on the transfer paper according to the same procedure and under the same conditions as in Example 25, whereby a very clear image quality was obtained.

EXAMPLE 33

By the perparation device as shown in FIG. 12, layers were formed on an A1 cylinder substrate by changing the gas flow rate ratio of GeH$_4$/He gas to SiH$_4$/He gas along with the lapse of time for forming the layer under the condition of Table B-22 following the changing curve of the gas flow rate ratio as shown in FIG. 21, and thereby, an electrophotographic image forming member was produced.

The resulting image forming member was set in an experimental device for charging and exposure, and corona charging was effected at $\oplus$5.0 kV for 0.3 second, followed immediately by irradiation of a light image from a tungsten lamp source at a dose of 2 lux.sec through a transmissive type test chart.

Immediately thereafter, by cascading on the image forming member surface with $\ominus$ charged developer (containing toner and carrier), a good toner image was obtained on the image forming member surface. When the toner image on the image forming member was transferred to a transfer paper by corona charging at $\oplus$5.0 kV, there was obtained a clear image of high density excellent in resolution with good gradation reproducibility.

EXAMPLE 34

Toner images were formed under the same conditions for a toner image formation as in Examples 16 and 25 except that electrostatic images were formed by using GaAs type semiconductor laser (10 mW) of 810 nm in place of a tungsten lamp used in Examples 16 and 25. The electrophotographic image forming member produced under the conditions of Examples 16 and 25 were evaluated as to quality of the transferred toner images. The images were clear images of high quality excellent in resolution with good gradation reproducibility.

The common layer forming conditions in Examples 16–34 of the present invention are as follows.
Substrate temperature:
  Layer containing germanium atom (Ge) . . . . . about 200° C.
Discharge frequency: 13.56 MHz
Inner pressure in reaction chamber upon reaction: 0.3 Torr

EXAMPLE 35

Figure 28:
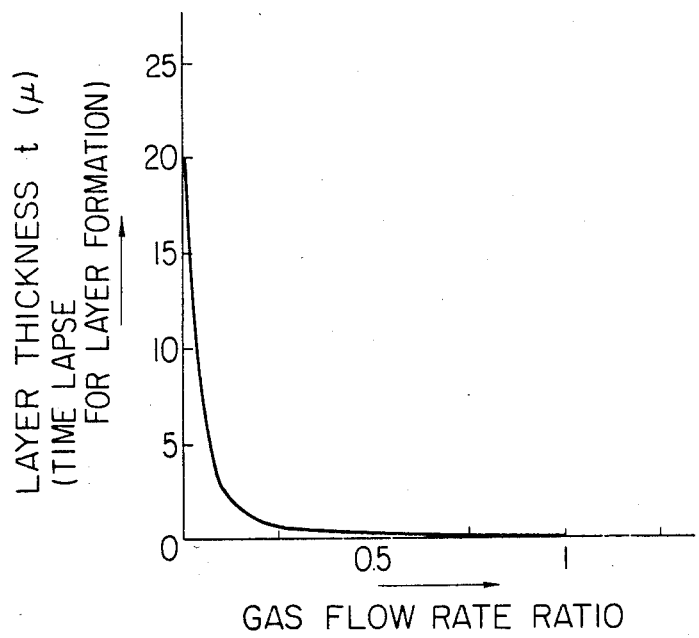

By the preparation device as shown in FIG. 12, layers were formed on an A1 cylinder substrate by changing the gas flow rate ratio of GeH$_4$/He gas to SiH$_4$/He gas along with the lapse of time for forming the layer under the condition of Table C-1 following the changing curve of the gas flow rate ratio as shown in FIG. 28, and thereby, an electrophotographic image forming member was produced.

The resulting image forming member was set in an experimental device for charging and exposure, and corona charging was effected at $\ominus$5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$5.0 kV, there was obtained a clear image of high density excellent in resolution with good gradation reproducibility.

EXAMPLE 36

Figure 29:
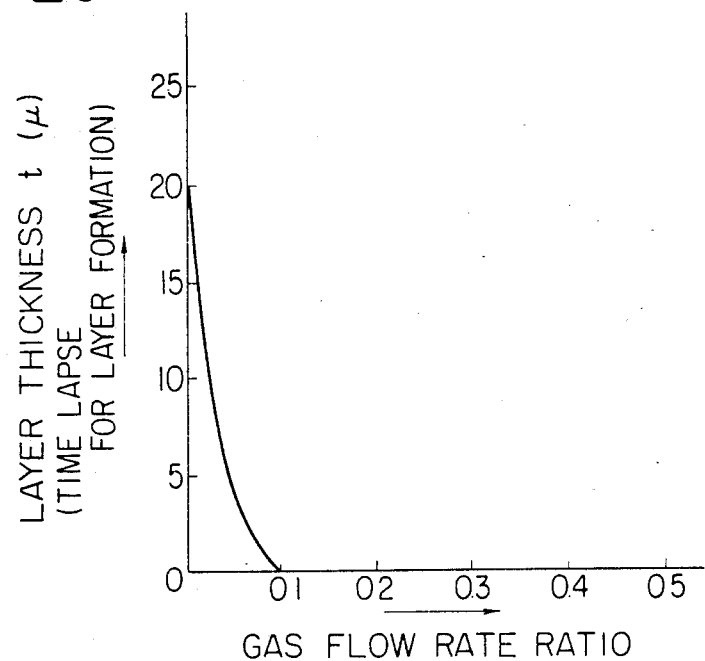

By the preparation device as shown in FIG. 12, layers were formed by changing the gas flow rate ratio of GeH$_4$/He gas to SiH$_4$/He gas along with the lapse of time for forming the layer under the condition of Table C-2 following the changing curve of the gas flow rate ratio as shown in FIG. 29. Other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 37

Figure 30:
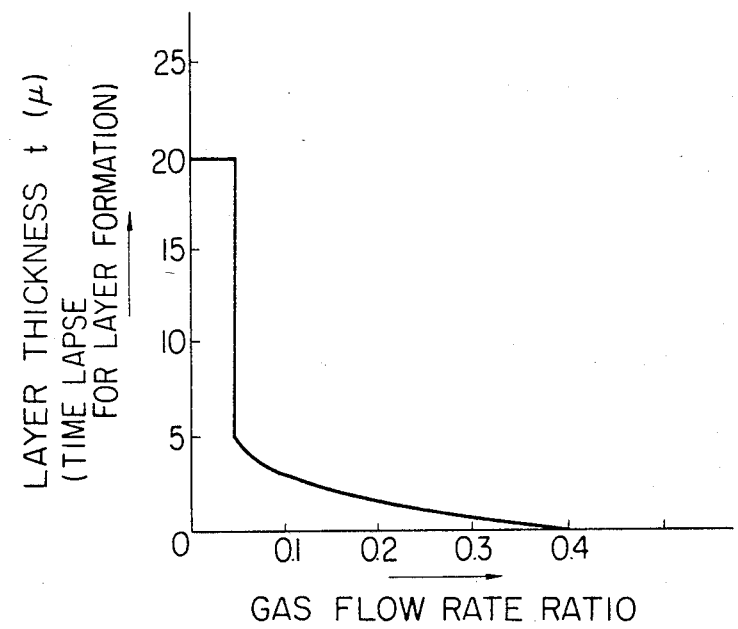

By the preparation device as shown in FIG. 12, layers were formed by changing the gas flow rate ratio of GeH$_4$/He gas to SiH$_4$/He gas along with the lapse of time for forming the layer under the condition of Table C-3 following the changing curve of the gas flow rate ratio as shown in FIG. 30. Other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 38

Figure 31:
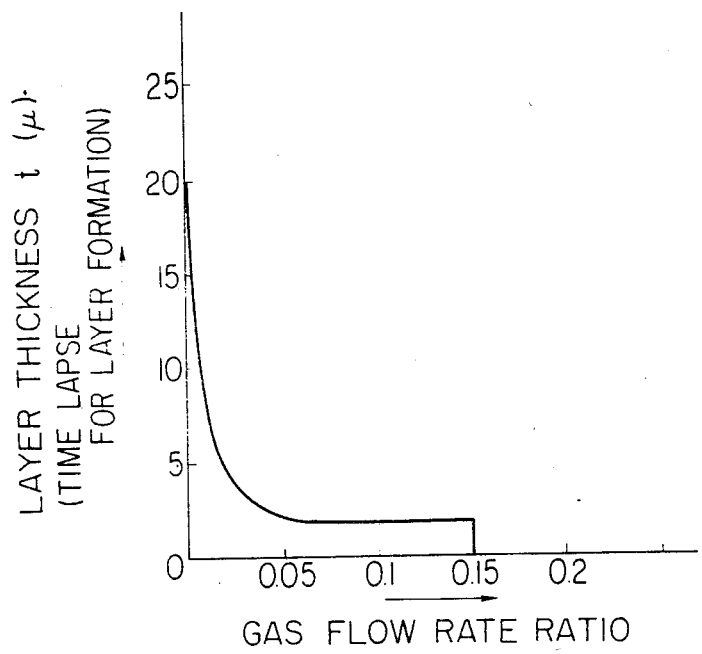

By the preparation device as shown in FIG. 12, layers were formed by changing the gas flow rate ratio of GeH$_4$/He gas to SiH$_4$/He gas along with the lapse of time for forming the layer under the condition of Table C-4 following the changing curve of the gas flow rate ratio as shown in FIG. 31. Other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 39

Figure 32:
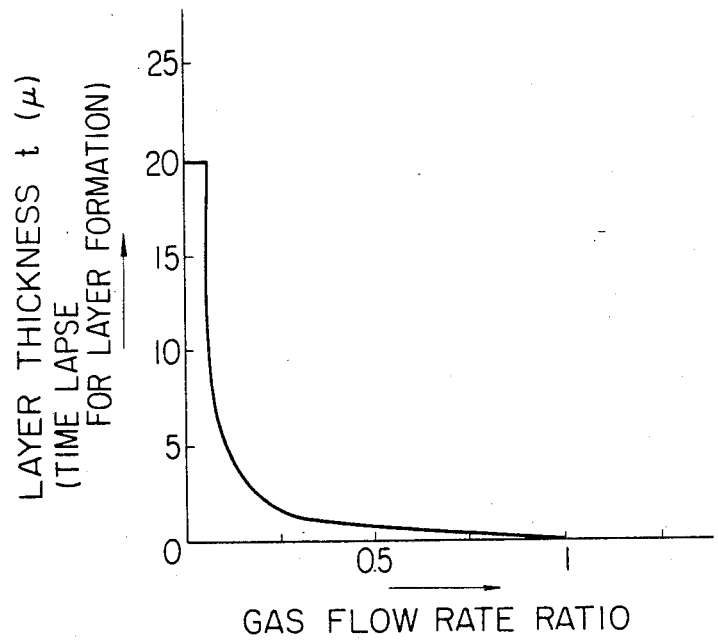

By the preparation device as shown in FIG. 12, layers were formed by changing the gas flow rate ratio of GeH$_4$/He gas to SiH$_4$/He gas along with the lapse of time for forming the layer under the condition of Table C-5 following the changing curve of the gas flow rate ratio as shown in FIG. 32. Other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 40

Figure 33:
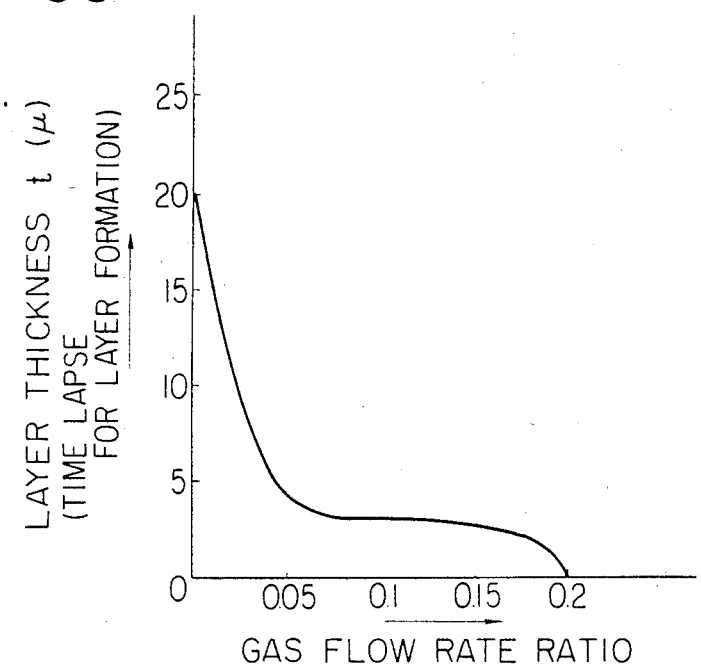

By the preparation device as shown in FIG. 12, layers were formed by changing the gas flow rate ratio of GeH$_4$/He gas to SiH$_4$/He gas along with the lapse of time for forming the layer under the condition of Table C-6 following the changing curve of the gas flow rate ratio as shown in FIG. 33. Other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 41

Figure 34:
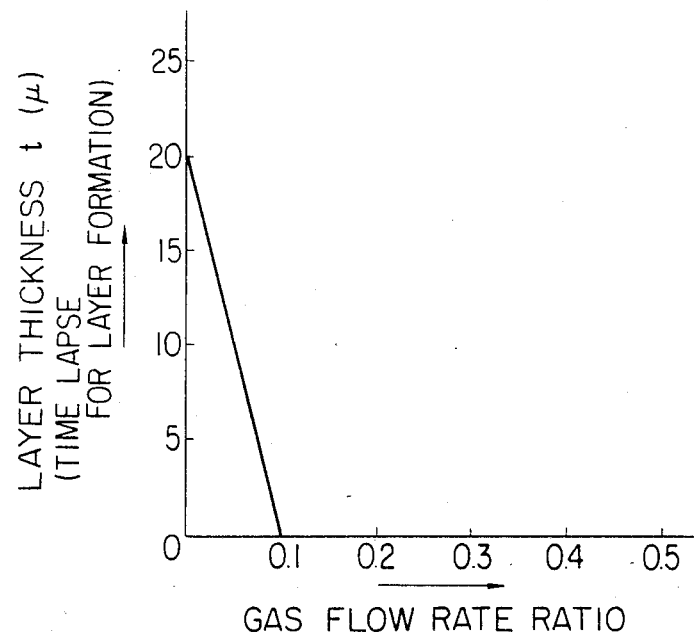

By the preparation device as shown in FIG. 12, layers were formed by changing the gas flow rate ratio of GeH$_4$/He gas to SiH$_4$/He gas along with the lapse of time for forming the layer under the condition of Table C-7 following the changing curve of the gas flow rate ratio as shown in FIG. 34. Other conditions were the same as in Example 35. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 42

Layers were formed under the same conditions as Example 35 except that Si$_2$H$_6$/He gas was used in place of SiH$_4$/He gas used in Example 35 and that the operating condition was changed to that as shown in Table C-8. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 43

Layers were formed under the same conditions as Example 35 except that SiF$_4$/He gas was used in place of SiH$_4$/He gas used in Example 35 and that the operating conditions was changed to that as shown in Table C-9. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 44

Layers were formed under the same conditions as Example 35 except that (SiH$_4$/He+SiF$_4$/He) gas was used in place of SiH$_4$/He gas used in Example 35 and that the operating condition was changed to that as shown in Table C-10. Thereby, an electrophotographic image forming member was produced.

Using the resulting image forming member, image formation was effected on a transfer paper according to the same procedure and under the same conditions as in Example 35, whereby a very clear image quality was obtained.

EXAMPLE 45

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table C-11 following the changing curve of the gas flow rate ratio as shown in FIG. 28, and thereby, an electrophotographic image forming member was produced.

The resulting image forming member was set in an experimental device for charging and exposure, and corona charging was effected at $\ominus 5.0$ kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at ⊖5.0 kV, there was obtained a clear image of high density excellent in resolution with good gradation reproducibility.

EXAMPLE 46

Figure 35:
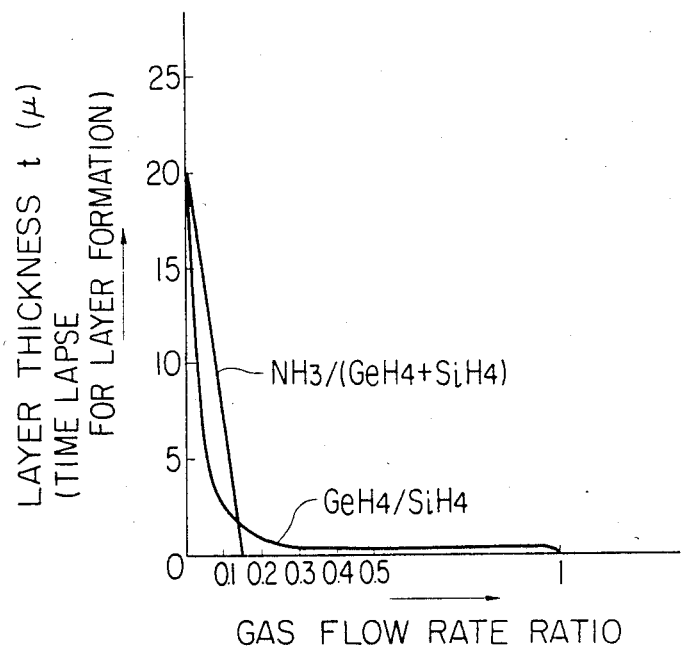

By the preparation device as shown in FIG. 12, layers were formed on an Al cylinder substrate by changing the gas flow rate ratio of $GeH_4$/He gas to $SiH_4$/He gas and that of $NH_3$ gas to $SiH_4$/He gas along with the lapse of time for forming the layer under the condition of Table C-12 following the changing curve of the gas flow rate ratio as shown in FIG. 35, and thereby, an electrophotographic image forming member was produced.

The resulting image forming member was set in an experimental device for charging and exposure, and corona charging was effected at ⊖5.0 kV for 0.3 second, followed immediately by irradiation of a light image from a tungsten lamp source at a dose of 2 lux.sec through a transmissive type test chart.

Immediately thereafter, by cascading on the image forming member surface with ⊕ charged developer (containing toner and carrier), a good toner image was obtained on the image forming member surface When the toner image on the image forming member was transferred to a transfer paper by corona charging at ⊖5.0 kV, there was obtained a clear image of high density excellent in resolution with good gradation reproducibility.

EXAMPLE 47

Electrophotographic image forming members were produced under the same conditions as in Example 35 except that, upon formation of a first layer, flow rate ratio of $NH_3$ to ($SiH_4+GeH_4$) as shown in Table C-13 were used in place of the flow rate ratio in Example 35.

Using the resulting image forming members, image formation was effected on a transfer paper according to the same procedure and under the same conditions as in Example 35, whereby the results as shown in Table C-13 were obtained.

EXAMPLE 48

Electrophotographic image forming members were produced under the same condition as in Example 35 except that the thickness of the first layer was changed as shown in Table C-14.

Using the resulting image forming members, image formations were effected on a transfer paper according to the same procedure and under the same conditions as in Example 35, whereby the results as shown in Table C-14 were obtained.

EXAMPLE 49

Toner images were formed under the same conditions for a toner image formation as in Example 35 except that electrostatic images were formed by using GaAs type semiconductor laser (10 mW) of 810 nm in place of a tungsten lamp used in Examples 35–44. The electrophotographic image forming members produced under the conditions of Example 35–44 were evaluated as to quality of the transferred toner images. The images were clear images of high quality excellent in resolution with good gradation reproducibility.

EXAMPLE 50

Electrophotographic image forming members (Sample Nos 12-401 - 12-408, 12-701 - 12-708 and 12-801 - 12-808; 24 samples) were produced under the same conditions and according to the same procedure as in Example 35 except that the condition for formation of layer (II) were changed to those as shown in Table C-15.

The resulting electrophotographic image forming members were set individually in a reproduction device and then evaluated for the overall image quality and durability for repetition of copying under the same conditions as in the Example.

Whereby the results as shown in Table C-16 were obtained.

EXAMPLE 51

Each of image forming members was produced according to the same procedure as in Example 35 except that, upon formation of layer (II), the target area ratio of a silicon wafer to graphite was changed and the content ratio of silicon atom to carbon atom in the layer (II) was changed. The resulting image forming members were evaluated for the image quality after about 50,000 repetitions of image formation, development and cleaning as described in Example 35. Whereby the results as shown in Table C-17 were obtained.

EXAMPLE 52

Each of image forming members was produced according to the same procedure as in Example 35 except that, upon formation of layer (II), the flow rate ratio of $SiH_4$ gas to $C_2H_4$ gas was changed and the content ratio of silicon atom to carbon atom in the layer (II) was changed. The resulting image forming members were evaluated for the image quality after about 50,000 repetitions of process up to a transfer as described in Example 35. Whereby the results as shown in Table C-18 were obtained.

EXAMPLE 53

Each of image forming members was produced according to the same procedure as in Example 35 except that, upon formation of layer (II), the flow rate ratio of $SiH_4$ gas:$SiF_4$ gas:$C_2H_4$ gas was changed and the content ratio of silicon atom to carbon atom in the layer (II) was changed. The resulting image forming members were evaluated for the image quality after about 50,000 repetitions of image formation, development and cleaning as described in Example 35. Whereby the results as shown in Table C-19 were obtained.

EXAMPLE 54

Each of image forming members was produced according to the same procedure as in Example 35 except that the layer thickness of layer (II) was changed. Image formation, development and cleaning as described in Example 35 were repeated. Whereby the results as shown in Table C-20 were obtained.

The common layer forming conditions in Examples 35–54 of the present invention are as follows.
Substrate temperature:
  Layer containing germanium atom (Ge) . . . about 200° C.
  Layer not containing germanium atom (Ge) . . . about 250° C.
Discharge frequency: 13.56 MHz Inner pressure in reaction chamber upon reaction: 0.3 Torr

EXAMPLE 55

Figure 36:
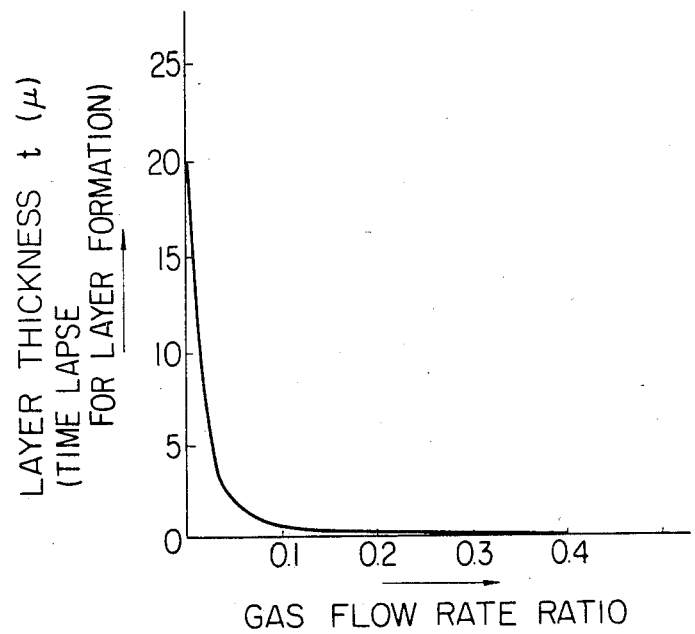

By the preparation device as shown in FIG. 12, layers were formed on an Al cylinder substrate by changing the gas flow rate ratio of $GeH_4/He$ gas to $SiH_4/He$ gas along with the lapse of time for forming the layer under the condition of Table D-1 following the changing curve of the gas flow rate ratio as shown in FIG. 36, and thereby, an electrophotographic image forming member was produced.

The resulting image forming member was set in an experimental device for charging and exposure, and corona charging was effected at $\oplus 5.0$ kV for 0.3 second, followed immediately by irradiation of a light image from a tungsten lamp source at a dose of 2 lux.sec through a transmissive type test chart.

Immediately thereafter, by cascading on the image forming member surface with $\ominus$ charged developer (containing toner and carrier), a good toner image was obtained on the image forming member surface. When the toner image on the image forming member was transferred to a transfer paper by corona charging at $\oplus 5.0$ kV, there was obtained a clear image of high density excellent in resolution with good gradation reproducibility.

EXAMPLE 56

Figure 37:
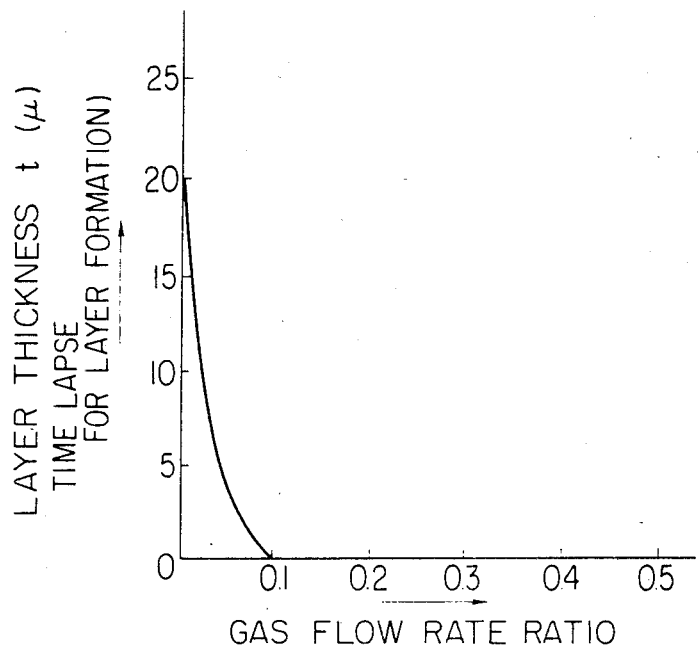

By the preparation device as shown in FIG. 12, layers were formed by changing the gas flow rate ratio of $GeH_4/He$ gas to $SiH_4/He$ gas along with the lapse of time for forming the layer under the condition of Table D-2 following the changing curve of the gas flow rate ratio as shown in FIG. 37. Other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 57

Figure 38:
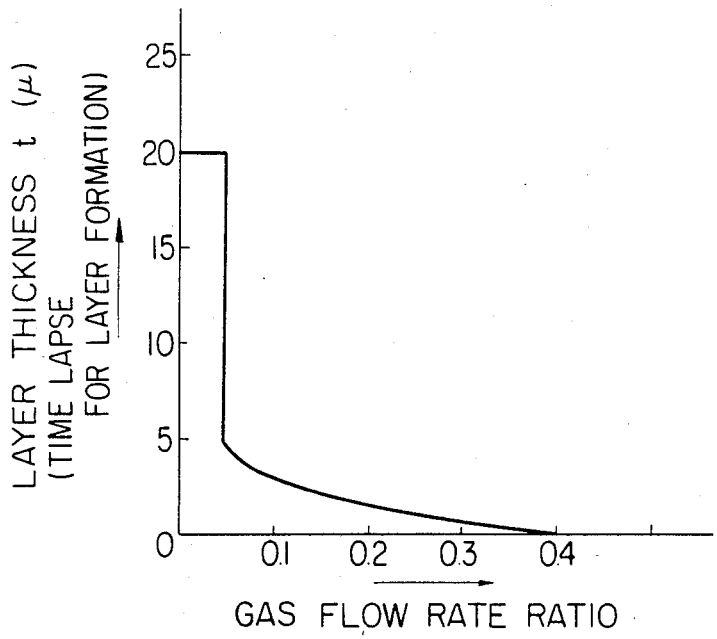

By the preparation device as shown in FIG. 12, layers were formed by changing the gas flow rate ratio of $GeH_4/He$ gas to $SiH_4/He$ gas along with the lapse of time for forming the layer under the condition of Table D-3 following the changing curve of the gas flow rate ratio as shown in FIG. 38. Other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 58

Figure 39:
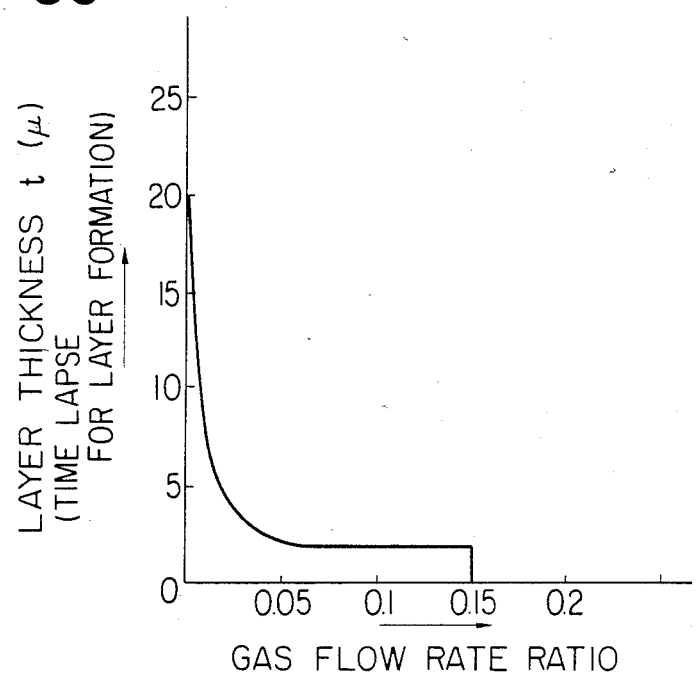

By the preparation device as shown in FIG. 12, layers were formed by changing the gas flow rate ratio of $GeH_4/He$ gas to $SiH_4/He$ gas along with the lapse of time for forming the layer under the condition of Table D-4 following the changing curve of the gas flow rate ratio as shown in FIG. 39. Other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 59

Figure 40:
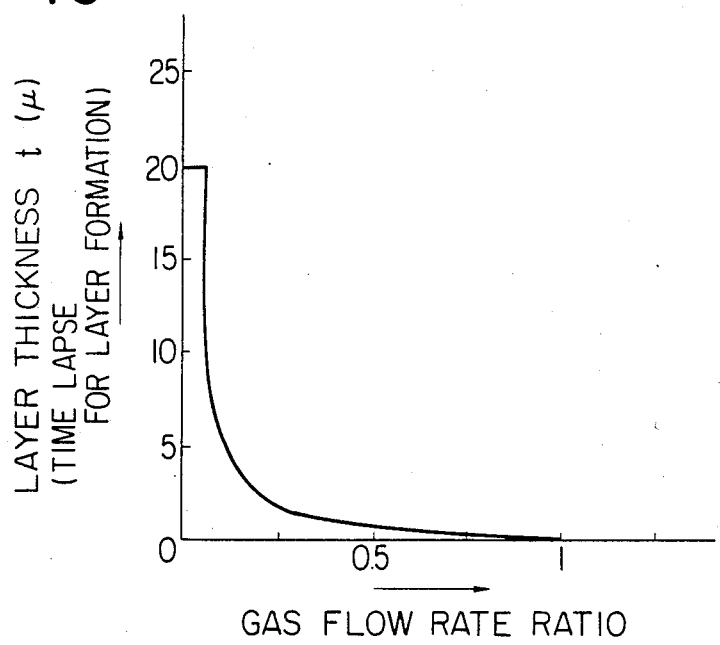

By the preparation device as shown in FIG. 12, layers were formed by changing the gas flow rate ratio of $GeH_4/He$ gas to $SiH_4/He$ gas along with the lapse of time for forming the layer under the condition of Table D-5 following the changing curve of the gas flow rate ratio as shown in FIG. 40. Other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 60

Figure 41:
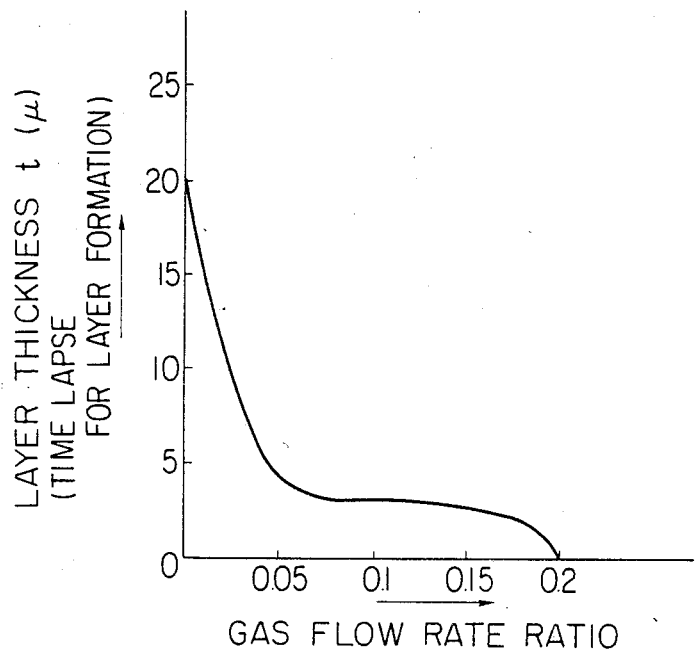

By the preparation device as shown in FIG. 12, layers were formed by changing the gas flow rate ratio of $GeH_4/He$ gas to $SiH_4/He$ gas along with the lapse of time for forming the layer under the condition of Table D-6 following the changing curve of the gas flow rate ratio as shown in FIG. 41. Other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 61

Figure 42:
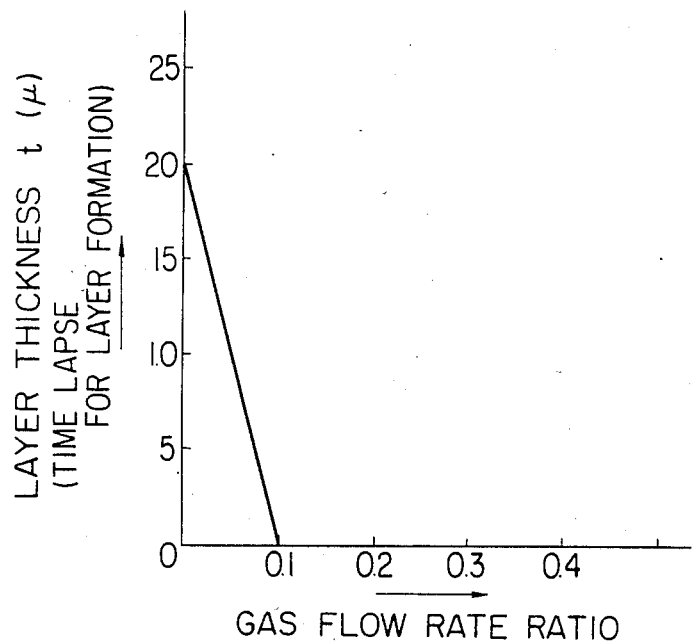

By the preparation device as shown in FIG. 12, layers were formed by changing the gas flow rate ratio of $GeH_4/He$ gas to $SiH_4/He$ gas along with the lapse of time for forming the layer under the condition of Table D-7 following the changing curve of the gas flow rate ratio as shown in FIG. 42. Other conditions were the same as in Example 55. Thereby, an electrophotographic image forming member was produced.

Using the resulting image forming member, image formation was effected on a transfer paper according to the same procedure and under the same conditions as in Example 55, whereby a very clear image quality was obtained.

EXAMPLE 62

Layers were formed under the same conditions as Example 55 except that each conditions as shown in Table D-8 - Table D-10 were used in place of the condition of Table D-1 used in Example 55. Thereby, electrophotographic image forming members (Sample Nos. 801-803) were produced.

Using each of the resulting image forming members, image formation was effected on a transfer paper according to the same procedure and under the same conditions as in Example 55, whereby a very clear image quality was obtained.

EXAMPLE 63

By the preparation device as shown in FIG. 12, layers were formed on an Al cylinder substrate by changing the gas flow rate ratio of $GeH_4/He$ gas to $SiH_4/He$ gas along with the lapse of time for forming the layer under the condition of Table D-11 following the changing curve of the gas flow rate ratio as shown in FIG. 36, and thereby, an electrophotographic image forming member was produced.

The resulting image forming member was set in an experimental device for charging and exposure, and corona charging was effected at ⊖5.0 kV for 0.3 second, followed immediately by irradiation of a light image from a tungsten lamp source at a dose of 2 lux.sec through a transmissive type test chart.

Immediately thereafter, by cascading on the image forming member surface with ⊕ charged developer (containing toner and carrier), a good tomer image was obtained on the image forming member surface. When the toner image on the image forming member was transferred to a transfer paper by corona charging at ⊖5.0 kV, there was obtained a clear image of high density excellent in resolution with good gradation reproducibility.

EXAMPLE 64

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table D-12 following the changing curve of the gas flow rate ratio as shown in FIG. 36, and thereby, an electrophotographic image forming member was produced.

The resulting image forming member was set in an experimental device for charging and exposure and corona charging was effected at ⊖5.0 kV for 0.3 second, followed immediately by irradiation of a light image from a tungsten lamp source at a dose of 2 lux.sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖5.0 kV, there was obtained a clear image of high density excellent in resolution with good gradation reproducibility.

EXAMPLE 65

By the preparation device as shown in FIG. 12, layers were formed by changing the gas flow rate ratio of GeH$_4$/He gas to SiH$_4$/He gas along with the lapse of time for forming the layer under the condition of Table D-13 following the changing curve of the gas flow rate ratio as shown in FIG. 37. Other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 66

By the preparation device as shown in FIG. 12, layers were formed by changing the gas flor rate ratio of GeH$_4$/He gas to SiH$_4$/He gas and that of NO gas to SiH$_4$/He gas along with the lapse of time for forming the layer under the condition of Table D-14 following the changing curve of the gas flow rate ratio as shown in FIG. 38. Other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 67

By the preparation device as shown in FIG. 12, layers were formed by changing the gas flow rate ratio of GeH$_4$/He gas to SiH$_4$/He gas and that of NO gas to SiH$_4$/He gas along with the lapse of time for forming the layer under the condition of Table D-15 following the changing curve of the gas flow rate ratio as shown in FIG. 39. Other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 68

By the preparation device as shown in FIG. 12, layers were formed by changing the gas flow rate ratio of GeH$_4$/He gas to SiH$_4$/He gas along with the lapse of time for forming the layer under the condition of Table D-16 following the changing curve of the gas flow rate ratio as shown in FIG. 40. Other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 69

By the preparation device as shown in FIG. 12, layers were formed by changing the gas flow rate ratio of GeH$_4$/He gas to SiH$_4$/He gas along with the lapse of time for forming the layer under the condition of Table D-17 following the changing curve of the gas flow rate ratio as shown in FIG. 41. Other conditions were the same as in Example 64. Thereby, an electrophotographic image forming member was produced.

Using the resulting image forming member, image formation was effected on a transfer paper according to the same procedure and under the same conditions as in Example 64, whereby a very clear image quality was obtained.

EXAMPLE 70

By the preparation device as shown in FIG. 12, layers were formed by changing the gas flow rate ratio of GeH$_4$/He gas to SiH$_4$/He gas along with the lapse of time for forming the layer under the condition of Table D-18 following the changing curve of the gas flow rate ratio as shown in FIG. 42. Other conditions were the same as in Example 64. Thereby, an electrophotographic image forming member was produced.

Using the resulting image forming member, image formation was effected on a transfer paper according to the same procedure and under the same conditions as in

EXAMPLE 71

Layers were formed under the same conditions as Example 64 except that each conditions as shown in Table D-19 - Table D-21 were used in place of the condition of Table D-12 used in Example 64. Thereby, an electrophotographic image forming members (Sample Nos. 1901–1903) were produced.

Using each of the resulting image forming member, image formation was effected on the transfer paper according to the same procedure and under the same conditions as in Example 64, whereby a very clear image quality was obtained.

EXAMPLE 72

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table D-22 following the changing curve of the gas flow rate ratio as shown in FIG. 36, and thereby, an electrophotographic image forming member was produced.

The resulting image forming member was set in an experimental device for charging and exposure, and corona charging was effected at ⊕ 5.0 kV for 0.3 second, followed immediately by irradiation of a light image from a tungsten lamp source at a dose of 2 lux.sec through a transmissive type test chart.

Immediately thereafter, by cascading on the image forming member surface with ⊖ charged developer (containing toner and carrier), a good toner image was obtained on the image forming member surface. When the toner image on the image forming member was transferred to a transfer paper by corona charging at ⊕ 5.0 kV, there was obtained a clear image of high density excellent in resolution with good gradation reproducibility.

EXAMPLE 73

Toner images were formed under the same conditions for a toner image formation as in Examples 55 and 64 except that electrostatic images were formed by using GaAs type semiconductor laser (10 mW) of 810 nm in place of a tungsten lamp used in Examples 55 and 64. The electrophotographic image forming members produced under the conditions of Examples 55 and 64 were evaluated as to quality of the transferred toner images. The images were clear images of high quality excellent in resolution with good gradation reproducibility.

EXAMPLE 74

Electrophotographic image forming member (Sample Nos. 12-401–12-408, 12-701–12-708 and 12-801 –12-808; 24 samples) were produced under the same conditions and according to the same procedure as each of Examples and under the conditions as shown in Table D-11 in Example 63, Table D-12 in Example 64 and Table D-22 in Example 72 except that the conditions for formation of layer (II) were changed to those as shown in Table D-23.

The resulting electrophotographic image forming member were set individually in a reproduction device and then evaluated for the overall image quality and durability for repetition of copying under the same conditions as in the Example.

Whereby the results as shown in Table D-24 were obtained.

EXAMPLE 75

Each of image forming members was produced according to the same procedure as in Example 55 except that, upon formation of layer (II), the target area ratio of a silicon wafer to graphite was changed and the content ratio of silicon atom to carbon atom in the layer (II) was changed. The resulting image forming members were evaluated for the image quality after about 50,000 repetitions of image formation, development and cleaning as described in Example 55. Whereby the results as shown in Table D-25 were obtained.

EXAMPLE 76

Each of image forming members was produced according to the same procedure as in Example 55 except that, upon formation of layer (II), the flow rate ratio of $SiH_4$ gas to $C_2H_4$ gas was changed and the content ratio of silicon atom to carbon atom in the layer (II) was changed. The resulting image forming members were evaluated for the image quality after about 50,000 repetitions of process up to a transfer as described in Example 55. Whereby the results as shown in Table D-26 were obtained.

EXAMPLE 77

Each of image forming members was produced according to the same procedure as in Example 55 except that, upon formation of layer (II), the flow rate ratio of $SiH_4$ gas:$SiF_4$ gas:$C_2H_4$ gas was changed and the content ratio of silicon atom to carbon atom in the layer (II) was changed. The resulting image forming members were evaluated for the image quality after about 50,000 repetitions of image formation, development and cleaning as described in Example 55. Whereby the results as shown in Table D-27 were obtained.

EXAMPLE 78

Each of image forming members was produced according to the same procedure as in Example 55 except that the layer thickness of layer (II) was changed. Image formation, development and cleaning as described in Example 55 were repeated. Whereby the results as shown in Table D-28 were obtained.

The common layer forming conditions in Examples 55–78 of the present invention as as follows.
Substrate temperature:
  Layer containing germanium atom (Ge) . . . about 200° C.
  Layer not containing germanium atom (Ge) . . . about 250° C.
Discharge frequency: 13.56 MHz
Inner pressure in reaction chamber upon reaction: 0.3 Torr

EXAMPLE 79

Figure 43:
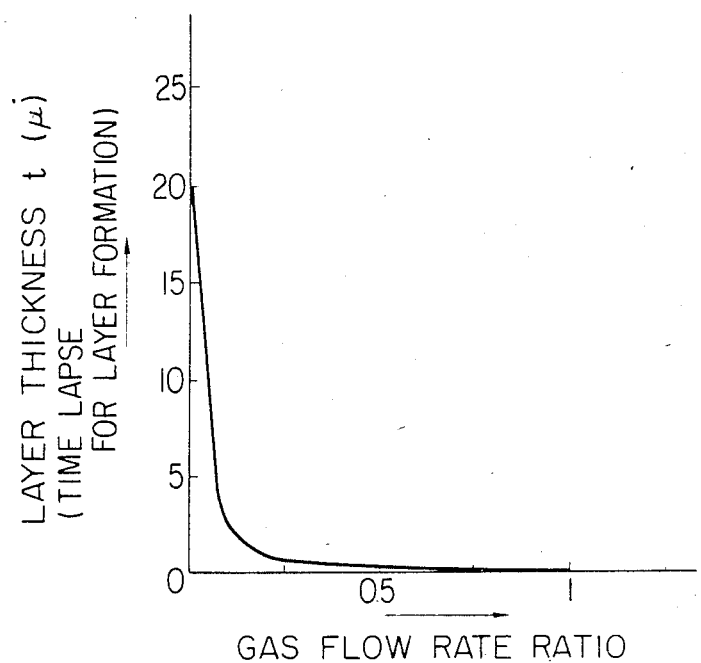

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table E-1 following the changing curve of the gas flow rate ratio as shown in FIG. 43, and thereby, an electrophotographic image forming member was produced.

The resulting image forming member was set in an experimental device for charging and exposure, and corona charging was effected at ⊖ 5.0 kV for 0.3 second, followed immediately by irradiation of a light image from a tungsten lamp source at a dose of 2 lux.sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖ 5.0 KV, there was obtained a clear image of high density excellent in resolution with good gradation reproducibility.

EXAMPLE 80

Figure 44:
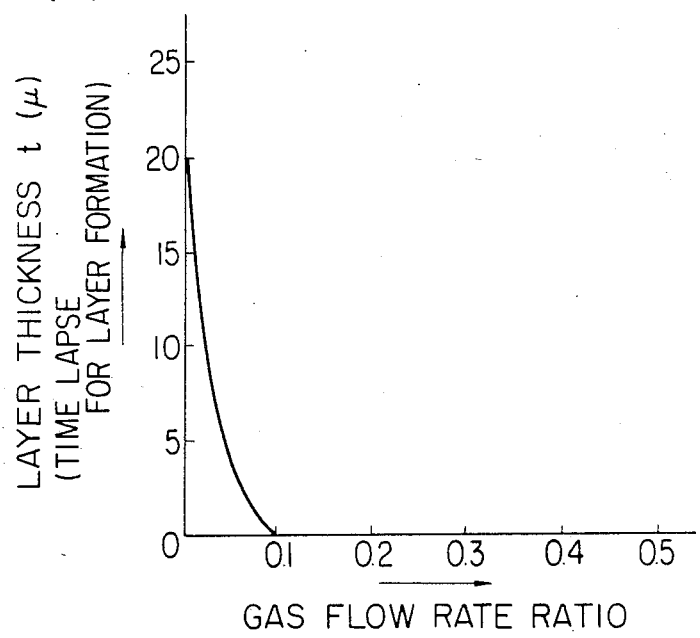

By the preparation device as shown in FIG. 12, layers were formed by changing the gas flow rate ratio of GeH$_4$/He gas to SiH$_4$/He gas along with the lapse of time for forming the layer under the condition of Table E-2 following the changing curve of the gas flow rate ratio as shown in FIG. 44. Other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 81

Figure 45:
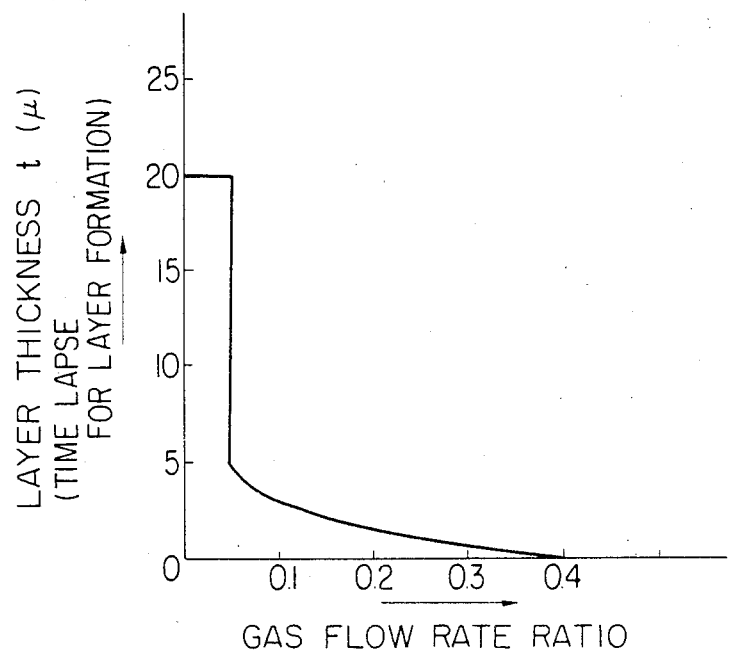

By the preparation device as shown in FIG. 12, layers were formed by changing the gas flow rate ratio of GeH$_4$/He gas to SiH$_4$/He gas along with the lapse of time for forming the layer under the condition of Table E-3 following the changing curve of the gas flow rate ratio as shown in FIG. 45. Other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 82

Figure 46:
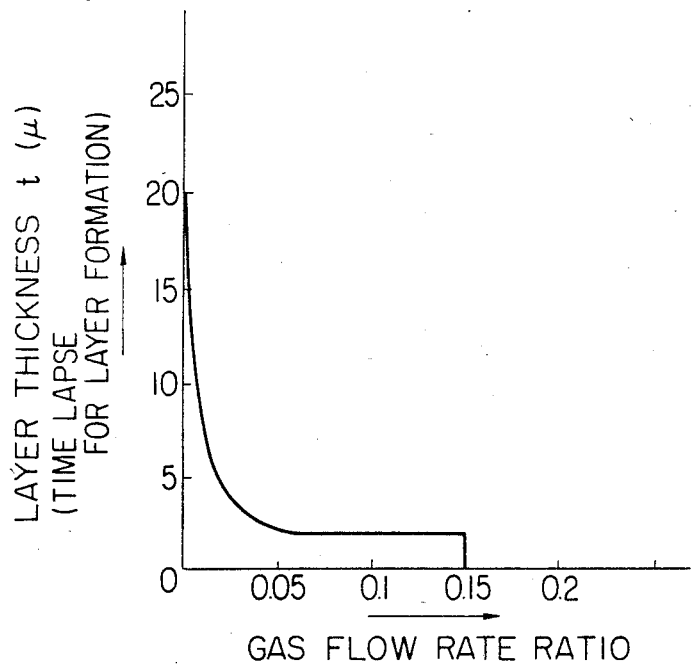

By the preparation device as shown in FIG. 12, layers were formed by changing the gas flow rate ratio of GeH$_4$/He gas to SiH$_4$/He gas along with the lapse of time for forming the layer under the condition of Table E-4 following the changing curve of the gas flow rate ratio as shown in FIG. 46. Other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 83

Figure 47:
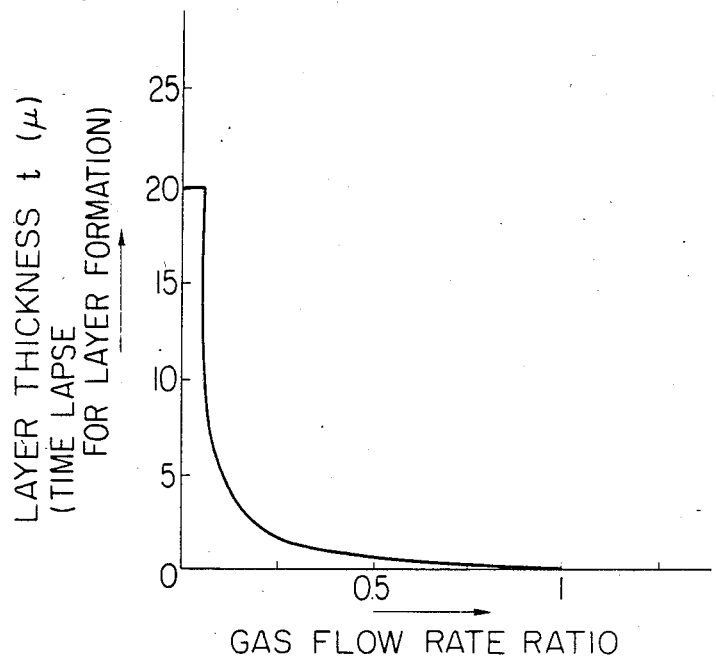

By the preparation device as shown in FIG. 12, layers were formed by changing the gas flow rate ratio of GeH$_4$/He gas to SiH$_4$/He gas along with the lapse of time for forming the layer under the condition of Table E-5 following the changing curve of the gas flow rate ratio as shown in FIG. 47. Other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 84

Figure 48:
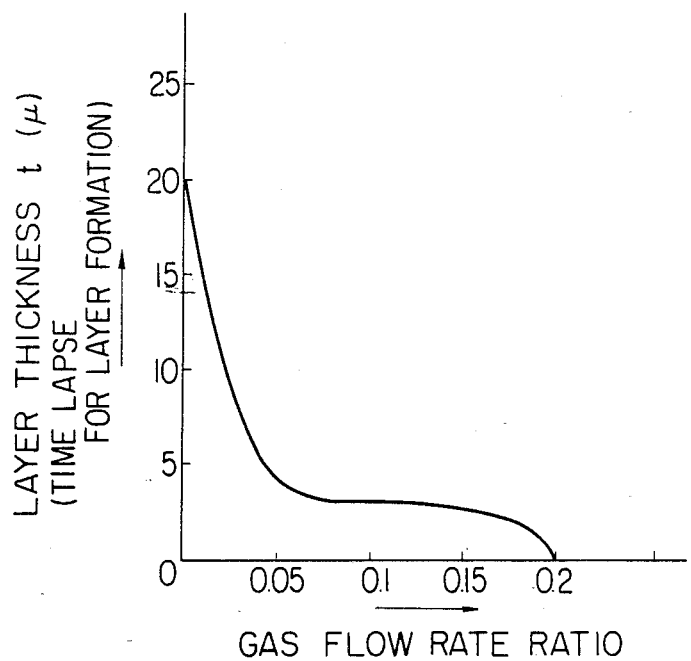

By the preparation device as shown in FIG. 12, layers were formed by changing the gas flow rate ratio of GeH$_4$/He gas to SiH$_4$/He gas along with the lapse of time for forming the layer under the condition of Table E-6 following the changing curve of the gas flow rate ratio as shown in FIG. 48. Other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 85

Figure 49:
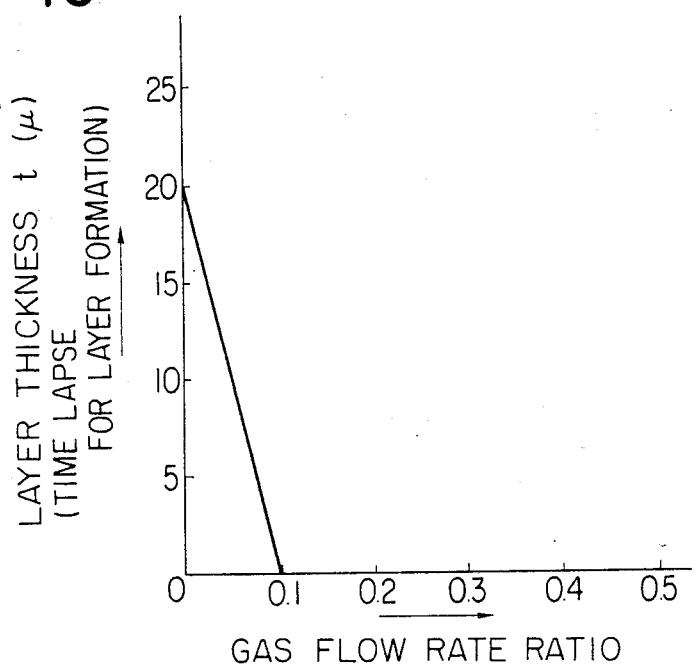

By the preparation device as shown in FIG. 12, layers were formed by changing the gas flow rate ratio of GeH$_4$/He gas to SiH$_4$/He gas along with the lapse of time for forming the layer under the condition of Table E-7 following the changing curve of the gas flow rate ratio as shown in FIG. 49. Other conditions were the same as in Example 79. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 86

Layers were formed under the same conditions as Example 79 except that Si$_2$H$_6$/He gas was used in place of SiH$_4$/He gas used in Example 79 and that the operating condition was changed to that as shown in Table E-8. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 87

Layers were formed under the same conditions as Example 79 except that SiF$_4$/He gas was used in place of SiH$_4$/He gas used in Example 79 and that the operating condition was changed to that as shown in Table E-9. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 88

Layers were formed under the same conditions as Example 79 except that (SiH$_4$/He+SiF$_4$/He) gas was used in place of SiH$_4$/He gas used in Example 79 and that the operating condition was changed to that as shown in Table E-10. Thereby, an electrophotographic image forming member was produced.

Using the resulting image forming member, image formation was effected on a transfer paper according to the same procedure and under the same conditions as in Example 79, whereby a very clear image quality was obtained.

EXAMPLE 89

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table E-11 following the changing curve of the gas flow rate ratio as shown in FIG. 43, and thereby, an electrophotographic image forming member was produced.

The resulting image forming member was set in an experimental device for charging and exposure, and corona charging eas effected at $\ominus$ 5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 90

Figure 50:
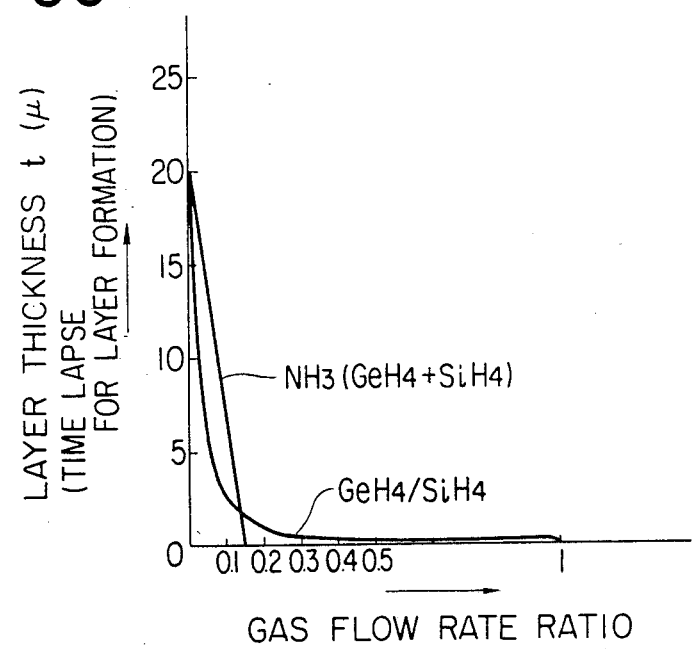

By the preparation device as shown in FIG. 12, layers were formed on an Al cylinder substrate by changing the gas flow rate ratio of $GeH_4$/He gas to $SiH_4$/He gas and that of $NH_3$ gas to $SiH_4$/He gas along with the lapse of time for forming the layer under the condition of Table E-12 following the changing curve of the gas flow rate ratio as shown in FIG. 50, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux.sec through a transmission type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 91

Electrophotographic image forming members were produced under the same conditions as in Example 79 except that, upon formation of a first layer, flow rate ratio of $NH_3$ to ($SiH_4 + GeH_4$) as shown in Table E-13 were used in place of the flow rate ratio in Example 79.

Using the resulting image forming members, image formation was effected on a transfer paper according to the same procedure and under the same conditions as in Example 79, whereby the results as shown in Table E-13 were obtained.

EXAMPLE 92

Electrophotographic image forming members were produced under the same conditions as in Example 79 except that the thickness of the first layer was changed as shown in Table E-14.

Using the resulting image forming members, image formation was effected on a transfer paper according to the same procedure and under the same conditions as in Example 79, whereby the results as shown in Table E-14 were obtained.

EXAMPLE 93

Toner images were formed under the same conditions for a toner image formation as in Example 79 except that electrostatic images were formed by using GaAs type semiconductor laser (10 mW) of 810 nm in place of a tungsten lamp used in Example 79–88. The electrophotographic image forming members produced under the conditions of Example 79–88 were evaluated as to quality of the transferred toner images. The images were clear images of high quality excellent in resolution with good gradation reproducibility.

EXAMPLE 94

Electrophotographic image forming members (Sample Nos. 11-401–11-408, 11-701–11-708 and 11-801–11-808; 24 samples) were produced under the same conditions and according to the same procedure as in Examples 82, 85 and 86 except that the conditions for formation of layer (II) were changed to those as shown in Table E-15.

The resulting electrophotographic image forming members were set individually in a reproduction device and then evaluated for the overall image quality and durability for repetition of copying under the same conditions as in the Example.

Whereby the results as shown in Table E-16 were obtained.

EXAMPLE 95

Each of image forming members was produced according to the same procedure as in Example 79 except that, upon formation of layer (II), the target area ratio of a silicon wafer to $SiO_2$ was changed, the mixing ratio of Ar to NO was changed and the content ratio of silicon atom to oxygen atom in the layer (II) was changed. The resulting image forming members were evaluated for the image quality after about 50,000 repetitions of image formation, development and cleaning as described in Example 79. Whereby the results as shown in Table E-17 were obtained.

EXAMPLE 96

Each of image forming members was produced according to the same procedure as in Example 79 except that, upon formation of layer (II), the flow rate ratio of $SiH_4$ gas to NO gas was changed and the content ratio of silicon atom to oxygen atom in the layer (II) was changed. The resulting image forming members were evaluated for the image quality after about 50,000 repetitions of process up to a transfer as described in Example 79. Whereby the results as shown in Table E-18 were obtained.

EXAMPLE 97

Each of image forming members was produced according to the same procedure as in Example 79 except that, upon formation of layer (II), the flow rate ratio of $SiH_4$ gas:$SiF_4$ gas:NO gas was changed and the content ratio of silicon atom to oxygen atom in the layer (II) was changed. The resulting image forming members were evaluated for the image quality after about 50,000 repetitions of image formation, development and cleaning as described in Example 79. Whereby the results as shown in Table E-19 were obtained.

EXAMPLE 98

Each of image forming members was produced according to the same procedure as in Example 79 except that the layer thickness layer (II) was changed. Image formation, development and cleaning as described in Example 79 were repeated. Whereby the results as shown in Table E-20 were obtained.

The common layer forming conditions in Examples 79–98 of the present invention as as follows.
Substrate temperature:
  Layer containing germanium atom (Ge) . . . about 200° C.
  Layer not containing germanium atom (Ge) . . . about 250° C.
Discharge frequency: 13.56 MHz
Inner pressure in reaction chamber upon reaction: 0.3 Torr

EXAMPLE 99

Figure 51:
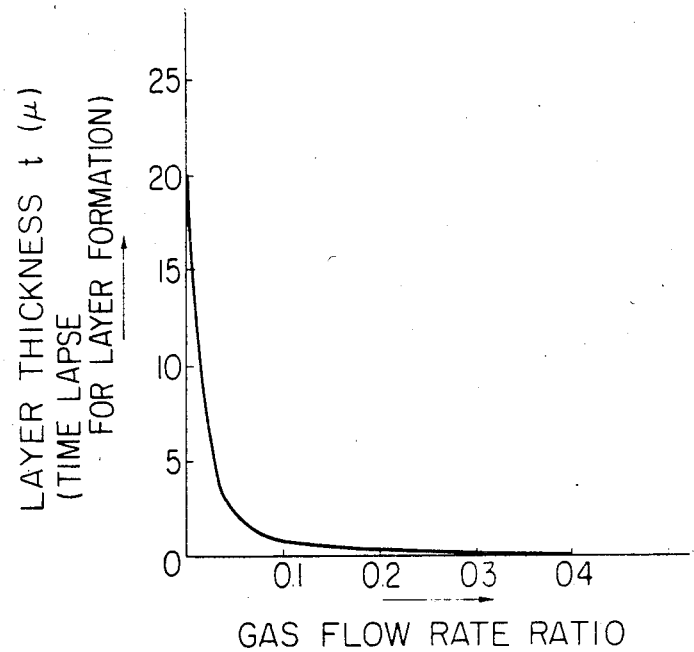

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table F-1 following the changing curve of the gas flow rate ratio as shown in FIG. 51, and thereby, an electrophotographic image forming member was produced.

The resulting image forming member was set in an experimental device for charging and exposure, and corona charging was effected at ⊕ 5.0 kV for 0.3 second, followed immediately by irradiation of a light image from a tungsten lamp source at a dose of 2 lux.sec through a transmissive type test chart.

Immediately thereafter, by cascading on the image forming member surface with ⊖ charged developer (containing toner and carrier), a good toner image was obtained on the image forming member surface. When the toner image on the image forming member was transferred to a transfer paper by corona charging at ⊕ 5.0 kV, there was obtained a clear image of high density excellent in resolution with good gradation reproducibility.

EXAMPLE 100

Figure 52:
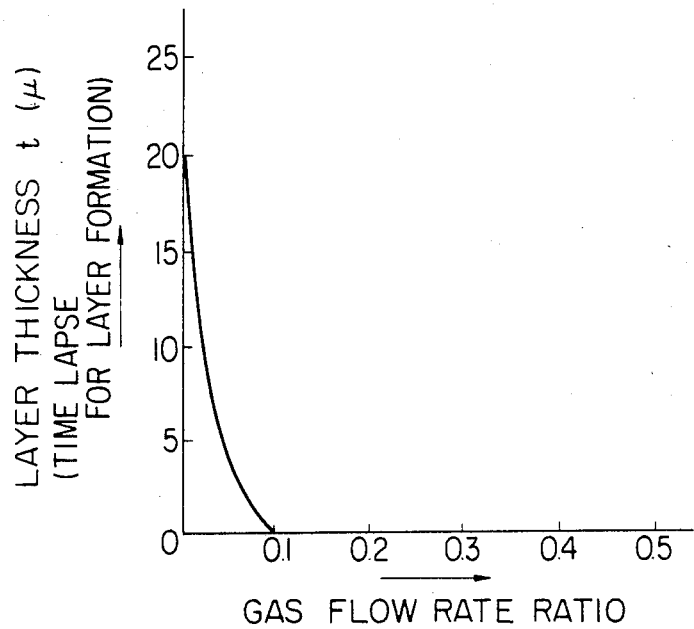

By the preparation device as shown in FIG. 12, layers were formed by changing the gas flow rate ratio of $GeH_4$/He gas to $SiH_4$/He gas along with the lapse of time for forming the layer under the condition of Table F-2 following the changing curve of the gas flow rate ratio as shown in FIG. 52. Other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 101

Figure 53:
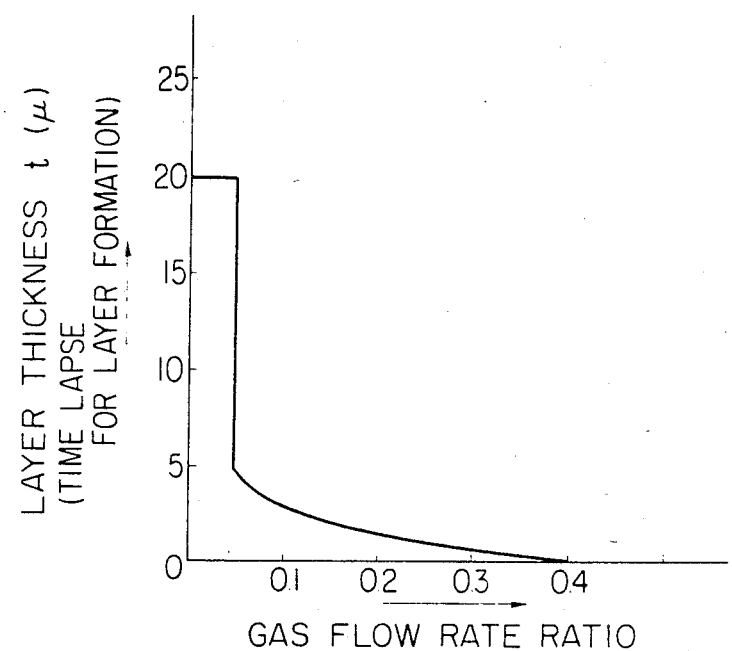

By the preparation device as shown in FIG. 12, layers were formed by changing the gas flow rate ratio of $GeH_4$/He gas to $SiH_4$/He gas along with the lapse of time for forming the layer under the condition of Table F-3 following the changing curve of the gas flow rate ratio as shown in FIG. 53. Other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 102

Figure 54:
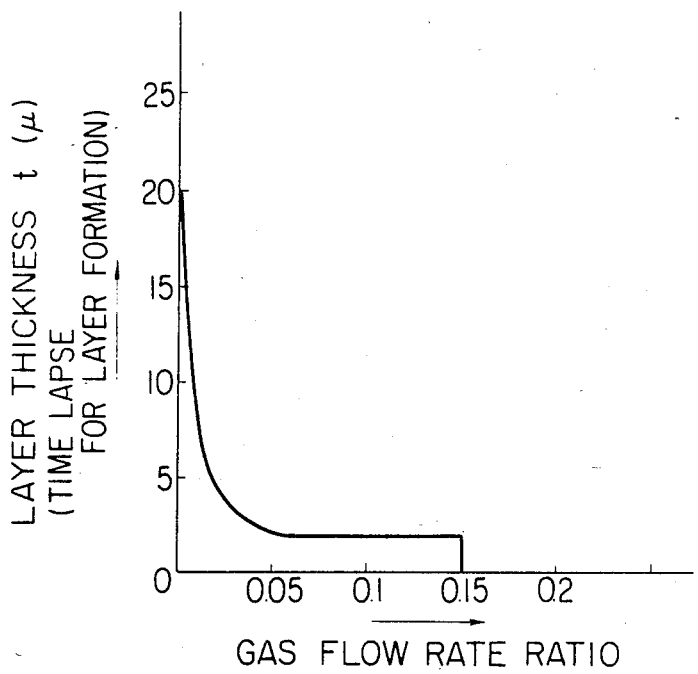

By the preparation device as shown in FIG. 12, layers were formed by changing the gas flow rate ratio of $GeH_4$/He gas to $SiH_4$/He gas along with the lapse of time for forming the layer under the condition of Table F-4 following the changing curve of the gas flow rate ratio as shown in FIG. 54. Other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 103

Figure 55:
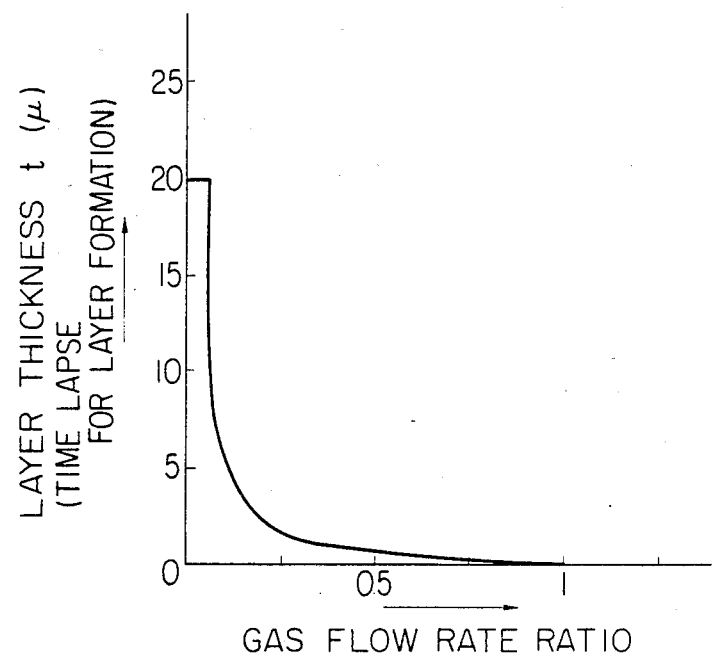

By the preparation device as shown in FIG. 12, layers were formed by changing the gas flow rate ratio of $GeH_4$/He gas to $SiH_4$/He gas along with the lapse of time for forming the layer under the condition of Table F-5 following the changing curve of the gas flow rate ratio as shown in FIG. 55. Other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 104

Figure 56:
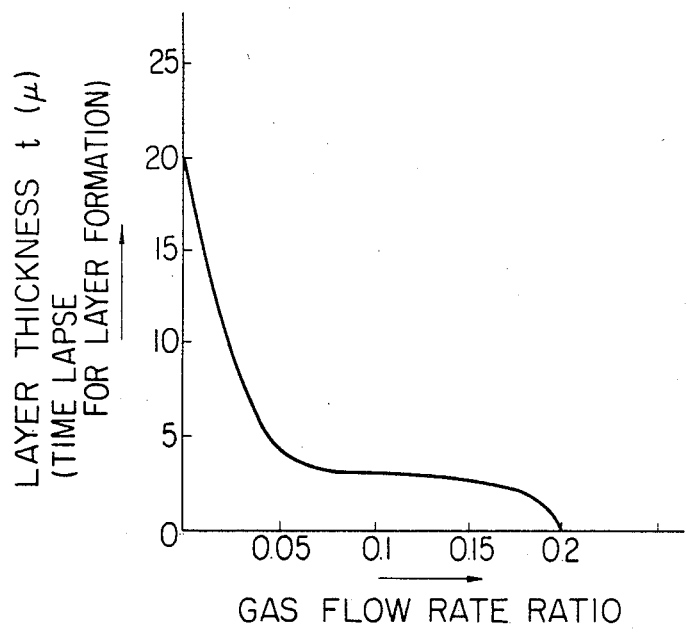

By the preparation device as shown in FIG. 12, layers were formed by changing the gas flow rate ratio of $GeH_4$/He gas to $SiH_4$/He gas along with the lapse of time for forming the layer under the condition of Table F-6 following the changing curve of the gas flow rate ratio as shown in FIG. 56. Other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 105

Figure 57:
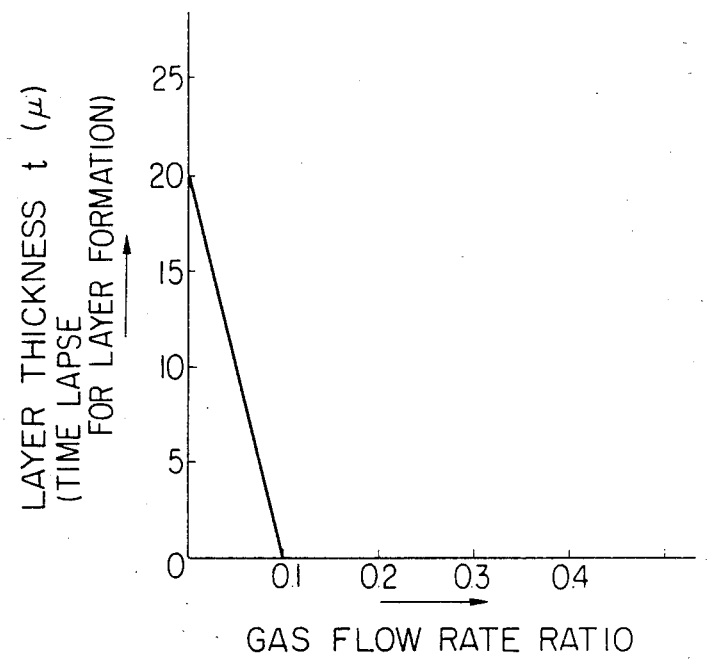

By the preparation device as shown in FIG. 12, layers were formed by changing the gas flow rate ratio of $GeH_4$/He gas to $SiH_4$/He gas along with the lapse of time for forming the layer under the condition of Table F-7 following the changing curve of the gas flow rate ratio as shown in FIG. 57. Other conditions were the same as in Example 99. Thereby, an electrophotographic image forming member was produced.

Using the resulting image forming member, image formation was effected on a transfer paper according to the same procedure and under the same conditions as in Example 99, whereby a very clear image quality was obtained.

EXAMPLE 106

Layers were formed under the same conditions as Example 99 except that each conditions as shown in Table F-8 - Table F-10 were used in place of the condition of Table F-1 used in Example 99. Thereby, electrophotographic image forming member (Sample Nos. 801–803) were produced.

Using each of the resulting image forming member, image formation was effected on a transfer paper according to the same procedure and under the same conditions as in Example 99, whereby a very clear image quality was obtained.

EXAMPLE 107

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table F-11 following the changing curve of the gas flow rate ratio as shown in FIG. 51, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 108

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table F-12 following the changing curve of the gas flow rate ratio as shown in FIG. 51, and thereby, an electrophotographic image forming member was produced.

The resulting image forming member was set in an experimental device for charging and exposure, and corona charging was effected at $\ominus$ 5.0 kV for 0.3 second, followed immediately by irradiation of a light image from a tungsten lamp source at a dose of 2 lux.sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$ 5.0 kV, there was obtained a clear image of high density excellent in resolution with good gradation reproducibility.

EXAMPLE 109

By the preparation device as shown in FIG. 12, layers were formed by changing the gas flow rate ratio of GeH$_4$/He gas to SiH$_4$/He gas along with the lapse of time for forming the layer under the condition of Table F-13 following the changing curve of the gas flow rate ratio as shown in FIG. 52. Other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 110

By the preparation device as shown in FIG. 12, layers were formed by changing the gas flow rate ratio of GeH$_4$/He gas to SiH$_4$/He gas and that of NH$_3$ gas to SiH$_4$/He gas along with the lapse of time for forming the layer under the condition of Table F-14 following the changing curve of the gas flow rate ratio as shown in FIG. 53. Other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 111

By the preparation device as shown in FIG. 12, layers were formed by changing the gas flow rate ratio of GeH$_4$/He gas to SiH$_4$/He gas and that of NH$_3$ gas to SiH$_4$/He gas along with the lapse of time for forming the layer under the condition of Table F-15 following the changing curve of the gas flow rate ratio as shown in FIG. 54. Other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 112

By the preparation device as shown in FIG. 12, layers were formed by changing the gas flow rate ratio of GeH$_4$/He gas to SiH$_4$/He gas along with the lapse of time for forming the layer under the condition of Table F-16 following the changing curve of the gas flow rate ratio as shown in FIG. 55. Other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 113

By the preparation device as shown in FIG. 12, layers were formed by changing the gas flow rate ratio of GeH$_4$/He gas to SiH$_4$/He gas along with the lapse of time for forming the layer under the condition of Table F-17 following the changing curve of the gas flow rate ratio as shown in FIG. 56. Other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 114

By the preparation device as shown in FIG. 12, layers were formed by changing the gas flow rate ratio of GeH$_4$/He gas to SiH$_4$/He gas along with the lapse of time for forming the layer under the condition of Table F-18 following the changing curve of the gas flow rate ratio as shown in FIG. 57. Other conditions were the same as in Example 108. Thereby, an electrophotographic image forming member was produced.

Using the resulting image forming member, image formation was effected on a transfer paper according to the same procedure and under the same conditions as in Example 108, whereby a very clear image quality was obtained.

EXAMPLE 115

Layers were formed under the same conditions as Example 108 except that each conditions as shown in Table F-19 - Table F-21 were used in place of the condition of Table F-12 used in Example 108. Thereby, an electrophotographic image forming members (Sample Nos. 1901-1903) were produced.

Using each of the resulting image forming members, image formation was effected on the transfer paper according to the same procedure and under the same conditions as in Example 108, whereby a very clear image quality was obtained.

EXAMPLE 116

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table F-22 following the changing curve of the gas flow rate ratio as shown in FIG. 51, and thereby, an electrophotographic image forming member was produced.

The resulting image forming member was set in an experimental device for charging and exposure, and corona charging was effected at ⊕ 5.0 kV for 0.3 second, followed immediately by irradiation of a light image from a tungsten lamp source at a dose of 2 lux.sec through a transmissive type test chart.

Immediately thereafter, by cascading on the image forming member surface with ⊖ charged developer (containing toner and carrier), a good toner image was obtained on the image forming member surface. When the toner image on the image forming member was transferred to a transfer paper by corona charging at ⊕ 5.0 kV, there was obtained a clear image of high density excellent in resolution with good gradation reproducibility.

EXAMPLE 117

Toner images were formed under the same conditions for a toner image formation as in Examples 99 and 108 except that electrostatic images were formed by using GaAs type semiconductor laser (10 mW) of 810 nm in place of a tungsten lamp used in Examples 99 and 108. The electrophotographic image forming members produced under the conditions of Examples 99 and 108 were evaluated as to quality of the transferred toner images. The images were clear images of high quality excellent in resolution with good gradation reproducibility.

EXAMPLE 118

Electrophotographic image forming member (Sample Nos. 11-401-11-408, 11-701-11-708 and 11-1201-11-1208; 24 samples) were produced under the same conditions and according to the same procedure as each Example 102, 105 and 110 except that the conditions for formation of layer (II) were changed to those as shown in Table F-23.

The resulting electrophotographic image forming members were set individually in a reproduction device and then evaluated for the overall image quality and durability for repetition of copying under the same conditions as in the Examples.

Whereby the results as shown in Table F-24 were obtained.

EXAMPLE 119

Each of image forming members was produced according to the same procedure as in Example 99 except that, upon formation of layer (II), the target area ratio of a silicon wafer to SiO$_2$ was changed, the mixing ratio of Ar to NO was changed and the content ratio of silicon atom to oxygen atom in the layer (II) was changed. The resulting image forming members were evaluated for the image quality after about 50,000 repetitions of image formation, development and cleaning as described in Example 99. Whereby the results as shown in Table F-25 were obtained.

EXAMPLE 120

Each of image forming members was produced according to the same procedure as in Example 99 except that, upon formation of layer (II), the flow rate ratio of SiH$_4$ gas to NO gas was changed and the content ratio of silicon atom to oxygen atom in the layer (II) was changed. The resulting image forming members were evaluated for the image quality after about 50,000 repetitions of process up to a transfer as described in Example 99. Whereby the results as shown in Table F-26 were obtained.

EXAMPLE 121

Each of image forming members was produced according to the same procedure as in Example 99 except that, upon formation of layer (II), the flow rate ratio of SiH$_4$ gas:SiF$_4$ gas:NO gas was changed and the content ratio of silicon atom to oxygen atom in the layer (II) was changed. The resulting image forming members were evaluated for the image quality after about 50,000 repetitions of image formation, development and cleaning as described in Example 99. Whereby the results as shown in Table F-27 were obtained.

EXAMPLE 122

Each of image forming members was produced according to the same procedure as in Example 99 except that the layer thickness of layer (II) was changed. Image formation, development and cleaning as described in Example 99 were repeated. Whereby the results as shown in Table F-28 were obtained.

The common layer forming conditions in Examples 99–122 of the present invention are as follows.

Substrate temperature:
  Layer containing germanium atom (Ge) . . . about 200° C.
  Layer not containing germanium atom (Ge) . . . about 250° C.
Discharge frequency: 13.56 MHz
Inner pressure in reaction chamber upon reaction: 0.3 Torr

TABLE A-1

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~2/10<br>NH$_3$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 2/10~0 | 0.18 | 5 | 19 |

TABLE A-2

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 1/10~4/100<br>NH$_3$/(GeH$_4$ + SiH$_4$) = 2/100 | 0.18 | 5 | 5 |
| Second layer | SiH$_4$/He = 0.05<br>GeH$_4$/He = 0.05 | SiH$_4$ + GeH$_4$ = 50 | GeH$_4$/SiH$_4$ = 4/100~0 | 0.18 | 5 | 15 |

TABLE A-3

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 4/10~2/10<br>NH$_3$/(GeH$_4$ + SiH$_4$) = 3/100 | 0.18 | 5 | 1.5 |
| Second layer | SiH$_4$/He = 0.05<br>GeH$_4$/He = 0.05 | SiH$_4$ + GeH$_4$ = 50 | GeH$_4$/SiH$_4$ = 2/10~2/1000 | 0.18 | 5 | 18.5 |

TABLE A-4

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 15/100<br>NH$_3$/(GeH$_4$ + SiH$_4$) = 4/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 15/100~0 | 0.18 | 5 | 16 |

TABLE A-5

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 1~5/10<br>NH$_3$/(GeH$_4$ + SiH$_4$) = 5/100 | 0.08 | 5 | 0.5 |
| Second layer | SiH$_4$/He = 0.05<br>GeH$_4$/He = 0.05 | SiH$_4$ + GeH$_4$ = 50 | GeH$_4$/SiH$_4$ = 5/10~0 | 0.18 | 5 | 19.5 |

TABLE A-6

| Layer consti- tution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 2/10~5/100<br>NH$_3$/(GeH$_4$ + SiH$_4$) = 3/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 5/100~0 | 0.18 | 5 | 16 |

TABLE A-7

| Layer consti- tution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 1/10~8/100<br>NH$_3$/(GeH$_4$ + SiH$_4$) = 3/100 | 0.18 | 5 | 4 |
| Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 16 |

TABLE A-8

| Layer consti- tution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | Si$_2$H$_6$/He = 0.05<br>GeH$_4$/He = 0.05<br>NH$_3$ | Si$_2$H$_6$ + GeH$_4$ = 50 | GeH$_4$/Si$_2$H$_6$ = 1/1~2/10<br>NH$_3$/(GeH$_4$ + Si$_2$H$_6$) = 3/100 | 0.18 | 5 | 1 |
| Second layer | Si$_2$H$_6$/He = 0.05<br>GeH$_4$/He = 0.05 | Si$_2$H$_6$ + GeH$_4$ = 50 | GeH$_4$/Si$_2$H$_6$ = 2/10~0 | 0.18 | 5 | 19 |

TABLE A-9

| Layer consti- tution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiF$_4$/He = 0.05<br>GeH$_4$/He = 0.05<br>NH$_3$ | SiF$_4$ + GeH$_4$ = 50 | GeH$_4$/SiF$_4$ = 1/1~2/10<br>NH$_3$/(GeH$_4$ + SiF$_4$) = 3/100 | 0.18 | 5 | 1 |
| Second layer | SiF$_4$/He = 0.05<br>GeH$_4$/He = 0.05 | SiF$_4$ + GeH$_4$ = 50 | GeH$_4$/SiF$_4$ = 2/10~0 | 0.18 | 5 | 19 |

TABLE A-10

| Layer consti- tution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>SiF$_4$/He = 0.05<br>GeH$_4$/He = 0.05<br>NH$_3$ | SiH$_4$ + SiF$_4$ + GeH$_4$ = 50 | GeH$_4$/(SiH$_4$ + SiF$_4$) = 1/1~2/10<br>NH$_3$/(GeH$_4$ + SiH$_4$ + SiF$_4$) = 3/100 | 0.18 | 5 | 1 |
| Second layer | SiH$_4$/He = 0.05<br>SiF$_4$/He = 0.05<br>GeH$_4$/He = 0.05 | SiF$_4$ + Si$_2$F$_8$ + GeH$_4$ = 50 | GeH$_4$/(SiH$_4$ + SiF$_4$) = 2/10~0 | 0.18 | 5 | 19 |

TABLE A-11

| Layer consti- tution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~2/10<br>NH$_3$/(GeH$_4$ + SiH$_4$) = 2/100 | 0.18 | 5 | 1 |
| Second layer | SiH$_4$/He = 0.05<br>GeH$_4$/He = 0.05<br>NH$_3$ | SiH$_4$ + GeH$_4$ = 50 | GeH$_4$/SiH$_4$ = 2/10~0<br>NH$_3$/(GeH$_4$ + SiH$_4$) = 1/100 | 0.18 | 5 | 19 |

TABLE A-12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~5/100<br>NH$_3$/(GeH$_4$ + SiH$_4$) = 15/100~1/10 | 0.18 | 5 | 7 |
| Second layer | SiH$_4$/He = 0.05<br>GeH$_4$/He = 0.05<br>NH$_3$ | SiH$_4$ + GeH$_4$ = 50 | GeH$_4$/SiH$_4$ = 5/100~0<br>NH$_3$/(GeH$_4$ + SiH$_4$) = 1/10~0 | 0.18 | 5 | 13 |

TABLE A-13

| Sample No. | 1301 | 1302 | 1303 | 1304 | 1305 | 1306 | 1307 | 1308 |
|---|---|---|---|---|---|---|---|---|
| NH$_3$/(GeH$_4$+SiH$_4$) Flow rate ratio | 1/1000 | 5/1000 | 9/1000 | 2/100 | 3/100 | 5/100 | 8/100 | 1/10 |
| N content (atomic %) | 0.1 | 0.5 | 0.89 | 1.96 | 2.9 | 4.76 | 7.4 | 9.1 |
| Evaluation | Δ | ◯ | ◯ | ⊚ | ⊚ | ◯ | ◯ | Δ |

⊚: Excellent
◯: Good
Δ: Practically satisfactory

TABLE A-14

| Sample No. | 1401 | 1402 | 1403 | 1404 | 1405 | 1406 | 1407 | 1408 |
|---|---|---|---|---|---|---|---|---|
| Layer thickness | 30Å | 500Å | 0.1$\mu$ | 0.3$\mu$ | 0.8$\mu$ | 3$\mu$ | 4$\mu$ | 5$\mu$ |
| Evaluation | Δ | ◯ | ⊚ | ⊚ | ⊚ | ◯ | ◯ | Δ |

⊚: Excellent
◯: Good
Δ: Practically satisfactory

TABLE B-1

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>NH$_3$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 19 |

TABLE B-2

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~8/100<br>B$_2$H$_6$/(GeH$_4$ + SiH$_4$) = 5 × 10$^{-3}$<br>NH$_3$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 19 |

TABLE B-3

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>NH$_3$/(GeH$_4$ + SiH$_4$) = 2/100 | 0.18 | 5 | 0.5 |
| Second layer | SiH$_4$/He = 0.05<br>GeH$_4$/He = 0.05 | SiH$_4$ + GeH$_4$ = 50 | GeH$_4$/SiH$_4$ = 33/100~4/100 | 0.18 | 5 | 19.5 |

TABLE B-4

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 15/100$<br>$B_2H_6/(GeH_4 + SiH_4) = 10^{-4}$<br>$NH_3/(GeH_4 + SiH_4) = 3/100$ | 0.18 | 5 | 0.5 |
| Second layer | $SiH_4/He = 0.05$<br>$GeH_4/He = 0.05$ | $SiH_4 + GeH_4 = 50$ | $GeH_4/SiH_4 = 15/100 \sim 0$ | 0.18 | 5 | 19.5 |

TABLE B-5

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/1 \sim 6/10$<br>$B_2H_6/(GeH_4 + SiH_4) = 2 \times 10^{-3}$<br>$NH_3/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 6/10 \sim 5/1000$ | 0.18 | 5 | 19 |

TABLE B-6

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 2/10 \sim 195/1000$<br>$B_2H_6/(GeH_4 + SiH_4) = 5 \times 10^{-3}$<br>$NH_3/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 195/1000 \sim 0$ | 0.18 | 5 | 19 |

TABLE B-7

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10 \sim 95/100$<br>$B_2H_6/(GeH_4 + SiH_4) = 2 \times 10^{-3}$<br>$NH_3/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 95/100 \sim 0$ | 0.18 | 5 | 19 |

TABLE B-8

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| First layer | $Si_2H_6/He = 0.05$<br>$GeH_4/He = 0.05$<br>$B_2H_6/He = 10^{-3}$<br>$NH_3$ | $Si_2H_6 + GeH_4 = 50$ | $GeH_4/Si_2H_6 = 4/10 \sim 8/100$<br>$B_2H_6/(GeH_4 + Si_2H_6) = 8 \times 10^{-3}$<br>$NH_3/(GeH_4 + Si_2H_6) = 3/100$ | 0.18 | 5 | 1 |
| Second layer | $Si_2H_6/He = 0.05$<br>$GeH_4/He = 0.05$ | $Si_2H_6 + GeH_4 = 55$ | $GeH_4/Si_2H_6 = 8/100 \sim 0$ | 0.18 | 5 | 19 |

TABLE B-9

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| First layer | $SiH_4/He = 0.05$<br>$GeH_4He = 0.05$<br>$B_2H_6/He = 10^{-3}$<br>$NH_3$ | $SiF_4 + GeH_4 = 50$ | $GeH_4/SiF_4 = 1/10 \sim 8/100$<br>$B_2H_6/(GeH_4 + SiF_4) = 5 \times 10^{-3}$<br>$NH_3(GeH_4 + SiF_4) = 3/100$ | 0.18 | 5 | 1 |
| Second layer | $SiF_4/He = 0.05$<br>$GeH_4/He = 0.05$ | $SiH_4 + GeH_4 = 50$ | $GeH_4/SiF_4 = 8/100 \sim 0$ | 0.18 | 5 | 19 |

TABLE B-10

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>SiF$_4$/He = 0.05<br>GeH$_4$/He = 0.05<br>B$_2$H$_6$/He = 10$^{-3}$<br>NH$_3$ | SiH$_4$ + SiF$_4$ + GeH$_4$ = 50 | GeH$_4$/(SiH$_4$ + SiF$_4$) = 4/10~33/100<br>B$_2$H$_6$/(GeH$_4$ + SiH$_4$ + SiF$_4$) = 1 × 10$^{-3}$<br>NH$_3$/(GeH$_4$ + SiH$_4$ + SiF$_4$) = 2/100 | 0.18 | 5 | 0.5 |
| Second layer | SiH$_4$/He = 0.05<br>SiF$_4$/He = 0.05<br>GeH$_4$/He = 0.05 | SiH$_4$ + SiF$_4$ + GeH$_4$ = 50 | GeH$_4$/(SiH$_4$ + SiF$_4$) = 4/10~33/100 | 0.18 | 5 | 19.5 |

TABLE B-11

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$He = 0.05<br>PH$_3$/He = 10$^{-3}$<br>NH$_3$ | SiH$_4$ + GeH$_4$ = 50 | GeH$_4$/SiH$_4$ = 4/10~8/100<br>PH$_3$/(GeH$_4$ + SiH$_4$) = 1 × 10$^{-3}$<br>NH$_3$/(GeH$_4$ + SiH$_4$) = 3/100 | 0.18 | 5 | 1 |
| Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 19 |

TABLE B-12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~0<br>B$_2$H$_6$/(GeH$_4$ + SiH$_4$) = 8 × 10$^{-3}$<br>NH$_3$/(GeH$_4$ + SiH$_4$) = 1/100 | 0.18 | 5 | 20 |

TABLE B-13

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~0<br>B$_2$H$_6$/(GeH$_4$ + SiH$_4$) = 5 × 10$^{-3}$<br>NH$_3$/(GeH$_4$ + SiH$_4$) = 1/100 | 0.18 | 5 | 20 |

TABLE B-14

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~4/100<br>B$_2$H$_6$/(GeH$_4$ + SiH$_4$) = 1 × 10$^{-3}$<br>NH$_3$/(GeH$_4$ + SiH$_4$) = 2/100~0 | 0.18 | 5 | 20 |

[The flow rate ratio NH$_3$/(GeH$_4$ + SiH$_4$) was reduced linearly.]

TABLE B-15

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 15/100 \sim 0$<br>$B_2H_6/(GeH_4 + SiH_4) = 5 \times 10^{-4}$<br>$NH_3/(GeH_4 + SiH_4) = 3/100 \sim 0$ | 0.18 | 5 | 20 |

[The flow rate ratio $NH_3/(GeH_4 + SiH_4)$ was reduced linearly.]

TABLE B-16

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/1 \sim 6/10$<br>$B_2H_6/(GeH_4 + SiH_4) = 2 \times 10^{-3}$<br>$NH_3/(GeH_4 + SiH_4) = 3/100$ | 0.18 | 5 | 1 |
| Second layer | $SiH_4/He = 0.05$<br>$GeH_4/He = 0.05$ | $SiH_4 + GeH_4 = 50$ | $GeH_4/SiH_4 = 6/10 \sim 5/1000$<br>$B_2H_6/GeH_4 + SiH_4) = 2 \times 10^{-3}$ | 0.18 | 5 | 19 |

TABLE B-17

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 2/10 \sim 195/1000$<br>$B_2H_6/(GeH_4 + SiH_4) = 5 \times 10^{-3}$<br>$NH_3/(GeH_4 + SiH_4) = 3/100$ | 0.18 | 5 | 15 |
| Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 195/1000 \sim 0$<br>$B_2H_6/(GeH_4 + SiH_4) = 5 \times 10^{-3}$ | 0.18 | 5 | 19 |

TABLE B-18

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10 \sim 95/100$<br>$B_2H_6/(GeH_4 + SiH_4) = 2 \times 10^{-3}$<br>$NH_3/(GeH_4 + SiH_4) = 3/100$ | 0.18 | 5 | 1 |
| Second layer | $SiH_4/He = 0.05$<br>$GeH_4/He\ 32\ 0.05$<br>$B_2H_6/He = 10^{-3}$ | $SiH_4 + GeH_4 = 50$ | $GeH_4/SiH_4 = 95/100 \sim 0$<br>$B_2H_6/(GeH_4 + SiH_4) = 2 \times 10^{-3}$ | 0.18 | 5 | 19 |

TABLE B-19

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 4/10 \sim 8/100$<br>$B_2H_6/(GeH_4 + SiH_4) = 8 \times 10^{-3}$<br>$NH_3/(GeH_4 + SiH_4) = 3/100 \sim 0$ | 0.18 | 5 | 1 |
| Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 8/100 \sim 0$<br>$B_2H_6(GeH_4 + SiH_4) = 8 \times 10^{-3}$ | 0.18 | 5 | 19 |

[The flow rate ratio $NH_3/(GeH_4 + SiH_4)$ was reduced linearly.]

TABLE B-20

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 1/10 \sim 100$<br>$B_2H_6/(GeH_4 + SiH_4) = 5 \times 10^{-3}$<br>$NH_3/(GeH_4 + SiH_4) = 3/100 \sim 0$ | 0.18 | 5 | 1 |

TABLE B-20-continued

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Second layer | NH$_3$<br>SiH$_4$/He = 0.05<br>GeH$_4$/He = 0.05 | SiH$_4$ + GeH$_4$ = 50 | GeH$_4$/SiH$_4$ = 8/100~0<br>B$_2$H$_6$/(GeH$_4$ + SiH$_4$) = 5 × 10$^{-3}$ | 0.18 | 5 | 19 |

[The flow rate ratio NH$_3$/(GeH$_4$ + SiH$_4$) was reduced linearly.]

TABLE B-21

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>NH$_3$/(GeH$_4$ + SiH$_4$) = 2/100 | 0.18 | 5 | 0.5 |
| Second layer | SiH$_4$/He = 0.05<br>GeH$_4$/He = 0.05 | SiH$_4$ + GeH$_4$ = 50 | GeH$_4$/SiH$_4$ = 33/100~0<br>B$_2$H$_6$/(GeH$_4$ + SiH$_4$) = 1 × 10$^{-3}$ | 0.18 | 5 | 19.5 |

[The flow rate ratio NH$_3$/(GeH$_4$ + SiH$_4$) was reduced linearly.]

TABLE B-22

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>NH$_3$/(GeH$_4$ + SiH$_4$) = 3/100 | 0.18 | 5 | 15 |
| Second layer | SiH$_4$/He = 0.05<br>GeH$_4$/He =0 0.05 | SiH$_4$ + GeH$_4$ = 50 | GeH$_4$/SiH$_4$ = 8/100~0<br>PH$_3$/(GeH$_4$ + SiH$_4$) = 1 × 10$^{-5}$ | 0.18 | 4 | 5 |

TABLE C-1

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~2/10<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 2/10~0 | 0.18 | 5 | 19 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE C-2

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/10~4/100<br>NH$_3$/(GeH$_4$ + SiH$_4$) = 2/100 | 0.18 | 5 | 5 |
| | Second layer | SiH$_4$/He = 0.05<br>GeH$_4$/He = 0.05 | SiH$_4$ + GeH$_4$ = 50 | GeH$_4$/SiH$_4$ = 4/100~0 | 0.18 | 5 | 15 |

TABLE C-3

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 4/10~2/10<br>NH$_3$/(GeH$_4$ + SiH$_4$) = 3/100 | 0.18 | 5 | 1.5 |
| | Second layer | SiH$_4$/He = 0.05<br>GeH$_4$/He = 0.05 | SiH$_4$ = GeH$_4$ = 50 | GeH$_4$/SiH$_4$ = 2/10~2/1000 | 0.18 | 5 | 18.5 |

TABLE C-4

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 15/100 NH$_3$/(GeH$_4$ + SiH$_4$) = 4/100 | 0.18 | 5 | 2 |
| | Second layer | SiH$_4$/He = 0.05 GeH$_4$/He = 0.05 | SiH$_4$ + GeH$_4$ = 50 | GeH$_4$/SiH$_4$ = 15/100~0 | 0.18 | 5 | 18 |

TABLE C-5

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 1~5/10 NH$_3$/(GeH$_4$ + SiH$_4$) = 5/100 | 0.18 | 5 | 0.5 |
| | Second layer | SiH$_4$/He = 0.05 GeH$_4$/He = 0.05 | SiH$_4$ + GeH$_4$ = 50 | GeH$_4$/SiH$_4$ = 5/10~0 | 0.18 | 5 | 19.5 |

TABLE C-6

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 2/10~5/100 NH$_3$/(GeH$_4$ + SiH$_4$) = 3/100 | 0.18 | 5 | 4 |
| | Second layer | SiH$_4$/He = 0.05 GeH$_4$/He = 0.05 | SiH$_4$ + GeH$_4$ = 50 | GeH$_4$/SiH$_4$ = 5/100~0 | 0.18 | 5 | 16 |

TABLE C-7

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 1/10~8/100 NH$_3$/(GeH$_4$ + SiH$_4$) = 3/100 | 0.18 | 5 | 4 |
| | Second layer | SiH$_4$/He = 0.05 GeH$_4$/He = 0.05 | SiH$_4$ + GeH$_4$ = 50 | GeH$_4$/SiH$_4$ = 8/100~0 | 0.18 | 5 | 16 |

TABLE C-8

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | Si$_2$H$_6$/He = 0.05 GeH$_4$/He = 0.05 NH$_3$ | Si$_2$H$_6$ + GeH$_4$ = 50 | GeH$_4$/Si$_2$H$_6$ = 1/1~2/10 NH$_3$/(GeH$_4$ + Si$_2$H$_6$) = 3/100 | 0.18 | 5 | 1 |
| | Second layer | Si$_2$H$_6$/He = 0.05 GeH$_4$/He = 0.05 | Si$_2$H$_6$ + GeH$_4$ = 50 | GeH$_4$/Si$_2$H$_6$ = 2/10~0 | 0.18 | 5 | 19 |

TABLE C-9

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05 GeH$_4$/He = 0.05 NH$_3$ | SiF$_4$ + GeH$_4$ = 50 | GeH$_4$/SiF$_4$ = 1/1~2/10 NH$_3$/(GeH$_4$ + SiF$_4$) = 3/100 | 0.18 | 5 | 1 |
| | Second layer | SiF$_4$/He = 0.05 GeH$_4$/He = 0.05 | SiF$_4$ + GeH$_4$ = 50 | GeH$_4$/SiF$_4$ = 2/10~0 | 0.18 | 5 | 19 |

TABLE C-10

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>SiF$_4$/He = 0.05<br>GeH$_4$/He = 0.05<br>NH$_3$ | SiH$_4$ + SiF$_4$ + GeH$_4$ = 50 | GeH$_4$/(SiH$_4$ + SiF$_4$) = 1/1~2/10<br>NH$_3$/(GeH$_4$ + SiH$_4$ + SiF$_4$) = 3/100 | 0.18 | 5 | 1 |
| | Second layer | SiH$_4$/He = 0.05<br>SiF$_4$/He = 0.05<br>GeH$_4$/He = 0.05 | SiF$_4$ + Si$_2$F$_8$ + GeH$_4$ = 50 | GeH$_4$/(SiH$_4$ + SiF$_4$) = 2/10~0 | 0.18 | 5 | 19 |

TABLE C-11

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~2/10<br>NH$_3$/(GeH$_4$ + SiH$_4$) = 2/100 | 0.18 | 5 | 1 |
| | Second layer | SiH$_4$/He = 0.05<br>GeH$_4$/He = 0.05<br>NH$_3$ | SiH$_4$ + GeH$_4$ = 50 | GeH$_4$/SiH$_4$ = 2/10~0<br>NH$_3$/(GeH$_4$ + SiH$_4$) = 1/100 | 0.18 | 5 | 19 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE C-12

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~5/100<br>NH$_3$/(GeH$_4$ + SiH$_4$) = 15/100~1/10 | 0.18 | 5 | 7 |
| | Second layer | SiH$_4$/He = 0.05<br>GeH$_4$He = 0.05<br>NH$_3$ | SiH$_4$ + GeH$_4$ = 50 | GeH$_4$/SiH$_4$ = 5/100~0<br>NH$_3$/(GeH$_4$ + SiH$_4$) = 1/10~0 | 0.18 | 5 | 13 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE C-13

| Sample No. | 1301 | 1302 | 1303 | 1304 | 1305 | 1306 | 1307 | 1308 |
|---|---|---|---|---|---|---|---|---|
| NH$_3$/(GeH$_4$ + SiH$_4$) Flow rate ratio | 1/1000 | 5/1000 | 9/1000 | 2/100 | 3/100 | 5/100 | 8/100 | 1/10 |
| N content (atomic %) | 0.1 | 0.5 | 0.89 | 1.96 | 2.9 | 4.76 | 7.4 | 9.1 |
| Evaluation | ∆ | ○ | ○ | ⊚ | ⊚ | ○ | ○ | ∆ |

⊚: Excellent
○: Good
∆: Practically satisfactory

TABLE C-14

| Sample No. | 1401 | 1402 | 1403 | 1404 | 1405 | 1406 | 1407 | 1408 |
|---|---|---|---|---|---|---|---|---|
| Layer thickness | 30Å | 500Å | 0.1$\mu$ | 0.3$\mu$ | 0.8$\mu$ | 3$\mu$ | 4$\mu$ | 5$\mu$ |
| Evaluation | ∆ | ○ | ⊚ | ⊚ | ⊚ | ○ | ○ | ∆ |

⊚: Excellent
○: Good
∆: Practically satisfactory

TABLE C-15

| Conditions | Gases employed | Flow rate (SCCM) | Flow rate ratio or Area ratio | Discharging power (W/cm$^2$) | Layer thickness ($\mu$) |
|---|---|---|---|---|---|
| 12-1 | Ar | 200 | Si wafer:graphite = 1.5:8.5 | 0.3 | 0.5 |
| 12-2 | Ar | 200 | Si wafer:graphite = 0.5:9.5 | 0.3 | 0.3 |
| 12-3 | Ar | 200 | Si wafer:graphite = 6:4 | 0.3 | 1.0 |
| 12-4 | SiH$_4$/He = 1<br>C$_2$H$_4$ | SiH$_4$ = 15 | SiH$_4$:C$_2$H$_4$ = 0.4:9.6 | 0.18 | 0.3 |
| 12-5 | SiH$_4$/He = 0.5<br>C$_2$H$_4$ | SiH$_4$ = 100 | SiH$_4$:C$_2$H$_4$ = 5:5 | 0.18 | 1.5 |
| 12-6 | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |

TABLE C-15-continued

| Conditions | Gases employed | Flow rate (SCCM) | Flow rate ratio or Area ratio | Discharging power (W/cm$^2$) | Layer thickness ($\mu$) |
|---|---|---|---|---|---|
| 12-7 | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 12-8 | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE C-16

| Layer (II) Preparation conditions | Sample No./Results | | |
|---|---|---|---|
| 12-1 | 12-401 ○ ○ | 12-701 ○ ○ | 12-801 ○ ○ |
| 12-2 | 12-402 ○ ○ | 12-702 ○ ○ | 12-802 ○ ○ |
| 12-3 | 12-403 ○ ○ | 12-703 ○ ○ | 12-803 ○ ○ |
| 12-4 | 12-404 ⊙ ⊙ | 12-704 ⊙ ⊙ | 12-804 ⊙ ⊙ |
| 12-5 | 12-405 ⊙ ⊙ | 12-705 ⊙ ⊙ | 12-805 ⊙ ⊙ |
| 12-6 | 12-406 ⊙ ⊙ | 12-706 ⊙ ⊙ | 12-806 ⊙ ⊙ |
| 12-7 | 12-407 ○ ○ | 12-707 ○ ○ | 12-807 ○ ○ |
| 12-8 | 12-408 ○ ○ | 12-708 ○ ○ | 12-808 ○ ○ |

Sample No.
Overall image evaluation   Durability evaluation
Evaluation standard:
⊙ Excellent
○ Good

TABLE C-17

| Sample No. | 1301 | 1302 | 1303 | 1304 | 1305 | 1306 | 1307 |
|---|---|---|---|---|---|---|---|
| Si:C target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | X |

⊙: Very good
○: Good
Δ: Sufficiently practically usable
X: Image defect formed

TABLE C-18

| Sample No. | 1401 | 1402 | 1403 | 1404 | 1405 | 1406 | 1407 | 1408 |
|---|---|---|---|---|---|---|---|---|
| SiH$_4$:C$_2$H$_4$ (Flow rate ratio) | 9:1 | 6:4 | 4:6 | 2:8 | 1:9 | 0.5:9.5 | 0.35:9.65 | 0.2:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Sufficiently practically usable
X: Image defect formed

TABLE C-19

| Sample No. | 1501 | 1502 | 1503 | 1504 | 1505 | 1506 | 1507 | 1508 |
|---|---|---|---|---|---|---|---|---|
| SiH$_4$:SiF$_4$:C$_2$H$_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Practically satisfactory
X: Image defect formed

TABLE C-20

| Sample No. | Thickness of amorphous layer (II) ($\mu$) | Results |
|---|---|---|
| 1601 | 0.001 | Image defect liable to occur |
| 1602 | 0.02 | No image defect during 20,000 repetitions |
| 1603 | 0.05 | Stable for 50,000 or more repetitions |
| 1604 | 1 | Stable for 200,000 or more repetitons |

TABLE D-1

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~8/100<br>B$_2$H$_6$/(GeH$_4$ + SiH$_4$) = 8/10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 19 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE D-2

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~8/100<br>B$_2$H$_6$/(GeH$_4$ + SiH$_4$) = 5 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 6/100~0 | 0.18 | 5 | 19 |

TABLE D-3

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>NH$_3$/(GeH$_4$ + SiH$_4$) = 2/100 | 0.18 | 5 | 0.5 |
| | Second layer | SiH$_4$/He = 0.05<br>GeH$_4$/He = 0.05 | SiH$_4$ + GeH$_4$ = 50 | GeH$_4$/SiH$_4$ = 33/100~4/100 | 0.18 | 5 | 19.5 |

TABLE D-4

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 15/100<br>B$_2$H$_6$/(GeH$_4$ + SiH$_4$) = 5 × 10$^{-4}$<br>NH$_3$/(GeH$_4$ + SiH$_4$) = 3/100 | 0.18 | 5 | 0.5 |
| | Second layer | SiH$_4$/He = 0.05<br>GeH$_4$/He = 0.05 | SiH$_4$ + GeH$_4$ = 50 | GeH$_4$/SiH$_4$ = 15/100~0 | 0.18 | 5 | 19.5 |

TABLE D-5

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/1~6/10<br>B$_2$H$_6$/(GeH$_4$ + SiH$_4$) = 2 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 6/10~5/1000 | 0.18 | 5 | 19 |

TABLE D-6

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 2/10~195/1000<br>B$_2$H$_6$/(GeH$_4$ + SiH$_4$) = 5 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 195/1000~0 | 0.18 | 5 | 19 |

TABLE D-7

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~95/100<br>B$_2$H$_6$/(GeH$_4$ + SiH$_4$) = 2 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 95/100~0 | 0.18 | 5 | 19 |

TABLE D-8

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | Si$_2$H$_6$/He = 0.05<br>GeH$_4$/He = 0.05<br>B$_2$H$_6$/He = 10$^{-3}$<br>NH$_3$ | Si$_2$H$_6$ + GeH$_4$ = 50 | GeH$_4$/Si$_2$H$_6$ = 4/10~8/100<br>B$_2$H$_6$/(GeH$_4$ + Si$_2$H$_6$) = 8 × 10$^{-3}$<br>NH$_3$/(GeH$_4$ + Si$_2$H$_6$) = 3/100 | 0.18 | 5 | 1 |
| | Second layer | Si$_2$H$_6$/He = 0.05<br>GeH$_4$/He = 0.05 | Si$_2$H$_6$ + GeH$_4$ = 55 | GeH$_4$/Si$_2$H$_6$ = 8/100~0 | 0.18 | 5 | 19 |

TABLE D-9

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05<br>GeH$_4$/He = 0.05<br>B$_2$H$_6$/He = 10$^{-3}$<br>NH$_3$ | SiF$_4$ + GeH$_4$ = 50 | GeH$_4$/SiF$_4$ = 1/10~8/100<br>B$_2$H$_6$/(GeH$_4$ + SiF$_4$) = 5 × 10$^{-3}$<br>NH$_3$/(GeH$_4$ + SiF$_4$) = 3/100 | 0.18 | 5 | 1 |
| | Second layer | SiF$_4$/He = 0.05<br>GeH$_4$/He = 0.05 | SiF$_4$ + GeH$_4$ = 50 | GeH$_4$/SiF$_4$ = 8/100~0 | 0.18 | 5 | 19 |

TABLE D-10

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>SiF$_4$/He = 0.05<br>GeH$_4$/He = 0.05<br>B$_2$H$_6$/He = 10$^{-3}$<br>NH$_3$ | SiH$_4$ + SiF$_4$ = GeH$_4$ = 50 | GeH$_4$/(SiH$_4$ + SiF$_4$) = 4/10~33/100<br>B$_2$H$_6$/(GeH$_4$ + SiH$_4$ + SiF$_4$) = 1 × 10$^{-3}$<br>NH$_3$/(GeH$_4$ + SiH$_4$ + SiF$_4$) = 2/100 | 0.18 | 5 | 0.5 |
| | Second layer | SiH$_4$/He = 0.05<br>SiF$_4$/He = 0.05<br>GeH$_4$/He = 0.05 | SiH$_4$ + SiF$_4$ + GeH$_4$ = 50 | GeH$_4$/(SiH$_4$ + SiF$_4$) = 4/10~33/100 | 0.18 | 5 | 19.5 |

TABLE D-11

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>PH$_3$/He = 10$^{-3}$ | SiH$_4$ + GeH$_4$ = 50 | GeH$_4$/SiH$_4$ = 4/10~8/100<br>PH$_3$/(GeH$_4$ + SiH$_4$) = 1 × 10$^{-3}$<br>NH$_3$/(GeH$_4$ + SiH$_4$) = 3/100 | 0.18 | 5 | 1 |

TABLE D-11-continued

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| | Second layer | NH$_3$ SiH$_4$/He = 0.05 GeH$_4$/He = 0.05 | SiH$_4$ + GeH$_4$ = 50 | GeH$_4$/SiH$_4$ = 8/100~0 | 0.18 | 5 | 19 |
| Layer (II) | | SiH$_4$/He = 0.5 C$_2$H$_4$ | SiH$_4$ = 100 | SiH$_4$/C$_2$H$_4$ = 3/7 | 0.18 | 10 | 0.5 |

TABLE D-12

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 4/10~0 B$_2$H$_6$/(GeH$_4$ + SiH$_4$) = 8 × 10$^{-3}$ NH$_3$/(GeH$_4$ + SiH$_4$) = 1/100 | 0.18 | 5 | 20 |
| Layer (II) | | SiH$_4$/He = 0.5 C$_2$H$_4$ | SiH$_4$ = 100 | SiH$_4$/C$_2$H$_4$ = 3/7 | 0.18 | 10 | 0.5 |

TABLE D-13

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 1/10~0 B$_2$H$_6$/(GeH$_4$ + SiH$_4$) = 5 × 10$^{-3}$ NH$_3$/(GeH$_4$ + SiH$_4$) = 1/100 | 0.18 | 5 | 20 |

TABLE D-14

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 4/10~4/100 B$_2$H$_6$/(GeH$_4$ + SiH$_4$) = 1 × 10$^{-3}$ NH$_3$/(GeH$_4$ + SiH$_4$) = 2/100~0 | 0.18 | 5 | 20 |

[The flow rate ratio NH$_3$/(GeH$_4$ + SiH$_4$) was reduced linearly.]

TABLE D-15

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 15/100~0 B$_2$H$_6$/(GeH$_4$ + SiH$_4$) = 5 × 10$^{-4}$ NH$_3$/(GeH$_4$ + SiH$_4$) = 3/100~0 | 0.18 | 5 | 20 |

[The flow rate ratio NH$_3$/(GeH$_4$ + SiH$_4$) was reduced linearly.]

TABLE D-16

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 1/1~6/10 B$_2$H$_6$/(GeH$_4$ + SiH$_4$) = 2 × 10$^{-3}$ NH$_3$/(GeH$_4$ + SiH$_4$) = 3/100 | 0.18 | 5 | 1 |
| | Second layer | SiH$_4$/He = 0.05 GeH$_4$/He = 0.05 B$_2$H$_6$/He = 10$^{-3}$ | SiH$_4$ + GeH$_4$ = 50 | GeH$_4$/SiH$_4$ = 6/10~5/1000 B$_2$H$_6$/(GeH$_4$ + SiH$_4$) = 2 × 10$^{-3}$ | 0.18 | 5 | 19 |

TABLE D-17

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 2/10 \sim 195/1000$<br>$B_2H_6/(GeH_4 + SiH_4) = 5 \times 10^{-3}$<br>$NH_3/(GeH_4 + SiH_4) = 3/100$ | 0.18 | 5 | 15 |
| | Second Layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 195/1000 \sim 0$<br>$B_2H_6/(GeH_4 + SiH_4) = 5 \times 10^{-3}$ | 0.18 | 5 | 19 |

TABLE D-18

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10 \sim 95/100$<br>$B_2H_6/(GeH_4 + SiH_4) = 2 \times 10^{-3}$<br>$NH_3/(GeH_4 + SiH_4) = 3/100$ | 0.18 | 5 | 1 |
| | Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 95/100 \sim 9$<br>$B_2H_6/(GeH_4 + SiH_4) = 2 \times 10^{-3}$ | 0.18 | 5 | 19 |

TABLE D-19

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 4/10 \sim 8/100$<br>$B_2H_6/(GeH_4 + SiH_4) = 8 \times 10^{-3}$<br>$NH_3/(GeH_4 + SiH_4) = 3/100 \sim 0$ | 0.18 | 5 | 1 |
| | Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 8/100 \sim 0$<br>$B_2H_6/(GeH_4 + SiH_4) = 8 \times 10^{-3}$ | 0.18 | 5 | 19 |

[The flow rate ratio $NH_3/(GeH_4 + SiH_4)$ was reduced linearly.]

TABLE D-20

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10 \sim 8/100$<br>$B_2H_6/(GeH_4 + SiH_4) = 5 \times 10^{-3}$<br>$NH_3/(GeH_4 + SiH_4) = 3/100 \sim 0$ | 0.18 | 5 | 1 |
| | Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 8/100 \sim 0$<br>$B_2H_6/(GeH_4 + SiH_4) = 5 \times 10^{-3}$ | 0.18 | 5 | 19 |

[The flow rate ratio $NH_3/(GeH_4 + SiH_4)$ was reduced linearly.]

TABLE D-21

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 4/10 \sim 33/100$<br>$B_2H_6/(GeH_4 + SiH_4) = 1 \times 10^{-3}$<br>$NH_3/(GeH_4 + SiH_4) = 2/100$ | 0.18 | 5 | 0.5 |
| | Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 33/100 \sim 0$<br>$B_2H_6/(GeH_4 + SiH_4) = 1 \times 10^{-3}$ | | | |

[The flow rate ratio $NH_3/(GeH_4 + SiH_4)$ was reduced linearly.]

TABLE D-22

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>NH$_3$/(GeH$_4$ + SiH$_4$) = 3/100 | 0.18 | 5 | 15 |
| | Second layer | SiH$_4$/He = 0.05<br>GeH$_4$/He = 0.05<br>PH$_3$/He = 10$^{-3}$ | SiH$_4$ + GeH$_4$ = 50 | GeH$_4$/SiH$_4$ = 8/100~0<br>PH$_3$/(GeH$_4$ + SiH$_4$) = 1 × 10$^{-5}$ | 0.18 | 5 | 5 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE D-23

| Conditions | Gases employed | Flow rate (SCCM) | Flow rate ratio or Area ratio | Discharging power (W/cm$^2$) | Layer thickness ($\mu$) |
|---|---|---|---|---|---|
| 12-1 | Ar | 200 | Si wafer:graphite = 1.5:8.5 | 0.3 | 0.5 |
| 12-2 | Ar | 200 | Si wafer:graphite = 0.5:9.5 | 0.3 | 0.3 |
| 12-3 | Ar | 200 | Si wafer:graphite = 6:4 | 0.3 | 1.0 |
| 12-4 | SiH$_4$/He = 1<br>C$_2$H$_4$ | SiH$_4$ = 15 | SiH$_4$:C$_2$H$_4$ = 0.4:9.6 | 0.18 | 0.3 |
| 12-5 | SiH$_4$/He = 0.5<br>C$_2$H$_4$ | SiH$_4$ = 100 | SiH$_4$:C$_2$H$_4$ = 5:5 | 0.18 | 1.5 |
| 12-6 | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 12-7 | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 12-8 | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE D-24

| Layer (II) Preparation conditions | Sample No./Results | | |
|---|---|---|---|
| 12-1 | 12-401 | 12-701 | 12-801 |
| 12-2 | 12-402 | 12-702 | 12-802 |
| 12-3 | 12-403 | 12-703 | 12-803 |
| 12-4 | 12-404 | 12-704 | 12-804 |
| 12-5 | 12-405 | 12-705 | 12-805 |
| 12-6 | 12-406 | 12-706 | 12-806 |
| 12-7 | 12-407 | 12-707 | 12-807 |
| 12-8 | 12-408 | 12-708 | 12-808 |

| Sample No. | |
|---|---|
| Overall image evaluation | Durability evaluation |

Evaluation standard:
Excellent
Good

TABLE D-25

| Sample No. | 1301 | 1302 | 1303 | 1304 | 1305 | 1306 | 1307 |
|---|---|---|---|---|---|---|---|
| Si:C target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | X |

⊙: Very good
○: Good
Δ: Sufficiently practically usable
X: Image defect formed

TABLE D-26

| Sample No. | 1401 | 1402 | 1403 | 1404 | 1405 | 1406 | 1407 | 1408 |
|---|---|---|---|---|---|---|---|---|
| $SiH_4:C_2H_4$ (Flow rate ratio) | 9:1 | 6:4 | 4:6 | 2:8 | 1:9 | 0.5:9.5 | 0.35:9.65 | 0.2:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Sufficiently practically usable
X: Image defect formed

TABLE D-27

| Sample No. | 1501 | 1502 | 1503 | 1504 | 1505 | 1506 | 1507 | 1508 |
|---|---|---|---|---|---|---|---|---|
| $SiH_4:SiF_4:C_2H_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | X |

⊙: Very good
○: Good
Δ: Practically satisfactory
X: Image defect formed

TABLE D-28

| Sample No. | Thickness of layer (II) (μ) | Results |
|---|---|---|
| 1601 | 0.001 | Image defect liable to occur |
| 1602 | 0.02 | No image defect during 20,000 repetitions |
| 1603 | 0.05 | Stable for 50,000 or more repetitions |
| 1604 | 1 | Stable for 200,000 or more repetitions |

TABLE E-1

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| Layer (I) | First layer | $SiH_4/He = 0.05$ $GeH_4/He = 0.05$ $NH_3$ | $SiH_4 + GeH_4 = 50$ | $GeH_4/SiH_4 = 1/1 \sim 2/10$ $NH_3/(GeH_4 + SiH_4) = 3/100$ | 0.18 | 5 | 1 |
| | Second layer | $SiH_4/He = 0.05$ $GeH_4/He = 0.05$ | $SiH_4 + GeH_4 = 50$ | $GeH_4/SiH_4 = 2/10 \sim 0$ | 0.18 | 5 | 19 |
| Layer (II) | | $SiH_4/He = 0.5$ NO | $SiH_4 = 100$ | $SiH_4/NO = 1$ | 0.18 | 10 | 0.5 |

TABLE E-2

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| Layer (I) | First layer | $SiH_4/He = 0.05$ $GeH_4/He = 0.05$ $NH_3$ | $SiH_4 + GeH_4 = 50$ | $GeH_4/SiH_4 = 1/10 \sim 4/100$ $NH_3/(GeH_4 + SiH_4) = 2/100$ | 0.18 | 5 | 5 |
| | Second layer | $SiH_4/He = 0.05$ $GeH_4/He = 0.05$ | $SiH_4 + GeH_4 = 50$ | $GeH_4/SiH_4 = 4/100 \sim 0$ | 0.18 | 5 | 15 |

TABLE E-3

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| Layer (I) | First layer | $SiH_4/He = 0.05$ $GeH_4/He = 0.05$ $NH_3$ | $SiH_4 + GeH_4 = 50$ | $GeH_4/SiH_4 = 4/10 \sim 2/10$ $NH_3/(GeH_4 + SiH_4) = 3/100$ | 0.18 | 5 | 1.5 |
| | Second layer | $SiH_4/He = 0.05$ $GeH_4/He = 0.05$ | $SiH_4 + GeH_4 = 50$ | $GeH_4/SiH_4 = 2/10 \sim 2/1000$ | 0.18 | 5 | 18.5 |

TABLE E-4

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| Layer | First | $SiH_4/He = 0.05$ | $SiH_4 + GeH_4 = 50$ | $GeH_4/SiH_4 = 15/100$ | 0.18 | 5 | 2 |

TABLE E-4-continued

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | | GeH$_4$/He = 0.05 NH$_3$ | | NH$_3$/(GeH$_4$ + SiH$_4$) = 4/100 | | | |
| | Second layer | SiH$_4$/He = 0.05 GeH$_4$/He = 0.05 | SiH$_4$ + GeH$_4$ = 50 | GeH$_4$/SiH$_4$ = 15/100~0 | 0.18 | 5 | 18 |

TABLE E-5

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 1~5/10 NH$_3$/(GeH$_4$ + SiH$_4$) = 5/100 | 0.18 | 5 | 0.5 |
| | Second layer | SiH$_4$/He = 0.05 GeH$_4$/He = 0.05 | SiH$_4$ + GeH$_4$ = 50 | GeH$_4$/SiH$_4$ = 5/10~0 | 0.18 | 5 | 19.5 |

TABLE E-6

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 2/10~5/100 NH$_3$/(GeH$_4$ + SiH$_4$) = 3/100 | 0.18 | 5 | 4 |
| | Second layer | SiH$_4$/He = 0.05 GeH$_4$/He = 0.05 | SiH$_4$ + GeH$_4$ = 50 | GeH$_4$/SiH$_4$ = 5/100~0 | 0.18 | 5 | 16 |

TABLE E-7

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 1/10~8/100 NH$_3$/(GeH$_4$ + SiH$_4$) = 3/100 | 0.18 | 5 | 4 |
| | Second layer | SiH$_4$/He = 0.05 GeH$_4$/He = 0.05 | SiH$_4$ + GeH$_4$ = 50 | GeH$_4$/SiH$_4$ = 8/100~0 | 0.18 | 5 | 16 |

TABLE E-8

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | Si$_2$H$_6$/He = 0.05 GeH$_4$/He = 0.05 NH$_3$ | Si$_2$H$_6$ + GeH$_4$ = 50 | GeH$_4$/Si$_2$H$_6$ = 1/1~2/10 NH$_3$/(GeH$_4$ + Si$_2$H$_6$) = 3/100 | 0.18 | 5 | 1 |
| | Second layer | Si$_2$H$_6$/He = 0.05 GeH$_4$/He = 0.05 | Si$_2$H$_6$ + GeH$_4$ = 50 | GeH$_4$/Si$_2$H$_6$ = 2/10~0 | 0.18 | 5 | 19 |

TABLE E-9

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05 GeH$_4$/He = 0.05 NH$_3$ | SiF$_4$ + GeH$_4$ = 50 | GeH$_4$/SiF$_4$ = 1/1~2/10 NH$_3$/(GeH$_4$ + SiF$_4$) = 3/100 | 0.18 | 5 | 1 |
| | Second layer | SiF$_4$/He = 0.05 GeH$_4$/He = 0.05 | SiF$_4$ + GeH$_4$ = 50 | GeH$_4$/SiF$_4$ = 2/10~0 | 0.18 | 5 | 19 |

TABLE E-10

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>SiF$_4$/He = 0.05<br>GeH$_4$/He = 0.05<br>NH$_3$ | SiH$_4$ + SiF$_4$ + GeH$_4$ = 50 | GeH$_4$/(SiH$_4$ + SiF$_4$) = 1/1~2/10<br>NH$_3$/(GeH$_4$ + SiH$_4$ + SiF$_4$) = 3/100 | 0.18 | 5 | 1 |
| | Second layer | SiH$_4$/He = 0.05<br>SiF$_4$/He = 0.05<br>GeH$_4$/He = 0.05 | SiH$_4$ + SiF$_4$ + GeH$_4$ = 50 | GeH$_4$/(SiH$_4$ + SiF$_4$) = 2/10~0 | 0.18 | 5 | 19 |

TABLE E-11

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~2/10<br>NH$_3$/(GeH$_4$ + SiH$_4$) = 2/100 | 0.18 | 5 | 1 |
| | Second layer | SiH$_4$/He = 0.05<br>GeH$_4$/He = 0.05<br>NH$_3$ | SiH$_4$ + GeH$_4$ = 50 | GeH$_4$/SiH$_4$ = 2/10~0<br>NH$_3$/(GeH$_4$ SiH$_4$) = 1/100 | 0.18 | 5 | 19 |
| Layer (II) | | SiH$_4$/He = 0.5<br>NO | SiH$_4$ = 100 | SiH$_4$/NO = 1 | 0.18 | 10 | 0.5 |

TABLE E-12

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/1~5/100<br>NH$_3$/(GeH$_4$ + SiH$_4$) = 15/100 ~1/10 | 0.18 | 5 | 7 |
| | Second layer | SiH$_4$/He = 0.05<br>GeH$_4$/He = 0.05<br>NH$_3$ | SiH$_4$ + GeH$_4$ = 50 | GeH$_4$/SiH$_4$ = 5/100~0<br>NH$_3$/(GeH$_4$ SiH$_4$) = 1/10~0 | 0.18 | 5 | 13 |
| Layer (II) | | SiH$_4$/He = 0.5<br>NO | SiH$_4$ = 100 | SiH$_4$/NO = 1 | 0.18 | 10 | 0.5 |

TABLE E-13

| Sample No. | 1301 | 1302 | 1303 | 1304 | 1305 | 1306 | 1307 | 1308 |
|---|---|---|---|---|---|---|---|---|
| NH$_3$/(GeH$_4$ + SiH$_4$) (Flow rate ratio) | 1/1000 | 5/1000 | 9/1000 | 2/100 | 3/100 | 5/100 | 8/100 | 1/10 |
| N content (atomic %) | 0.1 | 0.5 | 0.89 | 1.96 | 2.9 | 4.76 | 7.4 | 9.1 |
| Evaluation | Δ | ○ | ○ | ⊙ | ⊙ | ○ | ○ | Δ |

⊙: Excellent
○: Good
Δ: Practically satisfactory

TABLE E-14

| Sample No. | 1401 | 1402 | 1403 | 1404 | 1405 | 1406 | 1407 | 1408 |
|---|---|---|---|---|---|---|---|---|
| Layer thickness | 30Å | 500Å | 0.1$\mu$ | 0.3$\mu$ | 0.8$\mu$ | 3$\mu$ | 4$\mu$ | 5$\mu$ |
| Evaluation | Δ | ○ | ⊙ | ⊙ | ⊙ | ○ | ○ | Δ |

⊙: Excellent
○: Good
Δ: Practically satisfactory

TABLE E-15

| Conditions | Gases employed | Flow rate (SCCM) | Flow rate ratio or Area ratio | Discharging power (W/cm$^2$) | Layer thickness ($\mu$) |
|---|---|---|---|---|---|
| 11-1 | Ar (NO/Ar) | 200 (1/1) | Si wafer:SiO$_2$ = 1:30 | 0.3 | 0.5 |
| 11-2 | Ar (NO/Ar) | 200 (1/1) | Si wafer:SiO$_2$ = 1:60 | 0.3 | 0.3 |
| 11-3 | Ar (NO/Ar) | 200 (1/1) | Si wafer:SiO$_2$ = 6:4 | 0.3 | 1.0 |
| 11-4 | SiH$_4$/He = 1<br>NO | SiH$_4$ = 15 | SiH$_4$:NO = 5:1 | 0.18 | 0.3 |

TABLE E-15-continued

| Conditions | Gases employed | Flow rate (SCCM) | Flow rate ratio or Area ratio | Discharging power (W/cm$^2$) | Layer thickness ($\mu$) |
|---|---|---|---|---|---|
| 11-5 | SiH$_4$/He = 0.5<br>NO | SiH$_4$ = 100 | SiH$_4$:NO = 1:1 | 0.18 | 1.5 |
| 11-6 | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 11-7 | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 11-8 | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE E-16

| Layer (II) Preparation conditions | Sample No./Evaluation | | |
|---|---|---|---|
| 11-1 | 11-401<br>○ ○ | 11-701<br>○ ○ | 11-801<br>○ ○ |
| 11-2 | 11-402<br>○ ○ | 11-702<br>○ ○ | 11-802<br>○ ○ |
| 11-3 | 11-403<br>○ ○ | 11-703<br>○ ○ | 11-803<br>○ ○ |
| 11-4 | 11-404<br>⊙ ⊙ | 11-704<br>⊙ ⊙ | 11-804<br>⊙ ⊙ |
| 11-5 | 11-405<br>⊙ ⊙ | 11-705<br>⊙ ⊙ | 11-805<br>⊙ ⊙ |
| 11-6 | 11-406<br>⊙ ⊙ | 11-706<br>⊙ ⊙ | 11-806<br>⊙ ⊙ |
| 11-7 | 11-407<br>○ ○ | 11-707<br>○ ○ | 11-807<br>○ ○ |
| 11-8 | 11-408<br>○ ○ | 11-708<br>○ ○ | 11-808<br>○ ○ |

Sample No.

Overall image evaluation / Durability evaluation

Evaluation standard:
⊙ Excellent
○ Good

TABLE E-17

| Sample No. | 1201 | 1202 | 1203 | 1204 | 1205 | 1206 | 1207 |
|---|---|---|---|---|---|---|---|
| Si:SiO$_2$ Target (Area ratio) (NO/Ar) | 9:1<br>(0/1) | 6.5:3.5<br>(1/1) | 4:10<br>(1/1) | 2:20<br>(1/1) | 1:100<br>(2/1) | 1:100<br>(3/1) | 1:100<br>(4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ⊙ | ⊙ | ○ | ○ | Δ | X |

⊙: Very Good
○: Good
Δ: Sufficiently practically usable
X: Image defect formed

TABLE E-18

| Sample No. | 1301 | 1302 | 1303 | 1304 | 1305 | 1306 | 1307 |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999 = 0.0001 | 9.9:0.1 | 9:1 | 6:4 | 5:5 | 3.3:6.7 | 2:8 |
| Image quality evaluation | Δ | ○ | ⊙ | ⊙ | ○ | Δ | X |

⊙: Very good
○: Good
Δ: Practically satisfactory
X: Image defect formed

TABLE E-19

| Sample No. | 1401 | 1402 | 1403 | 1404 | 1405 | 1406 | 1407 |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ⊙ | ⊙ | ○ | X | Δ |

⊙: Very good
○: Good
Δ: Practically satisfactory
X: Image defect formed

TABLE E-20

| Sample No. | Thickness of layer (II) (μ) | Results |
|---|---|---|
| 1601 | 0.001 | Image defect liable to occur |
| 1602 | 0.02 | No image defect during 20,000 repetitions |
| 1603 | 0.05 | Stable for 50,000 or more repetitions |
| 1604 | 1 | Stable for 200,000 or more repetitions |

TABLE F-1

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 19 |
| Layer (II) | | SiH$_4$/He = 0.5<br>NO | SiH$_4$ = 100 | SiH$_4$/NO = 1 | 0.18 | 10 | 0.5 |

TABLE F-2

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~8/100<br>B$_2$H$_6$/(GeH$_4$ + SiH$_4$) = 5 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 19 |

TABLE F-3

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>NH$_3$/(GeH$_4$ + SiH$_4$) = 2/100 | 0.18 | 5 | 0.5 |
| | Second layer | SiH$_4$/He = 0.05<br>GeH$_4$/He = 0.05 | SiH$_4$ + GeH$_4$ = 50 | GeH$_4$/SiH$_4$ = 33/100~4/100 | 0.18 | 5 | 19.5 |

TABLE F-4

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 15/100<br>B$_2$H$_6$/(GeH$_4$ + SiH$_4$) = 5 × 10$^{-4}$<br>NH$_3$/(GeH$_4$ + SiH$_4$) = 3/100 | 0.18 | 5 | 0.5 |
| | Second layer | SiH$_4$/He = 0.05<br>GeH$_4$/He = 0.05 | SiH$_4$ + GeH$_4$ = 50 | GeH$_4$/SiH$_4$ = 15/100~0 | 0.18 | 5 | 19.5 |

TABLE F-5

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/1~6/10<br>B$_2$H$_6$/(GeH$_4$ + SiH$_4$) = 2 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 6/10~5/1000 | 0.18 | 5 | 19 |

TABLE F-6

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 2/10~195/1000<br>B$_2$H$_6$/(GeH$_4$ + SiH$_4$) = 5 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 195/1000~0 | 0.18 | 5 | 19 |

TABLE F-7

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~95/100<br>B$_2$H$_6$/(GeH$_4$ + SiH$_4$) = 2 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 95/100~0 | 0.18 | 5 | 19 |

TABLE F-8

(Sample No. 801)

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | Si$_2$H$_6$/He = 0.05<br>GeH$_4$/He = 0.05<br>B$_2$H$_6$/He = 10$^{-3}$<br>NH$_3$ | Si$_2$H$_6$ + GeH$_4$ = 50 | GeH$_4$/Si$_2$H$_6$ = 4/10~8/100<br>B$_2$H$_6$/(GeH$_4$ + Si$_2$H$_6$) = 8 × 10$^{-3}$<br>NH$_3$/(GeH$_4$ + Si$_2$H$_6$) = 3/100 | 0.18 | 5 | 1 |
| | Second layer | Si$_2$H$_6$/He = 0.05<br>GeH$_4$/He = 0.05 | Si$_2$H$_6$ + GeH$_4$ = 55 | GeH$_4$/Si$_2$H$_6$ = 8/100~0 | 0.18 | 5 | 19 |

TABLE F-9

(Sample No. 802)

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05<br>GeH$_4$/He = 0.05<br>B$_2$H$_6$/He = 10$^{-3}$<br>NH$_3$ | SiF$_4$ + GeH$_4$ = 50 | GeH$_4$/SiF$_4$ = 1/10~8/100<br>B$_2$H$_6$/(GeH$_4$ + SiF$_4$) = 5 × 10$^{-3}$<br>NH$_3$/(GeH$_4$ + SiF$_4$) = 3/100 | 0.18 | 5 | 1 |
| | Second layer | SiF$_4$/He = 0.05<br>GeH$_4$/He = 0.05 | SiF$_4$ + GeH$_4$ = 50 | GeH$_4$/SiF$_4$ = 8/100~0 | 0.18 | 5 | 19 |

TABLE F-10

(Sample No. 803)

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>SiF$_4$/He = 0.05<br>GeH$_4$/He = 0.05<br>B$_2$H$_6$/He = 10$^{-3}$<br>NH$_3$ | SiH$_4$ + SiF$_4$ + GeH$_4$ = 50 | GeH$_4$/(SiH$_4$ + SiF$_4$) = 4/10~33/100<br>B$_2$H$_6$/(GeH$_4$ + SiH$_4$ + SiF$_4$) = 1 × 10$^{-3}$<br>NH$_3$/(GeH$_4$ + SiH$_4$ + SiF$_4$) = 2/100 | 0.18 | 5 | 0.5 |
| | Second layer | SiH$_4$/He = 0.05<br>SiF$_4$/He = 0.05<br>GeH$_4$/He = 0.05 | SiH$_4$ + SiF$_4$ + GeH$_4$ = 50 | GeH$_4$/(SiH$_4$ + SiF$_4$) = 4/10~33/100 | 0.18 | 5 | 19.5 |

TABLE F-11

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>PH$_3$/He = 10$^{-3}$<br>NH$_3$ | SiH$_4$ + GeH$_4$ = 50 | GeH$_4$/SiH$_4$ = 4/10~8/100<br>PH$_3$/(GeH$_4$ + SiH$_4$) = 1 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 8/100~0 | 0.18 | 5 | 19 |
| Layer (II) | | SiH$_4$/He = 0.5<br>NO | SiH$_4$ = 100 | SiH$_4$/No = 1 | 0.18 | 10 | 0.5 |

TABLE F-12

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~0<br>B$_2$H$_5$/(GeH$_4$ + SiH$_4$) = 8 × 10$^{-3}$<br>NH$_3$/(GeH$_4$ + SiH$_4$) = 1/100 | 0.18 | 5 | 20 |
| Layer (II) | SiH$_4$/He = 0.5<br>NO | SiH$_4$ = 100 | SiH$_4$/NO = 1 | 0.18 | 10 | 0.5 |

TABLE F-13

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~0<br>B$_2$H$_6$/(GeH$_4$ + SiH$_4$) = 5 × 10$^{-3}$<br>NH$_3$/(GeH$_4$ + SiH$_4$) = 1/100 | 0.18 | 5 | 20 |

TABLE F-14

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~4/100<br>B$_2$H$_6$/(GeH$_4$ +SiH$_4$) = 1 × 10$^{-3}$<br>NH$_3$/(GeH$_4$ + SiH$_4$) = 1/100~0 | 0.18 | 5 | 20 |

[The flow rate ratio NH$_3$(GeH$_4$ + SiH$_4$) was reduced linearly.]

TABLE F-15

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 15/100~0<br>B$_2$H$_6$/(GeH$_4$ + SiH$_4$) = 5 × 10$^{-4}$<br>NH$_3$/(GeH$_4$ + SiH$_4$) = 3/100~0 | 0.18 | 5 | 20 |

[The flow rate ratio NH$_3$/(GeH$_4$ + SiH$_4$) was reduced linearly.]

TABLE F-16

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/1~6/10<br>B$_2$H$_6$/(GeH$_4$ + SiH$_4$) = 2 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 6/10~5/1000<br>B$_2$H$_6$/(GeH$_4$ + SiH$_4$) = 2 × 10$^{-3}$ | 0.18 | 5 | 19 |

TABLE F-17

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 2/10~195/1000<br>B$_2$H$_6$/(GeH$_4$ + SiH$_4$) = 5 × 10$^{-3}$<br>NH$_3$/(GeH$_4$ + SiH$_4$) = 3/100 | 0.18 | 5 | 15 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 195/1000~0<br>B$_2$H$_6$/(GeH$_4$ + SiH$_4$) = 5× 10$^{-3}$ | 0.18 | 5 | 19 |

TABLE F-18

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~95/100<br>B$_2$H$_6$/(GeH$_4$ + SiH$_4$) = 2 × 10$^{-3}$<br>NH$_3$/(GeH$_4$ + SiH$_4$) = 3/100 | 0.18 | 5 | 1 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 95/100~0<br>B$_2$H$_6$/(GeH$_4$ + SiH$_4$) = 2 × 10$^{-3}$ | 0.18 | 5 | 19 |

TABLE F-19

(Sample No. 1901)

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>NH$_3$/(GeH$_4$ + SiH$_4$) = 3/100~0 | 0.18 | 5 | 1 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 8 × 10$^{-3}$ | 0.18 | 5 | 19 |

[The flow rate ratio NH$_3$/(GeH$_4$ + SiH$_4$) was reduced linearly.]

TABLE F-20

(Sample No. 1902)

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~8/100<br>B$_2$H$_6$/(GeH$_4$ + SiH$_4$) = 5 × 10$^{-3}$<br>NH$_3$/(GeH$_4$ + SiH$_4$) = 3/100~0 | 0.18 | 5 | 1 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 8/100~0<br>B$_2$H$_6$/(GeH$_4$ + SiH$_4$) = 5 × 10$^{-3}$ | 0.18 | 5 | 19 |

[The flow rate ratio NH$_3$/(GeH$_4$ + SiH$_4$) was reduced linearly.]

TABLE F-21

(Sample No. 1903)

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~33/100<br>B$_2$H$_6$/(GeH$_4$ + SiH$_4$) = 1 × 10$^{-3}$<br>NH$_3$/(GeH$_4$ + SiH$_4$) = 2/100 | 0.18 | 5 | 0.5 |
| | Second layer | SiH$_4$/He = 0.05<br>GeH$_4$/He = 0.05<br>B$_2$H$_6$/He = 10$^{-3}$ | SiH$_4$ + GeH$_4$ = 50 | GeH$_4$/SiH$_4$ = 33/100~0<br>B$_2$H$_6$/(GeH$_4$ + SiH$_4$) = 1 × 10$^{-3}$ | 0.18 | 5 | 19.5 |

[The flow rate ratio NH$_3$/(GeH$_4$ + SiH$_4$) was reduced linearly.]

TABLE F-22

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~8/100<br>B$_2$H$_6$/(GeH$_4$ + SiH$_4$) = 8 × 10$^{-3}$<br>NH$_3$/(GeH$_4$ + SiH$_4$) = 3/100 | 0.18 | 5 | 15 |
| | Second layer | SiH$_4$/He = 0.05<br>GeH$_4$/He = 0.05<br>PH$_3$/He = 10$^{-3}$ | SiH$_4$ + GeH$_4$ = 50 | GeH$_4$/SiH$_4$ = 8/100~0<br>PH$_3$/(GeH$_4$ + SiH$_4$) = 1 × 10$^{-5}$ | 0.18 | 5 | 5 |

TABLE F-23

| Conditions | Gases employed | Flow rate (SCCM) | Flow rate ratio or Area ratio | Discharging power (W/cm$^2$) | Layer thickness ($\mu$) |
|---|---|---|---|---|---|
| 11-1 | Ar (NO/Ar) | 200 (1/1) | Si wafer:SiO$_2$ = 1:30 | 0.3 | 0.5 |
| 11-2 | Ar (NO/Ar) | 200 (1/1) | Si wafer:SiO$_2$ = 1:60 | 0.3 | 0.3 |
| 11-3 | Ar (NO/Ar) | 200 (1/1) | Si wafer:SiO$_2$ = 6:4 | 0.3 | 1.0 |
| 11-4 | SiH$_4$/He = 1<br>NO | SiH$_4$ = 15 | SiH$_4$:NO = 5:1 | 0.18 | 0.3 |
| 11-5 | SiH$_4$/He = 0.5<br>NO | SiH$_4$ = 100 | SiH$_4$:NO = 1:1 | 0.18 | 1.5 |
| 11-6 | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 11-7 | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 11-8 | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE F-24

| Layer (II) Preparation conditions | Sample No./Evaluation | | |
|---|---|---|---|
| 11-1 | 11-401 ◯ ◯ | 11-701 ◯ ◯ | 11-1201 ◯ ◯ |
| 11-2 | 11-402 ◯ ◯ | 11-702 ◯ ◯ | 11-1202 ◯ ◯ |
| 11-3 | 11-403 ◯ ◯ | 11-703 ◯ ◯ | 11-1203 ◯ ◯ |
| 11-4 | 11-404 ⊙ ⊙ | 11-704 ⊙ ⊙ | 11-1204 ⊙ ⊙ |
| 11-5 | 11-405 ⊙ ⊙ | 11-705 ⊙ ⊙ | 11-1205 ⊙ ⊙ |
| 11-6 | 11-406 ⊙ ⊙ | 11-706 ⊙ ⊙ | 11-1206 ⊙ ⊙ |
| 11-7 | 11-407 ◯ ◯ | 11-707 ◯ ◯ | 11-1207 ◯ ◯ |
| 11-8 | 11-408 ◯ ◯ | 11-708 ◯ ◯ | 11-1208 ◯ ◯ |

| Sample No. | |
|---|---|
| Overall image evaluation | Durability evaluation |

Evaluation standard:
⊙ Excellent
◯ Good

TABLE F-25

| Sample No. | 1201 | 1202 | 1203 | 1204 | 1205 | 1206 | 1207 |
|---|---|---|---|---|---|---|---|
| Si:SiO$_2$ Target (Area ratio) (NO/Ar) | 9:1 (0/1) | 6.5:3.5 (1/1) | 4:10 (1/1) | 2:20 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ◉ | ◉ | ○ | ○ | Δ | X |

◉: Very good
○: Good
Δ: Sufficiently practically usable
X: Image defect formed

TABLE F-26

| Sample No. | 1301 | 1302 | 1303 | 1304 | 1305 | 1306 | 1307 |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evalualtion | Δ | ◉ | ◉ | ○ | ○ | Δ | X |

◉: Very good
○: Good
Δ: Practically satisfactory
X: Image defect formed

TABLE F-27

| Sample No. | 1401 | 1402 | 1403 | 1404 | 1405 | 1406 | 1407 |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality | Δ | ○ | ◉ | ◉ | ○ | X | Δ |

◉: Very good
○: Good
Δ: Practically satisfactory
X: Image defect formed

TABLE F-28

| Sample No. | Thickness of layer (II) (μ) | Results |
|---|---|---|
| 1601 | 0.001 | Image defect liable to occur |
| 1602 | 0.02 | No image defect during 20,000 repetitions |
| 1603 | 0.05 | Stable for 50,000 or more repetitions |
| 1604 | 1 | Stable for 200,000 or more repetitions |

What is claimed is:

1. A photoconductive member comprising a substrate and a light receiving layer having photoconductivity which comprises an amorphous material containing silicon atoms, germanium atoms, and at least one of hydrogen atoms and halogen atoms; the germanium atoms being distributed nonuniformly in the layer thickness direction in the light receiving layer and nitrogen atoms being contained in the light receiving layer.

2. The photoconductive member of claim 1, wherein the light receiving layer contains hydrogen atoms.

3. The photoconductive member of claim 1, wherein the light receiving layer contains halogen atoms.

4. The photoconductive member of claim 1, wherein the light receiving layer contains hydrogen atoms and halogen atoms.

5. The photoconductive member of claim 1, wherein germanium atoms in the light receiving layer are much distributed to the side of the substrate.

6. The photoconductive member of claim 1, wherein the light receiving layer further contains a substance which controls electro-conductive properties.

7. The photoconductive member of claim 6, wherein the light receiving layer contains hydrogen atoms.

8. The photoconductive member of claim 6, wherein the light receiving layer contains halogen atoms.

9. The photoconductive member of claim 6, wherein the light receiving layer contains hydrogen atoms and halogen atoms.

10. The photoconductive member of claim 6, wherein germanium atoms in the light receiving layer are much distributed to the side of the substrate.

11. The photoconductive member of claim 6, wherein the substance controlling electro-conductive properties is atoms of an element of group III of the periodic table.

12. The photoconductive member of claim 6, wherein the substance controlling electro-conductive properties is atoms of an element of group V of the periodic table.

13. A photoconductive member comprising a substrate and a light receiving layer comprising a first layer having photoconductivity which comprises an amorphous material containing silicon atoms, germanium atoms and at least one of hydrogen atoms and halogen atoms; and a second layer which comprises an amorphous material containing silicon atoms as a matrix and at least one kind of atoms selected from the group consisting of carbon atoms and oxygen atoms, said germanium atoms being distributed nonuniformly in the layer thickness direction in the first layer, and nitrogen atoms being contained in the first layer.

14. The photoconductive member of claim 13, wherein the first layer contains hydrogen atoms.

15. The photoconductive member of claim 13, wherein the first layer contains halogen atoms.

16. The photoconductive member of claim 13, wherein the first layer contains hydrogen atoms and halogen atoms.

17. The photoconductive member of claim 13, wherein germanium atoms in the first layer are much distributed to the side of the substrate.

18. The photoconductive member of claim 13, wherein the first layer contains a substance controlling electro-conductive properties.

19. The photoconductive member of claim 18, wherein the first layer contains hydrogen atoms.

20. The photoconductive member of claim 18, wherein the first layer contains halogen atoms.

21. The photoconductive member of claim 18, wherein the first layer contains hydrogen atoms and halogen atoms.

22. The photoconductive member of claim 18, wherein germanium atoms in the first layer are much distributed to the side of the substrate.

23. The photoconductive member of claim 18, wherein the substance controlling electro-conductive properties is atoms of an element of group III of the periodic table.

24. The photoconductive member of claim 18, wherein the substance controlling electro-conductive properties is atoms of an element of group V of the periodic table.

25. The photoconductive member of claim 1, wherein the content of nitrogen atoms in the light receiving layer is in the range of 0.001 to 50 atomic %.

26. The photoconductive member of claim 2, wherein the content of hydrogen atoms in the light receiving layer is in the range of 0.01 to 40 atomic %.

27. The photoconductive member of claim 3, wherein the content of halogen atoms in the light receiving layer is in the range of 0.01 to 40 atomic %.

28. The photoconductive member of claim 4, wherein the combined content of hydrogen atoms and halogen atoms in the light receiving layer is in the range of 0.01 to 40 atomic %.

29. The photoconductive member of claim 1, wherein the thickness of the light receiving layer is in the range of 1 to 100$\mu$.

30. The photoconductive member of claim 1, wherein the content of germanium atoms in the light receiving layer is in the range of 1 to $9.5 \times 10^5$ atomic ppm based on the combined content of silicon atoms and germanium atoms.

31. The photoconductive member of claim 6, wherein the content of the substance controlling electro-conductive properties in the light receiving layer is in the range of 0.01 to $5 \times 10^4$ atomic ppm.

32. The photoconductive member of claim 13, wherein the content of the nitrogen atoms in the first layer is in the range of 0.001 to 50 atomic %.

33. The photoconductive member of claim 14, wherein the content of hydrogen atoms in the first layer is in the range of 0.01 to 40 atomic %.

34. The photoconductive member of claim 15, wherein the content of halogen atoms in the first layer is in the range of 0.01 to 40 atomic %.

35. The photoconductive member of claim 16, wherein the combined content of hydrogen atoms and halogen atoms in the first layer is in the range of 0.01–40 atomic %.

36. The photoconductive member of claim 13, wherein the thickness of the first layer is in the range of 1 to 100$\mu$.

37. The photoconductive member of claim 13, wherein the content of germanium atoms in the first layer is in the range of 1 to $9.5 \times 10^5$ atomic ppm based on the combined content of silicon atoms and germanium atoms.

38. The photoconductive member of claim 18, wherein the content of the substance controlling electro-conductive properties in the first layer is in the range of 0.01 to $5 \times 10^4$ atomic ppm.

39. The photoconductive member of claim 13, wherein the second layer contains hydrogen atoms.

40. The photoconductive member of claim 13, wherein the second layer contains halogen atoms.

41. The photoconductive member of claim 13, wherein the second layer contains hydrogen atoms and halogen atoms.

42. The photoconductive member of claim 13, wherein the thickness of the second layer is in the range of 0.003 to 30$\mu$.

43. The photoconductive member of claim 7, wherein the content of hydrogen atoms in the light receiving layer is in the range of 0.01 to 40 atomic %.

44. The photoconductive member of claim 8, the content of hydrogen atoms in the light receiving layer is in the range of 0.01 to 40 atomic %.

45. The photoconductive member of claim 9, wherein the combined content of hydrogen atoms and halogen atoms in the light receiving layer is in the range of 0.01 to 40 atomic %.

46. The photoconductive member of claim 19, wherein the content of hydrogen atoms in the first layer is in the range of 0.01 to 40 atomic %.

47. The photoconductive member of claim 20, wherein the content of halogen atoms in the first layer is in the range of 0.01 to 40 atomic %.

48. The photoconductive member of claim 21, wherein the combined content of hydrogen atoms and halogen atoms in the first layer is in the range of 0.01–40 atomic %.

49. An electrophotographic process comprising:
applying a charge to the photoconductive member of claim 1; and
irradiating the charged photoconductive member with an electromagnetic wave carrying information, thereby forming an electrostatic image on the photoconductive member.

50. An electrophotographic process comprising:
applying a charge to the photoconductive member of claim 13; and
irradiating the charged photoconductive member with an electromagnetic wave carrying information, thereby forming an electrostatic image on the photoconductive member.

* * * * *